ись
United States Patent
Chang et al.

(10) Patent No.: US 10,764,480 B2
(45) Date of Patent: *Sep. 1, 2020

(54) OPTICAL IMAGE CAPTURING MODULE AND SYSTEM WITH MULTI-LENS FRAME AND MANUFACTURING METHOD THEREOF

(71) Applicant: Ability Opto-Electronics Technology Co. Ltd., Taichung (TW)

(72) Inventors: Yeong-Ming Chang, Taichung (TW); Chien-Hsun Lai, Taichung (TW); Yao-Wei Liu, Taichung (TW)

(73) Assignee: ABILITY OPTO-ELECTRONICS TECHNOLOGY CO. LTD., Taichung (TW)

( * ) Notice: Subject to any disclaimer, the term of this patent is extended or adjusted under 35 U.S.C. 154(b) by 17 days.

This patent is subject to a terminal disclaimer.

(21) Appl. No.: 16/235,795

(22) Filed: Dec. 28, 2018

(65) Prior Publication Data
US 2020/0099831 A1 Mar. 26, 2020

(30) Foreign Application Priority Data
Sep. 21, 2018 (TW) .............................. 107133366 A

(51) Int. Cl.
H04N 5/225 (2006.01)
H04N 5/232 (2006.01)
H01L 27/146 (2006.01)
G03B 13/36 (2006.01)

(52) U.S. Cl.
CPC ........... *H04N 5/2254* (2013.01); *G03B 13/36* (2013.01); *H01L 27/14689* (2013.01); *H04N 5/23212* (2013.01); *H01L 27/14627* (2013.01)

(58) Field of Classification Search
CPC .............. H04N 5/2254; H04N 5/23212; H01L 27/14689; H01L 27/14627; G03B 13/36
See application file for complete search history.

(56) References Cited

U.S. PATENT DOCUMENTS

| 10,437,004 B1 * | 10/2019 | Chang | G02B 9/62 |
| 2013/0010179 A1 * | 1/2013 | Takahara | G02B 7/36 |
| | | | 348/353 |
| 2016/0191785 A1 * | 6/2016 | Hu | H04N 5/23212 |
| | | | 348/347 |

(Continued)

*Primary Examiner* — Padma Haliyur
(74) *Attorney, Agent, or Firm* — Muncy, Geissler, Olds & Lowe, P.C.

(57) ABSTRACT

An optical imaging module including a circuit assembly and a lens assembly is provided. The circuit assembly includes holding base, two circuit substrates, image sensor elements, conductive lines, and a multi-lens frame. The image sensor elements are disposed on the holding base. The circuit substrates are disposed on the carrier and surround the image sensor elements. The conductive lines are disposed between the circuit contacts of the circuit substrates and image contacts of the image sensor elements. The multi-lens frame is integrally formed and covered on the circuit substrate and the image sensor elements. The lens assembly may include lens base, two auto lens assemblies, and two drive assemblies. The lens bases can be disposed on the multi-lens frame. The auto lens assembly may have at least two lenses having refractive power. The driving assembly can be electrically connected to the circuit substrate.

30 Claims, 33 Drawing Sheets

(56) References Cited

U.S. PATENT DOCUMENTS

| | | | |
|---|---|---|---|
| 2020/0057231 A1* | 2/2020 | Chang | G02B 7/09 |
| 2020/0057233 A1* | 2/2020 | Chang | G02B 9/60 |
| 2020/0057241 A1* | 2/2020 | Chang | G02B 5/208 |
| 2020/0059577 A1* | 2/2020 | Chang | G02B 5/208 |

* cited by examiner

OPTICAL IMAGE CAPTURING MODULE AND SYSTEM WITH MULTI-LENS FRAME AND MANUFACTURING METHOD THEREOF

CROSS-REFERENCE TO RELATED APPLICATION

This application claims priority from Taiwan Patent Application No. 107133366, filed on Sep. 21, 2018, in the Taiwan Intellectual Property Office, the content of which is hereby incorporated by reference in its entirety for all purposes.

BACKGROUND OF THE INVENTION

1. Field of the Invention

The present invention relates to an optical image capturing module, more particularly to an optical image capturing module which provides an auto-focus lens assembly, and has a multi-lens frame manufactured integrally.

2. Description of the Related Art

With respect to the assembly of video-recording devices at present, many problems have been identified but not solved yet, especially the video-recording devices with multiple lenses. Due to the use of multiple lenses, there is a dramatic impact on image quality if an optical axis cannot be accurately aimed at a CMOS active pixel sensor for calibration in the process of assembling and manufacturing image quality.

In addition, even though video-recording devices provide an auto-focus function that can be used when the lens is in motion, the assembling and packaging quality of all components would be difficult to manage owing to the complicated composition of the components of the video recording devices.

Moreover, to meet higher photographic requirements, video-recording devices need to have more lenses, four at the least. Therefore, how to include at least four lenses and still have a fine imaging quality is a critical issue that needs to be addressed.

Furthermore, in recent years, packaging technologies, such as the technique of directly disposing image sensing components on a substrate, cannot effectively reduce the height of the overall optical image capturing module. Therefore, an optical image capturing module is needed to solve the conventional problems.

SUMMARY OF THE INVENTION

In view of the aforementioned problems, the present disclosure provides an optical image capturing module and a manufacturing method thereof so that an optical axis of each auto-focus lens assembly may overlap a central normal line of the sensing surface and light is able to pass through each auto-focus lens assembly in the accommodating hole, pass through the light channel, and be emitted to the sensing surface to ensure image quality.

On the basis of the aforementioned purpose, the present disclosure provides an optical image capturing module including a circuit assembly and a lens assembly. The circuit assembly includes at least one holding base, at least two image sensor elements, at least two circuit substrates, a plurality of conductive lines, and a multi-lens frame. The at least two image sensor elements are accommodated in the holding base, and each of the at least two image sensor elements includes a first surface and a second surface, and the second surface of each of the at least two image sensor elements has a sensing surface and a plurality of image contacts. The at least two circuit substrates are disposed on the holding base and surrounds the at least two image sensor elements, and include a plurality of circuit contacts disposed thereon. The plurality of conductive lines are electrically connected between each of the plurality of circuit contacts and each of the plurality of image contacts. The multi-lens frame is manufactured integrally, and covered on the at least two circuit substrates, and positions corresponding to the sensing surface of each of the image sensor elements have a plurality of light channels. The lens assembly may include at least two lens bases, at least two auto-focus lens assemblies, and at least two driving assemblies. Each of the lens bases is made of an opaque material and has an accommodating hole passing through two ends of the lens base in such a way that the lens base becomes a hollow shape, and the lens base is disposed on the multi-lens frame in such a way that the accommodating hole is connected to the light channel. Each of the at least two auto-focus lens assemblies has at least two lenses with refractive power, is disposed on the lens base and positioned in the accommodating hole, an image plane of each of the auto-focus lens assemblies is disposed on the sensing surfaces of the image sensor elements, and an optical axis of each of the auto-focus lens assemblies overlaps the central normal line of the sensing surface of the image sensor elements in such a way that light is able to pass through the auto-focus lens assembly in each of the accommodating holes, pass through each of the light channels, and be emitted to the sensing surface of the image sensor elements. The at least two driving assemblies are electrically connected to the circuit substrates and drive the at least two auto-focus lens assemblies to move in a direction of the central normal line of the sensing surface of each of the image sensor elements. Each of the at least two the auto-focus lens assemblies further satisfies the following conditions:

$$1.0 \le f/HEP \le 10.0;$$

$$0 \text{ deg} < HAF \le 150 \text{ deg};$$

$$0 \text{ mm} < PhiD \le 18 \text{ mm};$$

$$0 < PhiA/PhiD \le 0.99; \text{ and}$$

$$0.9 \le 2(ARE/HEP) \le 2.0;$$

wherein, f is the focal length of each of the auto-focus lens assemblies, HEP is the entrance pupil diameter of each of the auto-focus lens assemblies, HAF is the half maximum angle of view of each of the auto-focus lens assemblies, PhiD is the maximum value of a minimum side length of an outer periphery of the lens base perpendicular to the optical axis of each of the auto-focus lens assemblies, PhiA is the maximum effective diameter of each of the auto-focus lens assemblies nearest to a lens surface of the image plane, ARE is the arc length along an outline of the lens surface, starting from an intersection point of any lens surface of any lens and the optical axis in the auto-focus lens assembly, and ending at a point with a vertical height which is the distance from the optical axis to half the entrance pupil diameter.

Preferably, each of the lens bases includes a lens barrel and a lens holder; the lens barrel has an upper hole which passes through two ends of the lens barrel, and the lens holder has a lower hole which passes through two ends of the lens holder, the lens barrel is disposed in the lens holder and positioned in the lower hole in such a way that the upper hole and the lower hole are connected to constitute the accommodating hole, the lens holder is fixed on the multi-lens frame in such a way that the transparent area is positioned in the lower hole, the upper hole of the lens barrel faces the sensing surface of each of the image sensor elements and the transparent area; each of the auto-focus lens assemblies is disposed in the lens barrel and positioned in the upper hole, the driving assembly drives the lens barrel opposite to the lens holder moving in a direction of the central normal line of the sensing surface of the image sensor elements connected to the circuit substrate, and PhiD is the maximum value of a minimum side length of an outer periphery of the lens holder perpendicular to the optical axis of the auto-focus lens assembly.

Preferably, the surface of each of the circuit substrates close to the multi-lens frame and the second surface of each of the image sensor elements are at the same plane.

Preferably, the horizontal level of the sensing surface of each of the image sensor elements is the same or differ from the horizontal level of the surface of each of the circuit substrates close to the multi-lens frame.

Preferably, the optical image capturing module may further include at least one data transmission line electrically connected to the first circuit substrate and the second circuit substrate and transmitting a plurality of sensing signals generated from each of the image sensor elements.

Preferably, the at least two image sensor elements sense a plurality of color images.

Preferably, at least one of the at least two image sensor elements senses a plurality of black-and-white images and at least one of the image sensor elements senses a plurality of color images.

Preferably, the optical image capturing module may further include at least two IR-cut filters, and each of the IR-cut filters is disposed in each of the lens bases, positioned in each of the accommodating holes, and located on each of the image sensor elements.

Preferably, the optical image capturing module may further include at least two IR-cut filters, and each of the IR-cut filters is disposed in the lens barrel or the lens holder and positioned on each of the image sensor elements.

Preferably, the optical image capturing module may further include at least two IR-cut filters, and each of the lens bases includes a filter holder, the filter holder has a filter hole which passes through two ends of the filter holder, each of the IR-cut filters is disposed in the filter holder and positioned in the filter hole, and the filter holder corresponds to positions of the plurality of light channels and is disposed on the multi-lens frame in such a way that each of the IR-cut filters is positioned on the image sensor elements.

Preferably, each of the lens bases includes a lens barrel and a lens holder, the lens barrel has an upper hole which passes through two ends of the lens barrel, the lens holder has a lower hole which passes through two ends of the lens holder, and the lens barrel is disposed in the lens holder and positioned in the lower hole, the lens holder is fixed on the filter holder, and the lower hole, the upper hole, and the filter hole are connected to constitute the accommodating hole in such a way that each of the image sensor elements is positioned in the filter hole, and the upper hole of the lens barrel faces the sensing surface of the image sensor element; the at least two auto-focus lens assemblies are disposed in the lens barrel and positioned in the upper hole.

Preferably, materials of the multi-lens frame include any one of thermoplastic resin, plastic used for industries, insulating material, metal, conducting material, and alloy, or any combination thereof.

Preferably, the multi-lens frame includes a plurality of camera lens holders, each of the camera lens holders has the light channel and a central axis, and a distance between the central axes of adjacent camera lens holders is a value between 2 mm and 200 mm.

Preferably, each of the driving assemblies includes a voice coil motor.

Preferably, the optical image capturing module has at least two auto-focus lens assemblies, including a first lens assembly and a second lens assembly, and a field of view (FOV) of the second lens assembly is larger than that of the first lens assembly.

Preferably, the optical image capturing module has at least two auto-focus lens assemblies, including a first lens assembly and a second lens assembly, and a focal length of the first lens assembly is larger than that of the second lens assembly.

Preferably, the optical image capturing module has at least three auto-focus lens assemblies, including a first lens assembly, a second lens assembly, and a third lens assembly, a field of view (FOV) of the second lens assembly is larger than that of the first lens assembly, the field of view (FOV) of the second lens assembly is larger than 46°, and each of the image sensor elements correspondingly receiving lights from the first lens assembly and the second lens assembly senses a plurality of color images.

Preferably, the optical image capturing module has at least three auto-focus lens assemblies, including a first lens assembly, a second lens assembly, and a third lens assembly, a focal length of the first lens assembly is larger than that of the second lens assembly, and each of the image sensor elements correspondingly receiving lights from the first lens assembly and the second lens assembly senses a plurality of color images.

Preferably, the following condition is satisfied: $0<(TH1+TH2)/HOI \leq 0.95$; specifically, TH1 is the maximum thickness of the lens holder, TH2 is the minimum thickness of the lens barrel, and HOI is the maximum image height perpendicular to the optical axis on the image plane.

Preferably, the following condition is satisfied: $0 \text{ mm}<TH1+TH2 \leq 1.5 \text{ mm}$; specifically, TH1 is the maximum thickness of the lens holder, and TH2 is the minimum thickness of the lens barrel.

Preferably, the following condition is satisfied: wherein $0.9 \leq ARS/EHD \leq 2.0$; specifically, ARS is the arc length along an outline of the lens surface, starting from an intersection point of any lens surface of any lens and the optical axis in each of the auto-focus lens assemblies, and ending at a maximum effective half diameter point of the lens surface, and EHD is the maximum effective half diameter of any surface of any lens in each of the auto-focus lens assemblies.

Preferably, the following conditions are satisfied:

$PLTA \leq 100 \text{ μm}; PSTA \leq 100 \text{ μm}; NLTA \leq 100 \text{ μm};$ and $NSTA \leq 100 \text{ μm}; SLTA \leq 100 \text{ μm}; SSTA \leq 100 \text{ μm};$ specifically, HOI is first defined as a maximum image height perpendicular to the optical axis on the image plane, PLTA is the lateral aberration of the longest operation wavelength of visible light of a positive tangential ray fan aberration of the optical image capturing module passing through a margin of an entrance pupil and incident at the image plane by 0.7 HOI, PSTA is the lateral aberration of the shortest operation wavelength of visible light of a positive tangential ray fan aberration of the optical image capturing module passing through a margin of an entrance pupil and incident at the image plane by 0.7 HOI, NLTA is the lateral aberration of the longest operation wavelength of visible light of a negative tangential ray fan aberration of the optical image capturing module passing through a margin of an entrance pupil and incident at the image plane by 0.7 HOI, NSTA is the lateral aberration of the shortest operation wavelength of visible light of a negative tangential ray fan aberration of the optical image capturing module passing through a margin of an entrance pupil and incident at the image plane by 0.7 HOI, SLTA is the lateral aberration of the longest operation wavelength of visible light of a sagittal ray fan aberration of the optical image capturing module passing through the margin of the entrance pupil and incident at the image plane by 0.7 HOI, SSTA is the lateral aberration of the shortest operation wavelength of visible light of a sagittal ray fan aberration of the optical image capturing module passing through the margin of the entrance pupil and incident at the image plane by 0.7 HOI.

Preferably, each of the auto-focus lens assembly includes four lenses with refractive power, which are a first lens, a second lens, a third lens, and a fourth lens sequentially displayed from an object side surface to an image side surface, and each of the auto-focus lens assemblies satisfies the following condition:

$0.1 \leq InTL/HOS \leq 0.95$; specifically, HOS is the distance from an object side surface of the first lens to the imaging surface on an optical axis, and InTL is the distance from an object side surface of the first lens to an image side surface of the fourth lens on an optical axis.

Preferably, each of the auto-focus lens assembly includes five lenses with refractive power, which are a first lens, a second lens, a third lens, a four lens, and a fifth lens sequentially displayed from an object side surface to an image side surface, and each of the auto-focus lens assemblies satisfies the following condition:

$0.1 \leq InTL/HOS \leq 0.95$;

wherein HOS is the distance on the optical axis from an object side surface of the first lens to the image plane, and InTL is the distance on the optical axis from an object side surface of the first lens to an image side surface of the fifth lens.

Preferably, each of the auto-focus lens assembly includes six lenses with refractive power, which are a first lens, a second lens, a third lens, a four lens, a fifth lens, and a sixth lens sequentially displayed from an object side surface to an image side surface, and each of the auto-focus lens assemblies satisfies the following condition:

$0.1 \leq InTL/HOS \leq 0.95$;

wherein HOS is the distance on the optical axis from an object side surface of the first lens to the image plane, and InTL is the distance on the optical axis from an object side surface of the first lens to an image side surface of the sixth lens.

Preferably, each of the auto-focus lens assembly includes seven lenses with refractive power, which are a first lens, a second lens, a third lens, a four lens, a fifth lens, a sixth lens, and a seventh lens sequentially displayed from an object side surface to an image side surface, and each of the auto-focus lens assemblies satisfies the following condition:

$0.1 \leq InTL/HOS \leq 0.95$;

wherein HOS is the distance from an object side surface of the first lens to the imaging surface on an optical axis, and InTL is the distance from an object side surface of the first lens to an image side surface of the seventh lens on an optical axis.

Preferably, The optical image capturing module according to claim 1, further including an aperture, and the aperture satisfies a following equation: $0.2 \leq InS/HOS \leq 1.1$; specifically, InS is the distance from the aperture to the image plane on the optical axis, and HOS is the distance on the optical axis from a lens surface of the auto-focus lens assembly farthest from the image plane.

On the basis of the aforementioned purpose, the present disclosure provides an image capturing system, including the above-mentioned optical image capturing module, and applied to one of an electronic portable device, an electronic wearable device, an electronic monitoring device, an electronic information device, an electronic communication device, a machine vision device, a vehicle electronic device, and combinations thereof.

On the basis of the aforementioned purpose, the present disclosure provides a manufacturing method of an optical image capturing module, and the manufacturing method includes following steps:

disposing a circuit assembly including at least one holding base, at least two circuit substrates, at least two image sensor elements, and a plurality of conductive lines, and disposing a plurality of circuit contacts on the at least two circuit substrates;

disposing the at least two image sensor elements on the holding base, and disposing the at least two circuit substrates on the holding base and surrounding the at least two image sensor elements, wherein each of the at least two image sensor element includes a first surface and a second surface, and the second surface has a sensing surface and a plurality of image contacts;

disposing the plurality of conductive lines between the circuit contacts and the image contacts;

integrally forming a multi-lens frame on the circuit assembly, covering the multi-lens frame on the circuit substrate and each of the image sensor elements, and forming a plurality of light channels on a sensing surface of the second surface corresponding to each of the image sensor elements;

disposing a lens assembly, which includes a plurality of lens bases, at least two auto-focus lens assemblies, and at least two driving assemblies;

making the at least two lens bases with an opaque material and forming an accommodating hole on each of the lens bases which passes through two ends of the lens base in such a way that the lens base becomes a hollow shape;

disposing each of the lens bases on the multi-lens frame to connect the accommodating hole with the light channels;

disposing at least two lenses with refractive power in each of the auto-focus lens assemblies and making each of the auto-focus lens assemblies satisfy the following conditions:

$1.0 \leq f/HEP \leq 10.0$;

$0 \text{ deg} < HAF \leq 150 \text{ deg}$;

$0 \text{ mm} < PhiD \leq 18 \text{ mm}$;

$0 < PhiA/PhiD \leq 0.99$; and $0 \leq 2(ARE/HEP) \leq 2.0$;

in the conditions above, f is the focal length of each of the auto-focus lens assemblies, HEP is the entrance pupil diameter of each of the auto-focus lens assemblies, HAF is the half maximum angle of view of each of the auto-focus lens assemblies, PhiD is the maximum value of a minimum side length of an outer periphery of the lens base perpendicular to the optical axis of each of the auto-focus lens assemblies, PhiA is the maximum effective diameter of each of the auto-focus lens assemblies nearest to a lens surface of the image plane, and ARE is the arc length along an outline of the lens surface, starting from an intersection point of any lens surface of any lens and the optical axis in the auto-focus lens assembly, and ending at a point with a vertical height which is the distance from the optical axis to half the entrance pupil diameter;

disposing each of the auto-focus lens assemblies on each of the lens bases and positioning the auto-focus lens assemblies in the accommodating hole;

adjusting the image planes of each of the auto-focus lens assemblies of the lens assembly to make an optical axis of each of the auto-focus lens assemblies overlap with a central normal line of the sensing surfaces of the image sensor elements; and electrically connecting each of the driving assemblies to the circuit substrate and the auto-focus lens assemblies, so as to drive each of the auto-focus lens assemblies to move in a direction of the central normal line of the sensing surface of the image sensor elements.

On the basis of the aforementioned purpose, the present disclosure provides an optical image capturing module including a circuit assembly and a lens assembly. The circuit assembly may include at least one holding base, at least two image sensor elements, at least two circuit substrates, and a plurality of conductive lines. The at least two image sensor elements are disposed on the holding base, and each of the image sensor elements includes a first surface and a second surface, and the second surface of each of the image sensor elements has a sensing surface and a plurality of image contacts. The at least two circuit substrates are disposed on the holding base and surround the at least two image sensor elements, and each of at least two circuit substrates includes a plurality of circuit contacts disposed thereon. The plurality of conductive lines are electrically connected between each of the circuit contacts and the plurality of image contacts. The lens assembly includes at least two lens bases, at least two auto-focus lens assemblies, at least two driving assemblies and a multi-lens outer frame. Each of the lens bases is made of an opaque material and has an accommodating hole passing through two ends of the lens base in such a way that the lens base becomes a hollow shape, and each of the lens bases is disposed on one of the circuit substrates. Each of the at least two auto-focus lens assemblies has at least two lenses with refractive power, is disposed on each of the lens bases and positioned in each of the accommodating holes, an image plane of each of the auto-focus lens assemblies is disposed on the sensing surface of the image sensor elements, and an optical axis of each of the auto-focus lens assemblies overlaps the central normal line of the sensing surface of the image sensor elements in such a way that light is able to pass through the auto-focus lens assembly in each of the accommodating holes, and be emitted to the sensing surface of the image sensor elements. The at least two driving assemblies are electrically connected to each of the circuit substrates and drive the auto-focus lens assemblies to move in a direction of the central normal line of the sensing surface of the image sensor elements. Each of the lens bases is respectively fixed to the multi-lens outer frame in order to form a whole body. Each of the auto-focus lens assemblies further satisfies the following conditions:

$1.0 \leq f/HEP \leq 10.0$;

$0 \deg < HAF \leq 150 \deg$;

$0 \text{ mm} < PhiD \leq 18 \text{ mm}$;

$0 < PhiA/PhiD \leq 0.99$; and $0.9 \leq 2(ARE/HEP) \leq 2.0$;

wherein, f is the focal length of each of the auto-focus lens assemblies, HEP is the entrance pupil diameter of each of the auto-focus lens assemblies, HAF is the half maximum angle of view of each of the auto-focus lens assemblies, PhiD is the maximum value of a minimum side length of an outer periphery of the lens base perpendicular to the optical axis of each of the auto-focus lens assemblies, PhiA is the maximum effective diameter of each of the auto-focus lens assemblies nearest to a lens surface of the image plane, and ARE is the arc length along an outline of the lens surface, starting from an intersection point of any lens surface of any lens and the optical axis in the auto-focus lens assembly, and ending at a point with a vertical height which is the distance from the optical axis to half the entrance pupil diameter.

The terms for the lens parameters in the embodiments in the present invention and the symbols thereof are listed in detail below as references for the following descriptions.

The lens parameters related to length and height:

HOI denotes the maximum imaging height of the optical image capturing module as shown. HOS denotes the height (a distance from an object side surface of the first lens to the imaging surface on an optical axis) of the optical image capturing module. InTL denotes a distance on the optical axis from an object side surface of the first lens to an image side surface of the last lens. InS denotes a distance from the light diaphragm (aperture) to the image plane on the optical axis. IN12 denotes the distance between the first lens and the second lens of the optical image capturing module. TP1 denotes the thickness of the first lens of the optical image capturing module on the optical axis.

The lens parameters related to materials:

NA1 denotes the dispersion coefficient of the first lens of the optical image capturing module; Nd1 denotes the refractive index of the first lens.

The lens parameters related to a field of view:

The field of view is shown as AF. Half of the field of view is shown as AF. The main ray angle is shown as MRA.

The lens parameters related to the exit and incident pupil:

HEP denotes the entrance pupil diameter of the optical image capturing system. The maximum effective half diameter position of any surface of single lens refers to the vertical height between the effective half diameter (EHD) and the optical axis where the incident light of the maximum view angle of the system passes through the farthest edge of the entrance pupil on the EHD of the surface of the lens. For instance, EHD11 denotes the maximum effective half diameter of the object side surface of the first lens. EHD12 denotes the maximum effective half diameter of the image side surface of the first lens. EHD21 denotes the maximum effective half diameter of the object side surface of the second lens. EHD12 denotes the maximum effective half diameter of the image side surface of the second lens. The maximum effective half diameter of any surface of the rest lenses in the optical image capturing module may be deducted on this basis. PhiA denotes the maximum diameter of the image side surface of the lens closest to the image plane in the optical image capturing module, satisfying the equation PhiA=2*EHD. If the surface is aspheric, the ending point of the maximum effective diameter is the ending point which includes the aspheric surface. An ineffective half diameter (IHD) of any surface of a single lens denotes a surface section of an ending point (If the surface is aspheric, the surface has the ending point of the aspheric coefficient.) extending from the direction away from the optical axis to an effective half diameter on the same surface. PhiB denotes the maximum diameter of the image side surface of the lens closest to the image plane in the optical image capturing module, satisfying the equation PhiB=2*(the maximum effective half diameter EHD+the maximum ineffective half diameter IHD)=PhiA+2*(the maximum ineffective half diameter IHD).

PhiA, also called optical exit pupil, denotes the maximum effective diameter of the image side surface of the lens nearest to the image plane (image space) in the optical image capturing module. PhiA3 is used when the optical exit pupil is located on the image side surface of the third lens. PhiA4 is used when the optical exit pupil is located on the image side surface of the fourth lens. PhiA5 is used when the optical exit pupil is located on the image side surface of the fifth lens. PhiA6 is used when the optical exit pupil is located on the image side surface of the sixth lens. The optical exit pupil thereof may be deducted when the optical image capture module has lenses with different refractive powers. PMR denotes the pupil opening ratio of the optical image capturing module, which satisfies the condition PMR=PhiA/HEP.

The parameters related to a lens surface arc length and a surface outline:

The arc length of the maximum effective half diameter of any surface of a single lens denotes the arc length between two points as the maximum effective diameter along an outline of the lens surface, starting from an intersection point of the lens surface and the optical axis in the optical image capturing module, and ending at point of the maximum effective half diameter, shown as ARS. For instance, ARS11 denotes the arc length of the maximum effective half diameter of the object side surface of the first lens. ARS12 denotes the arc length of the maximum effective half diameter of the image side surface of the first lens. ARS21 denotes the arc length of the maximum effective half diameter of the object side surface of the second lens. ARS22 denotes the arc length of the maximum effective half diameter of the image side surface of the second lens. The arc length of the maximum effective half diameter of any surface of the rest lenses in the optical image capturing module may be deducted on this basis.

The arc length of half the entrance pupil diameter (HEP) of any surface of a single lens denotes the arc length of two points as half the entrance pupil diameter (HEP) along an outline of the lens surface, starting from an intersection point of the lens surface and the optical axis of in the optical image capturing module, and ending at a point with a vertical height which is the distance from the optical axis to half the entrance pupil diameter, shown as ARE. For instance, ARE11 denotes the arc length of half the entrance pupil diameter (HEP) of the object side surface of the first lens. ARE12 denotes the arc length of half the entrance pupil diameter (HEP) of the image side surface of the first lens. ARE21 denotes the arc length of half the entrance pupil diameter (HEP) of the object side surface of the second lens. ARE22 denotes the arc length of half the entrance pupil diameter (HEP) of the image side surface of the second lens. The arc length of half the entrance pupil diameter (HEP) of any surface of the rest lenses in the optical image capturing module may be deducted on this basis.

The parameters related to the lens depth:

InRS61 is the horizontal distance parallel to an optical axis from a maximum effective half diameter position to an axial point on the object side surface of the sixth lens (a depth of the maximum effective half diameter). InRS62 is the horizontal distance parallel to an optical axis from a maximum effective half diameter position to an axial point on the image side surface of the sixth lens (the depth of the maximum effective half diameter). The depths of the maximum effective half diameters (sinkage values) of the object side surfaces or the image side surfaces of the other lenses are shown in the same manner as described above.

The parameters related to the lens type:

Critical point C denotes the section point perpendicular to the optical axis in addition to the intersection point with the optical axis on a particular lens surface. For instance, HVT51 is the distance perpendicular to the optical axis between a critical point C51 on an object side surface of the fifth lens and the optical axis. HVT52 is the distance perpendicular to the optical axis between a critical point C52 on an image side surface of the fifth lens and the optical axis. HVT61 is the distance perpendicular to the optical axis between a critical point C61 on an object side surface of the sixth lens and the optical axis. HVT62 is the distance perpendicular to the optical axis between a critical point C62 on an image side surface of the sixth lens and the optical axis. The critical points on the object side surfaces or the image side surfaces of other lenses and the vertical distance from the points to the optical axis are shown in the same manner as described above.

IF711 denotes the inflection point closest to the optical axis on the object side surface of the seventh lens. The sinkage value of the point is SGI711. SGI711 also denotes the horizontal displacement distance from the intersection point of the object side surface of the seventh lens on the optical axis to the inflection point of the object side surface of the seventh lens closest to the optical axis, which is parallel to the optical axis. HIF711 is the vertical distance from the point IF711 to the optical axis. IF721 denotes the inflection point closest to the optical axis on the image side surface of the seventh lens. The sinkage value of the point is SGI721. SGI721 also denotes the horizontal displacement distance from the intersection point of the image side surface of the seventh lens on the optical axis to the inflection point of the image side surface of the seventh lens closest to the optical axis, which is parallel to the optical axis. HIF721 is the vertical distance from the point IF721 to the optical axis.

IF712 denotes the inflection point second closest to the optical axis on the object side surface of the seventh lens. The sinkage value of the point is SGI712. SGI712 also denotes the horizontal displacement distance from the intersection point of the object side surface of the seventh lens on the optical axis to the inflection point of the object side surface of the seventh lens second closest to the optical axis, which is parallel to the optical axis. HIF712 is the vertical distance from the point IF712 to the optical axis. IF722 denotes the inflection point second closest to the optical axis on the image side surface of the seventh lens. The sinkage value of the point is SGI22. SGI722 also denotes the horizontal displacement distance from the intersection point of the image side surface of the seventh lens on the optical axis to the inflection point of the image side surface of the seventh lens second closest to the optical axis, which is parallel to the optical axis. HIF722 is the vertical distance from the point IF722 to the optical axis.

IF713 denotes the inflection point third closest to the optical axis on the object side surface of the seventh lens. The sinkage value of the point is SGI713. SGI713 also denotes the horizontal displacement distance from the intersection point of the object side surface of the seventh lens on the optical axis to the inflection point of the object side surface of the seventh lens third closest to the optical axis, which is parallel to the optical axis. HIF713 is the vertical distance from the point IF713 to the optical axis. IF723 denotes the inflection point third closest to the optical axis on the image side surface of the seventh lens. The sinkage value of the point is SGI723. SGI723 also denotes the horizontal displacement distance from the intersection point of the image side surface of the seventh lens on the optical axis to the inflection point of the image side surface of the seventh lens third closest to the optical axis, which is parallel to the optical axis. HIF723 is the vertical distance from the point IF723 to the optical axis.

IF714 denotes the inflection point fourth closest to the optical axis on the object side surface of the seventh lens. The sinkage value of the point is SGI714. SGI714 also denotes the horizontal displacement distance from the intersection point of the object side surface of the seventh lens on the optical axis to the inflection point of the object side surface of the seventh lens fourth closest to the optical axis, which is parallel to the optical axis. HIF714 is the vertical distance from the point IF714 to the optical axis. IF724 denotes the inflection point fourth closest to the optical axis on the image side surface of the seventh lens. The sinkage value of the point is SGI724. SGI724 also denotes the horizontal displacement distance from the intersection point of the image side surface of the seventh lens on the optical axis to the inflection point of the image side surface of the seventh lens fourth closest to the optical axis, which is parallel to the optical axis. HIF724 is the vertical distance from the point IF724 to the optical axis.

The inflection points on the object side surfaces or the image side surfaces of other lenses and the vertical distance from the points to the optical axis or the sinkage value thereof are shown in the same manner as described above.

The lens parameters related to aberrations:

ODT denotes the optical distortion of the optical image capturing module. TDT denotes the TV distortion, which may be further defined by the degree of the aberration displacement between the image of 50% and 100%. DFS denotes the spherical aberration displacement. DFC denotes the comet aberration displacement.

The present invention provides an optical image capturing module. wherein, an inflection point may be disposed on the object side surface or the image side surface of the six lens, which may effectively adjust the angle at which each field of view is incident on the sixth lens and make correction on the optical distortion and the TV distortion. In addition, the surface of the sixth lens may be equipped with a greater light path regulating ability, thus enhancing the image quality.

The arc length of any surface of a single lens within the maximum effective half diameter affects the surface's ability to correct the aberration and the optical path differences between each of the fields of view. The longer the arc length is, the better the ability to correct the aberration will be. However, difficulties may be found in the manufacturing process. Therefore, it is necessary to control the arc length of any surface of a single lens within the maximum effective half diameter, especially the ratio (ARS/TP) between the arc length (ARS) of the surface within the maximum effective half diameter and the thickness (TP) of the lens to which the surface belongs on the optical axis. For instance, ARS11 denotes the arc length of the maximum effective half diameter of the object side surface of the first lens. TP1 denotes the thickness of the first lens on the optical axis. The ratio between the two is ARS11/TP1. ARS12 denotes the arc length of the maximum effective half diameter of the image side surface of the first lens. The ratio between ARS12 and TP1 is ARS12/TP1. ARS21 denotes the arc length of the maximum effective half diameter of the object side surface of the second lens. TP2 denotes the thickness of the second lens on the optical axis. The ratio between the two is ARS21/TP2. ARS22 denotes the arc length of the maximum effective half diameter of the image side surface of the second lens. The ratio between ARS22 and TP2 is ARS12/TP2. The ratio between the arc length of the maximum effective half diameter of any surface of the rest lenses in the optical image capturing module and the thickness (TP) of the lens to which the surface belongs on the optical axis may be deducted on this basis. In addition, the optical image capturing module further satisfies the following conditions:

PLTA is the lateral aberration of the longest operation wavelength of visible light of a positive tangential ray fan aberration of the optical image capturing module passing through a margin of an entrance pupil and incident at the image plane by 0.7 HOI. PSTA is the lateral aberration of the shortest operation wavelength of visible light of a positive tangential ray fan aberration of the optical image capturing module passing through a margin of an entrance pupil and incident at the image plane by 0.7 HOI. NLTA is the lateral aberration of the longest operation wavelength of visible light of a negative tangential ray fan aberration of the optical image capturing module passing through a margin of an entrance pupil and incident at the image plane by 0.7 HOI. NSTA is the lateral aberration of the shortest operation wavelength of visible light of a negative tangential ray fan aberration of the optical image capturing module passing through a margin of an entrance pupil and incident at the image plane by 0.7 HOI. SLTA is the lateral aberration of the longest operation wavelength of visible light of a sagittal ray fan aberration of the optical image capturing module passing through the margin of the entrance pupil and incident at the image plane by 0.7 HOI; SSTA is the lateral aberration of the shortest operation wavelength of visible light of a sagittal ray fan aberration of the optical image capturing module passing through the margin of the entrance pupil and incident at the image plane by 0.7 HOI. In addition, the optical image capturing module further satisfies the following conditions: PLTA≤100 µm; PSTA≤100 µm; NLTA≤100 µm; NSTA≤100 µm; SLTA≤100 µm; SSTA≤100 µm; |TDT|<250%; 0.1≤InTL/HOS≤0.95; and 0.2≤InS/HOS≤1.1.

MTFQ0 denotes the modulation conversion transferring rate of visible light on the imaging surface by the optical axis at a spatial frequency of 110 cycles/mm. MTFQ3 denotes the modulation conversion transferring rate of visible light on the imaging surface by 0.3HOI at a spatial frequency of 110 cycles/mm. MTFQ7 denotes the modulation conversion transferring rate of visible light on the imaging surface by 0.7HOI at a spatial frequency of 110 cycles/mm. In addition, the optical image capturing module further satisfies the following conditions: MTFQ0≥0.2; MTFQ3≥0.01; and MTFQ7≥0.01.

The arc length of any surface of a single lens within the height of half the entrance pupil diameter (HEP) particularly affects the surface's ability to correct the aberration and the optical path differences between each of the fields of view at the shared area. The longer the arc length is, the better the ability to correct the aberration will be. However, difficulties may be found in the manufacturing process. Therefore, it is necessary to control the arc length of any surface of a single lens within the height of half the entrance pupil diameter (HEP), especially the ratio (ARE/TP) between the arc length (ARE) of the surface within the height of the half the entrance pupil diameter (HEP) and the thickness (TP) of the lens to which the surface belongs on the optical axis. For instance, ARE11 denotes the arc length of the height of the half the entrance pupil diameter (HEP) of the object side surface of the first lens. TP1 denotes the thickness of the first lens on the optical axis. The ratio between the two is ARE11/TP1. ARE12 denotes the arc length of the height of the half the entrance pupil diameter (HEP) of the image side surface of the first lens. The ratio between ARE12 and TP1 is ARE12/TP1. ARE21 denotes the arc length of the height of the half the entrance pupil diameter (HEP) of the object side surface of the second lens. TP2 denotes the thickness of the second lens on the optical axis. The ratio between the two is ARE21/TP2. ARE22 denotes the arc length of the height of the half the entrance pupil diameter (HEP) of the image side surface of the second lens. The ratio between ARE22 and TP2 is ARE22/TP2. The ratio between the arc length of the height of the half the entrance pupil diameter (HEP) of any surface of the rest lenses in the optical image capturing module and the thickness (TP) of the lens to which the surface belongs on the optical axis may be deducted on this basis.

DESCRIPTION OF THE PREFERRED EMBODIMENTS

Figure 1:
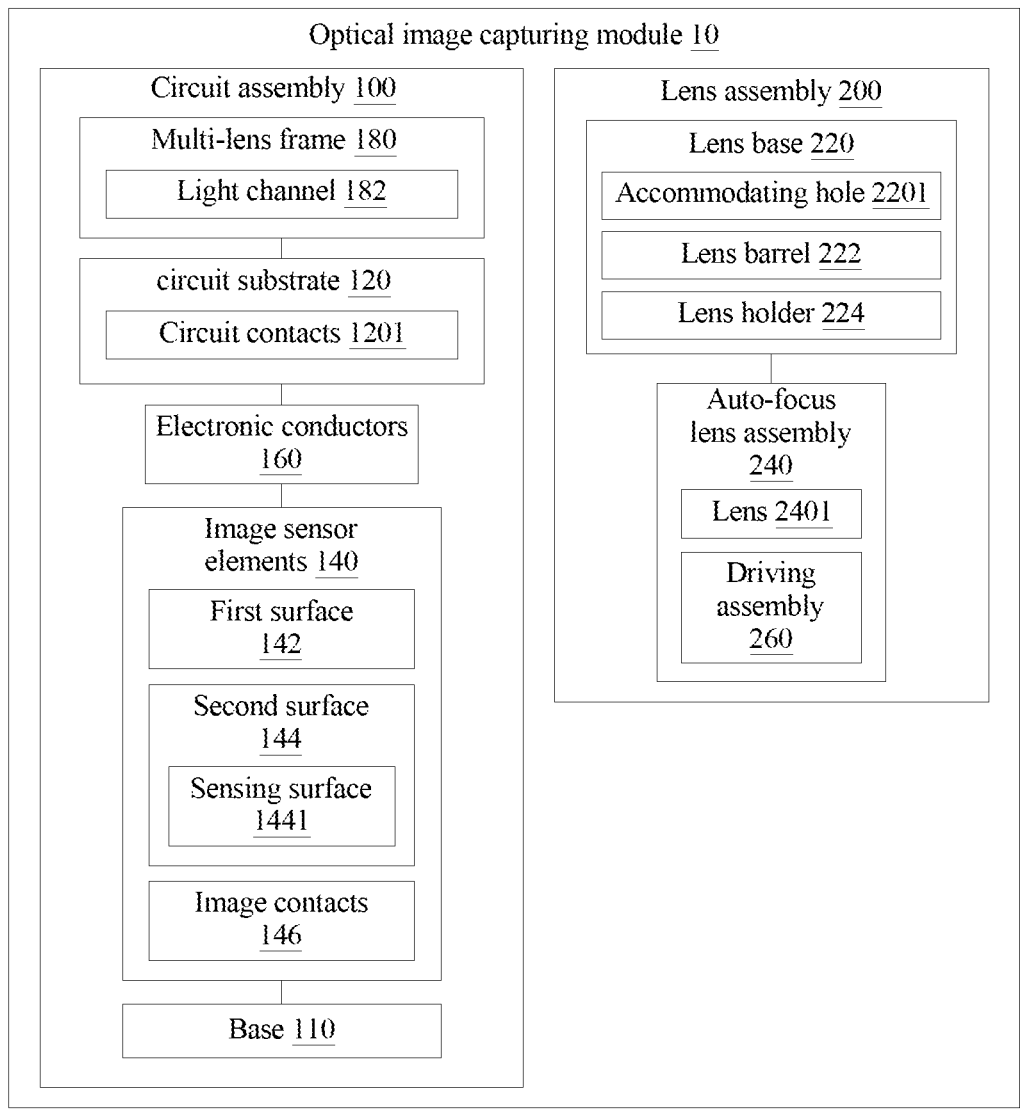
FIG. 1 is a block diagrams of the configuration according to the embodiment in the present invention.

To facilitate the review of the technique features, contents, advantages, and achievable effects of the present invention, the embodiments together with the attached drawings are described below in detail. However, the drawings are used for the purpose of indicating and supporting the specification, which may not depict the real proportion of elements and precise configuration in the implementation of the present invention. Therefore, the depicted proportion and configuration of the attached drawings should not be interpreted to limit the scope of implementation of the present invention.

The embodiment of the optical image capturing module and the method thereof in the present invention are explained with reference to the related figures. For ease of understanding, the same elements in the following embodiment are explained in accordance with the same symbols.

As shown in FIGS. 1 to 4, FIG. 7 and FIG. 9 to FIG. 12, the optical image capturing module in the present invention may include a circuit assembly 100 and a lens assembly 200. The lens assembly 100 includes at least one holding base 110, at least two circuit substrates 120, at least two image sensor elements 140, a plurality of conductive lines 160 and a multi-lens frame 180. The lens assembly 200 may include at least two lens bases 220, at least two auto-focus lens assemblies 240, and at least two drive assemblies 260.

The at least two image sensor elements 140 are disposed on the holding base 110, Each image sensor elements 140 may include a first surface 142 and a second surface 144. LS is the maximum value of a minimum side length of an outer periphery of the image sensor elements 140 perpendicular to the optical axis on the surface. The second surface 144 may have a sensing surface 1441 and a plurality of image contacts 146. The holding base 110 may effectively protect the image sensor element 140 from external impact and external dust.

Each circuit substrate 120 may be disposed on the holding base 110 and surrounds the image sensor element 140, so that the optical image capturing module 10 of the present invention may have a lower height and a more compact structure.

In another embodiment, the horizontal level of the sensing surface 1441 of the image sensor element 140 may be the same as or differ from the horizontal level of the surface of the circuit substrate 120 close to the multi-lens frame 180. In other words, the horizontal level of the sensing surface 1441 of each image sensor element 140 may be the same as, higher than or lower than that of the surface of the circuit substrate 120 close to the multi-lens frame 180. For this reason, based on the bottom surface of the holding base, the height of the auto-focus lens assembly 240 may be slightly different from that of the circuit substrate 120, but the circuit substrate 120 and the image sensor element 140 are still positioned at the same plane.

The plurality of conductive lines 160 are electrically connected between the circuit contacts 1210 and the image contacts 146 of the image sensor element 140. In an embodiment, the conductive line 160 can be made from the material selected from gold wires, flexible circuit boards, spring needles, copper wires, or the combination thereof. The conductive lines 160 can be connected to the image contacts 146 and the circuit contacts 1201, to conduct the image sensing signals sensed by the image sensor elements 140.

In addition, the multi-lens frame 180 may be manufactured integrally, in a molding approach for instance, and covered on the circuit substrate 120, the image sensor elements 140 and the plurality of conductive lines 160. The positions corresponding to the sensing surface 1441 of the at least two image sensor elements 140 may have a plurality of light channels 182.

The at least two lens bases 220 may be made of opaque material and have an accommodating hole 2201 passing through two ends of the lens bases 220 so that the lens bases 220 become hollow, and the lens bases 220 may be disposed on the multi-lens frame 180 so that the accommodating hole 2201 is connected to the light channel 182. In an embodiment, the reflectance of the multi-lens frame 180 is less than 5% in a light wavelength range of 420-660 nm. Therefore, the effect of the stray light caused by reflection or other factors on the image sensor elements 140 may be prevented after light enters the light channel 182.

Furthermore, in an embodiment, materials of the multi-lens frame 180 include any one of metal, conducting material, and alloy, or any combination thereof, thus increasing the heat dissipation efficiency or decreasing static electricity. This allows the image sensor elements 140 and the auto-focus lens assembly 240 to function more efficiently.

Furthermore, in an embodiment, materials of the multi-lens frame 180 include any one of thermoplastic resin, plastic used for industries, or any combination thereof, thus having the advantages of easy processing and light weight. This allows the image sensor elements 140 and the auto-focus lens assembly 240 to function more efficiently.

Figure 2:
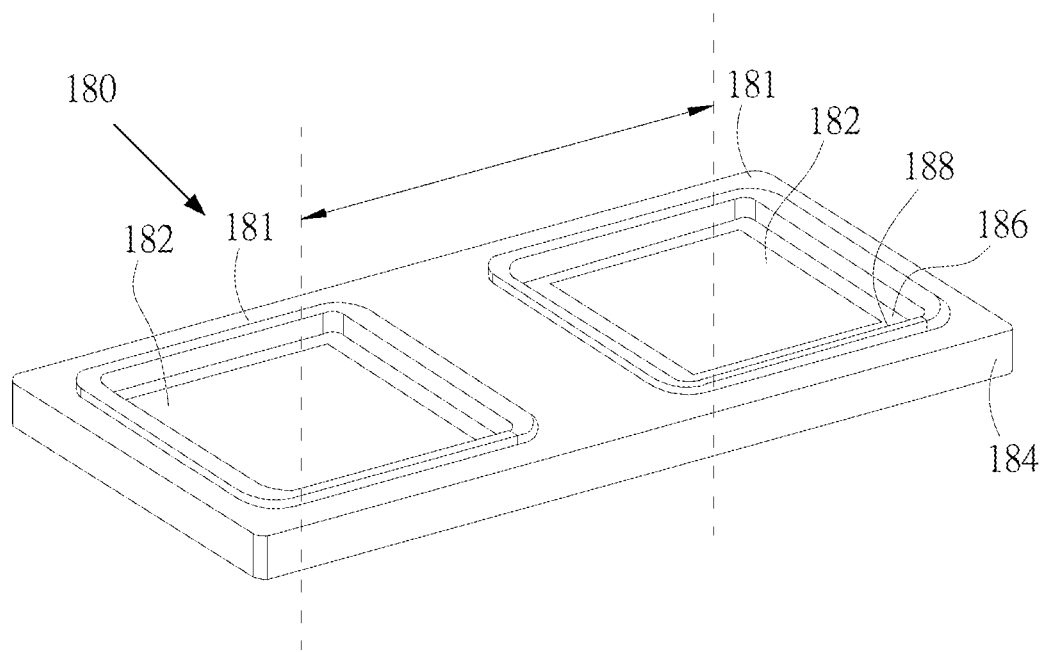
FIG. 2 is a schematic diagram of the multi-lens frame according to the embodiment in the present invention.
Figure 3:
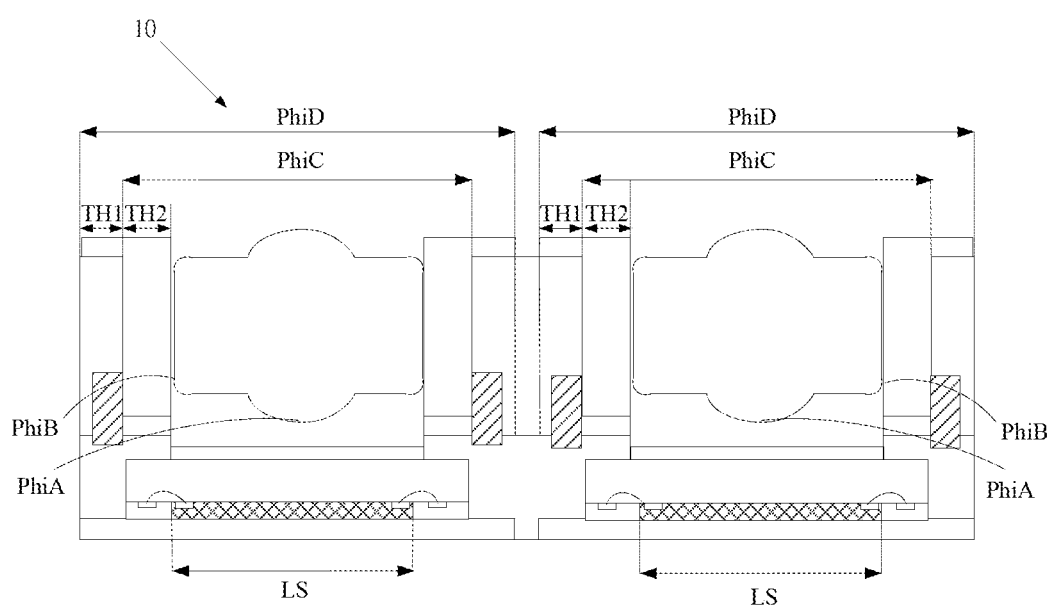
FIG. 3 is a schematic diagram of the parameter description according to the embodiment in the present invention.
Figure 4:
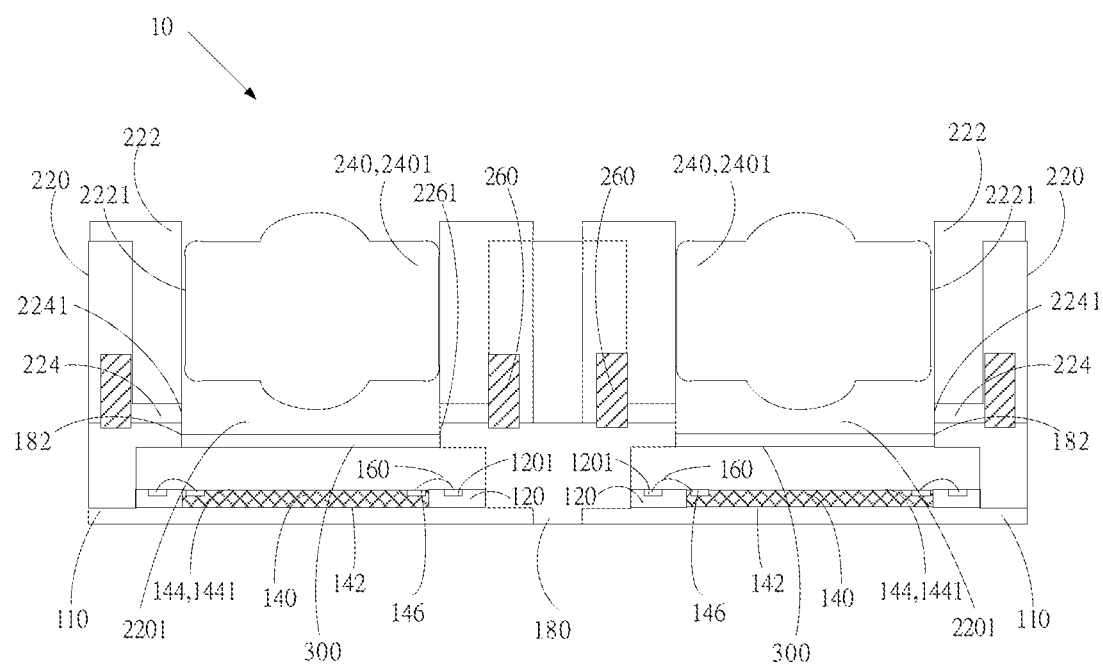
FIG. 4 is a schematic view of an optical image capturing module according to a first embodiment in the present invention.

In an embodiment, as shown in FIG. 2, the multi-lens frame 180 may include a plurality of camera lens holders 181 having the light channel 182 and a central axis. The distance between the central axes of adjacent camera lens holders is a value between 2 mm and 200 mm. Therefore, the distance between the camera lens holders 181 may be adjusted within this range, as shown in FIG. 2 and FIG. 14.

Figure 13:
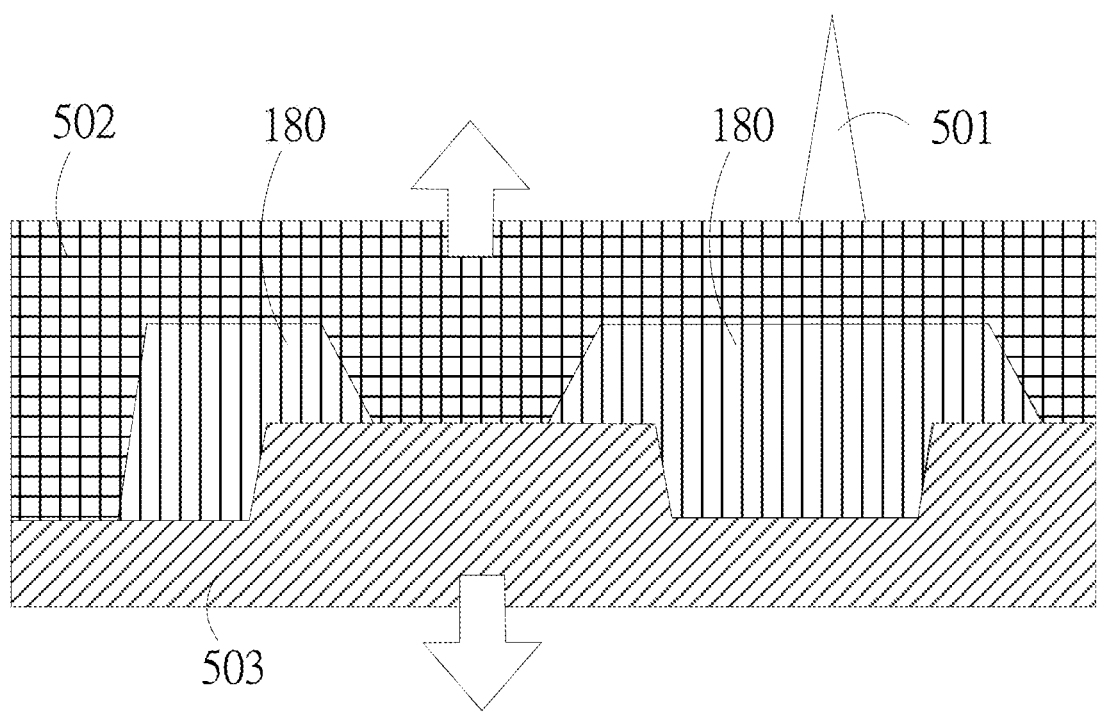
FIG. 13 is a schematic view of an optical image capturing module according to a tenth embodiment in the present invention.
Figure 14:
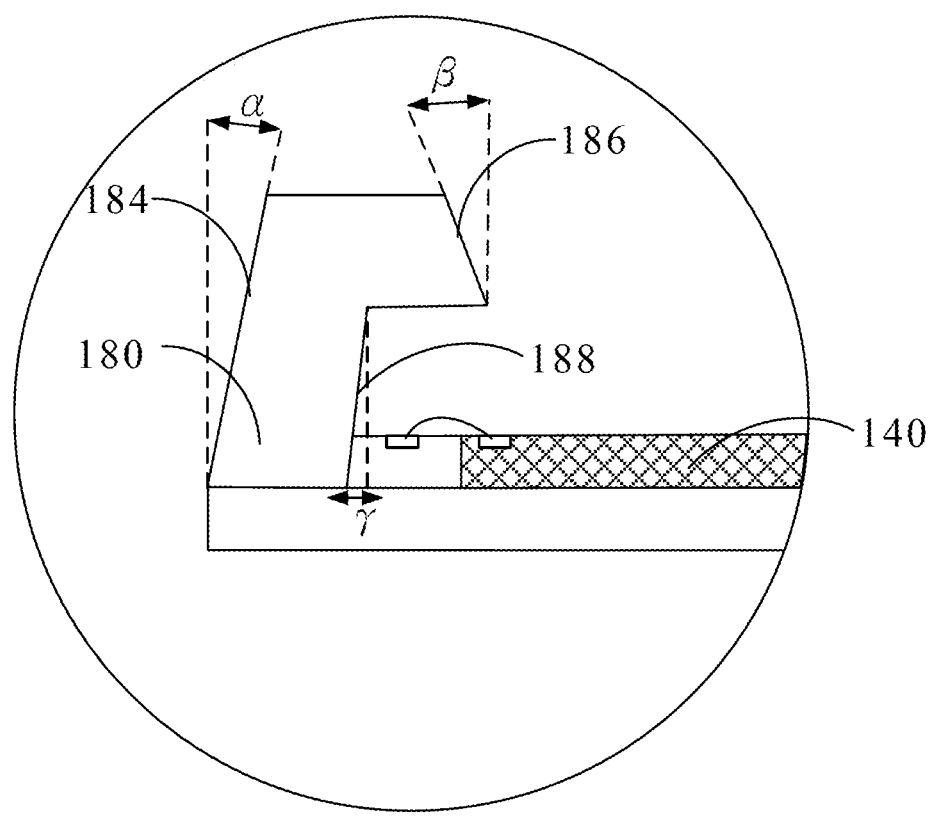
FIG. 14 is a schematic view of an optical image capturing module according to an eleventh embodiment in the present invention.
Figure 15:
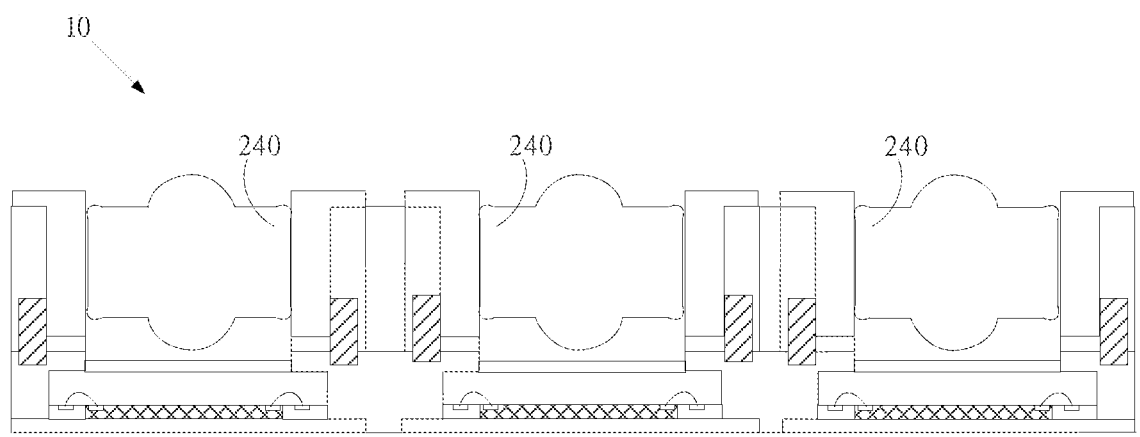
FIG. 15 is a schematic view of an optical image capturing module according to a twelfth embodiment in the present invention.

In an embodiment, as shown in FIG. 13 and FIG. 14, the multi-lens frame 180 may be manufactured in a molding approach. In this approach, the mold may be divided into a mold-fixed side 503 and a mold-moving side 502. When the mold-moving side 502 is covered on the mold-fixed side 503, the material may be filled in the mold from the injection port 501 to form the multi-lens frame 180.

The finally-formed multi-lens frame 180 may have an outer surface 184, a first inner surface 186, and second inner surface 188. The outer surface 184 extends from an edge of the circuit substrate 120, and has a tilted angle α with a central normal line of the sensing surface 1441. α is a value between 1° to 30°. The first inner surface 186 is the inner surface of the light channel 182. The first inner surface 186 has a tilted angle β with a central normal line of the sensing surface 1441. β is a value between 1° to 45°. The second inner surface 188 extends from the image sensor elements 140 to the light channel 182, and has a tilted angle γ with a central normal line of the sensing surface 1441. γ is a value between 1° to 3°. With the positions of the tilted angle α, β, and γ, inferior quality of the multi-lens frame 180 may be prevented when the mold-moving side 502 is detached from the mold-fixed side 503, thus minimizing the chances for the situations like poor release features and molding flash.

In addition, in another embodiment, the multi-lens frame 180 may also be manufactured integrally by 3D printing. The tilted angle α, β, and γ may be formed according to demands. For instance, the tilted angle α, β, and γ may be used to improve structural intensity and minimize stray light, etc. Each auto-focus lens assembly 240 may have at least two lenses 2401 with refractive power, be disposed on the lens base 220, and be positioned in the accommodating hole 2201. The image planes of the auto-focus lens assembly 240 may be disposed on the sensing surface 1441, and an optical axis of the auto-focus lens assembly 240 may overlap the central normal line of the sensing surface 1441 in such a way that light is able to pass through the auto-focus lens assembly 240 in the accommodating hole 2101, pass through the light channel 182, and be emitted to the sensing surface 1441 of the image sensor element 140 connected to the second circuit substrate 122. In addition, PhiB denotes the maximum diameter of the image side surface of the lens nearest to the image plane in each of the auto-focus lens assemblies 240. PhiA, also called the optical exit pupil, denotes a maximum effective diameter of the image side surface of the lens nearest to the image plane (image space) in each of the auto-focus lens assemblies 240.

In an embodiment, each drive assembly 260 is electrically connected to the circuit substrate 120, and may include a voice coil motor to drive each of the auto-focus lens assemblies 240 to move in a direction of the central normal line of the sensing surface 1441 of the image sensor element 140 connected to the first circuit substrate 121.

Each auto-focus lens assembly 240 further satisfies the following conditions:

$1.0 \leq f/HEP \leq 10.0;$ $0 \text{ deg} < HAF \leq 150 \text{ deg};$ $0 \text{ mm} < PhiD \leq 18 \text{ mm};$ $0 < PhiA/PhiD \geq 0.99;$ and $0.9 \leq 2(ARE/HEP) \leq 2.0;$ Specifically, f is the focal length of the auto-focus lens assembly 240, HEP is the entrance pupil diameter of the auto-focus lens assembly 240. HAF is the half maximum angle of view of the auto-focus lens assembly 240, PhiD is the maximum value of a minimum side length of an outer periphery of the lens base perpendicular to the optical axis of the auto-focus lens assembly 240, PhiA is the maximum effective diameter of the auto-focus lens assembly 240 nearest to a lens surface of the image plane, and ARE is the arc length along an outline of the lens surface, starting from an intersection point of any lens surface of any lens and the optical axis in the auto-focus lens assembly 240, and ending at a point with a vertical height which is the distance from the optical axis to half the entrance pupil diameter.

In an embodiment, as shown in FIG. 3 to FIG. 8, the lens base 220 may include the lens barrel 222 and lens holder 224. The lens barrel 222 may have an upper hole 2221 which passes through two ends of the lens barrel 222, and the lens holder 224 may have a lower hole 2241 which passes through two ends of the lens holder 224 with a predetermined wall thickness TH1. PhiD denotes the maximum value of a minimum side length of an outer periphery of the lens holder 224 perpendicular to the optical axis on the surface.

The lens barrel 222 may be disposed in the lens holder 224 and be positioned in the lower hole 2241 with a predetermined wall thickness TH2, PhiC is defined as the maximum diameter of the outer periphery perpendicular to the optical axis on the surface. This allows the upper hole 2221 and the lower hole 2241 to be connected to constitute the accommodating hole 2201. The lens holder 224 may be fixed on the multi-lens frame 180 in such a way that the lens holder 224 is positioned on the multi-lens holder 180. The upper hole 2221 of the lens barrel 222 faces the sensing surface 1441 of the image sensor element 140. The auto-focus lens assemblies 240 are disposed in the lens barrel 222 and is positioned in the upper hole 2221. The driving assembly 260 may drive the auto-focus lens assembly 240 positioned in the lens barrel 22, to make the auto-focus lens assembly 240 positioned in the lens barrel 22 to move in the central normal line of the sensing surface 1441 opposite to the lens holder 224, PhiD is the maximum value of a minimum side length of an outer periphery of the lens holder 224 perpendicular to the optical axis of the auto-focus lens assembly 240.

In an embodiment, the optical image capturing module 10 may further include at least one data transmission line 400 electrically connected to the circuit substrate 120, and transmits a plurality of sensing signals generated from each of the at least two image sensor elements 140.

Figure 9:
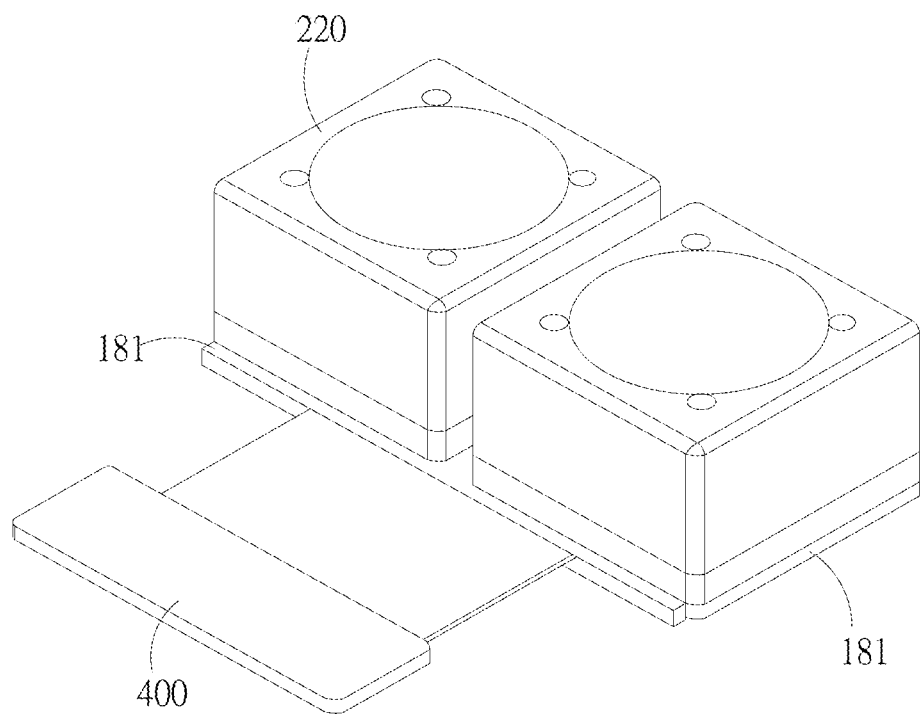
FIG. 9 is a schematic view of an optical image capturing module according to a sixth embodiment in the present invention.
Figure 11:
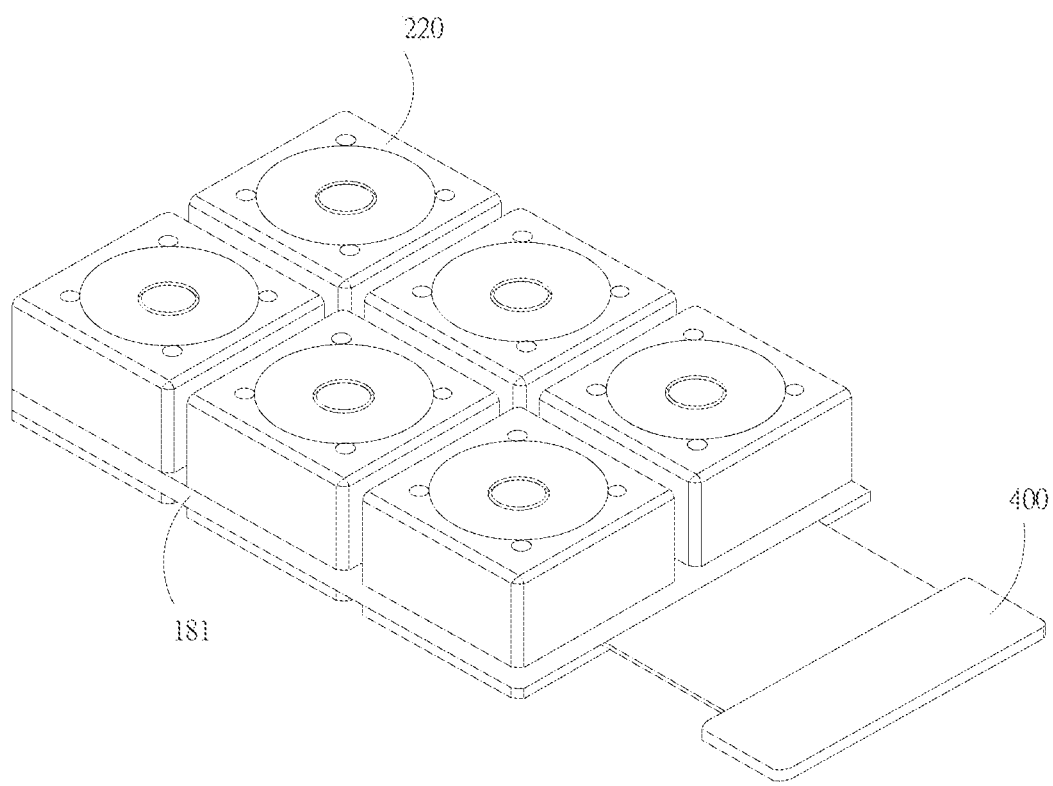
FIG. 11 is a schematic view of an optical image capturing module according to an eighth embodiment in the present invention.

Furthermore, as shown in FIG. 9 and FIG. 11, a single data transmission line 400 may be used to transmit a plurality of sensing signals generated from each of the at least two image sensor elements 140 of a dual lens, three lenses, array, or multi-lens optical image capturing module 10.

Figure 10:
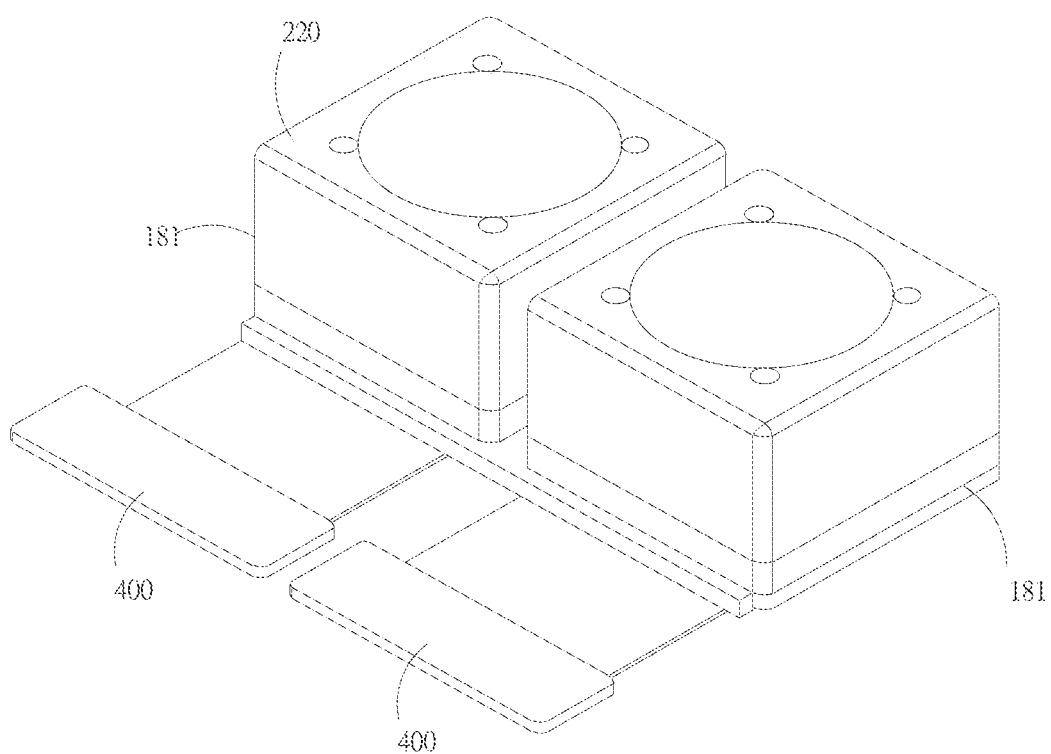
FIG. 10 is a schematic view of an optical image capturing module according to a seventh embodiment in the present invention.
Figure 12:
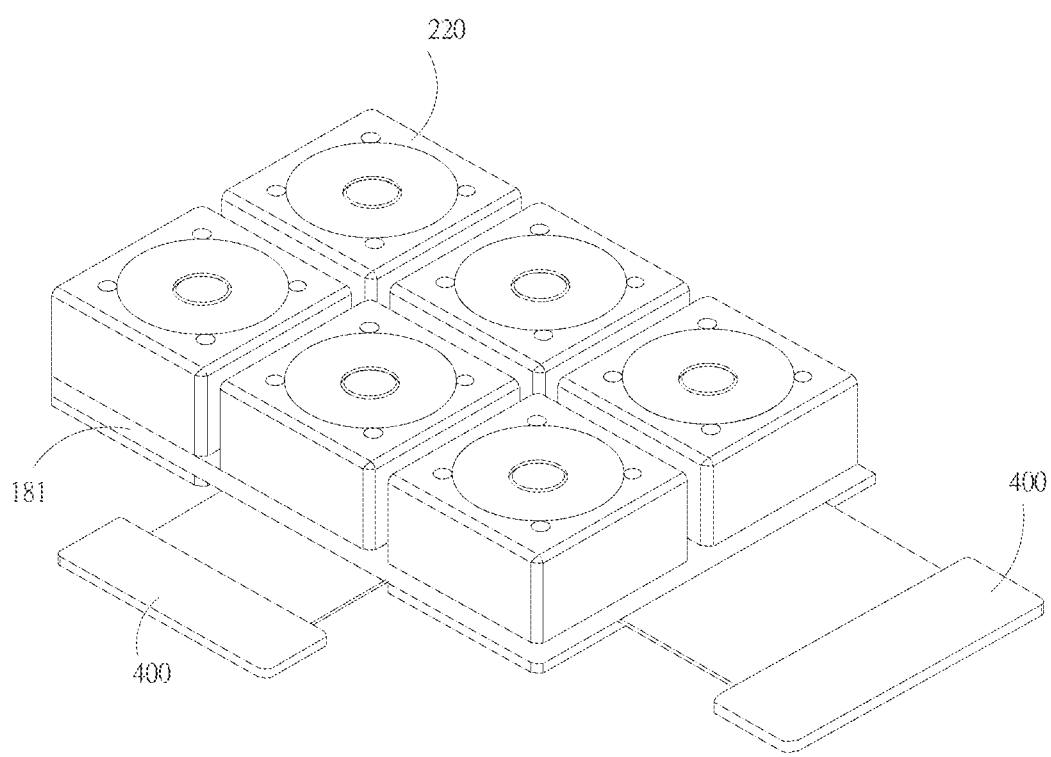
FIG. 12 is a schematic view of an optical image capturing module according to a ninth embodiment in the present invention.

In another embodiment, as shown in FIG. 10 and FIG. 12, a plurality of single data transmission lines 400 may separately be disposed to transmit a plurality of sensing signals generated from each of the plurality of image sensor elements 140 of a dual lens, three lenses, array, or multi-lens optical image capturing module 10.

In addition, in an embodiment, the plurality of image sensor elements 140 may sense a plurality of color images. Therefore, the optical image capturing module 10 in the present invention has the efficacy of filming colorful images and colorful videos. In another embodiment, at least one of the image sensor elements 140 may sense a plurality of black-and-white images and at least one of the image sensor elements 140 may sense a plurality of color images. Therefore, the optical image capturing module 10 in the present invention may sense a plurality of black-and-white images together with the image sensor elements 140 of the plurality of color images to acquire more image details and sensitivity needed for filming target objects. This allows the generated images or videos to have higher quality.

Figure 5:
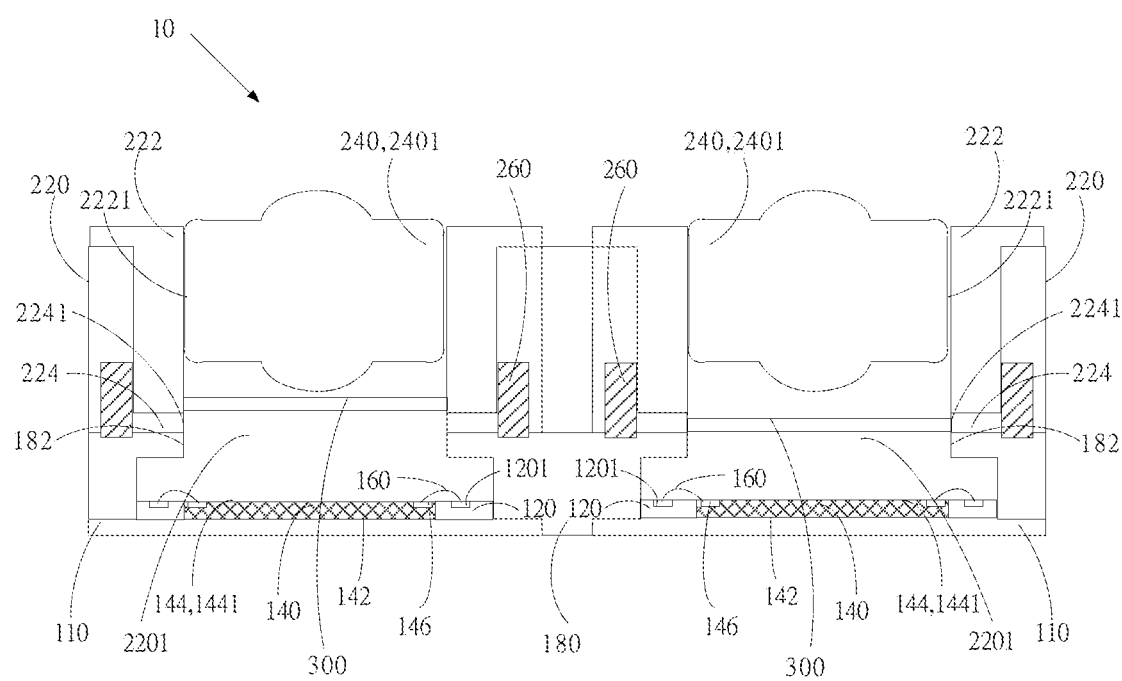
FIG. 5 is a schematic view of an optical image capturing module according to a second embodiment in the present invention.

In an embodiment, as shown in FIG. 3 to FIG. 8 and FIG. 15 to FIG. 19, the optical image capturing module 10 may further include IR-cut filters 300. The IR-cut filter 300 may be disposed in the lens base 220, located in the accommodating hole 2201, and positioned on the image sensor element 140 to filter out infrared ray. This may prevent image quality of the sensing surface 1441 of the image sensor elements 140 from being affected by the infrared ray, thereby improving the imaging quality. In an embodiment, as shown in FIG. 5, the IR-cut filter 300 may be disposed on the lens barrel 222 and the lens holder 224 and be positioned on the image sensor element 140.

Figure 6:
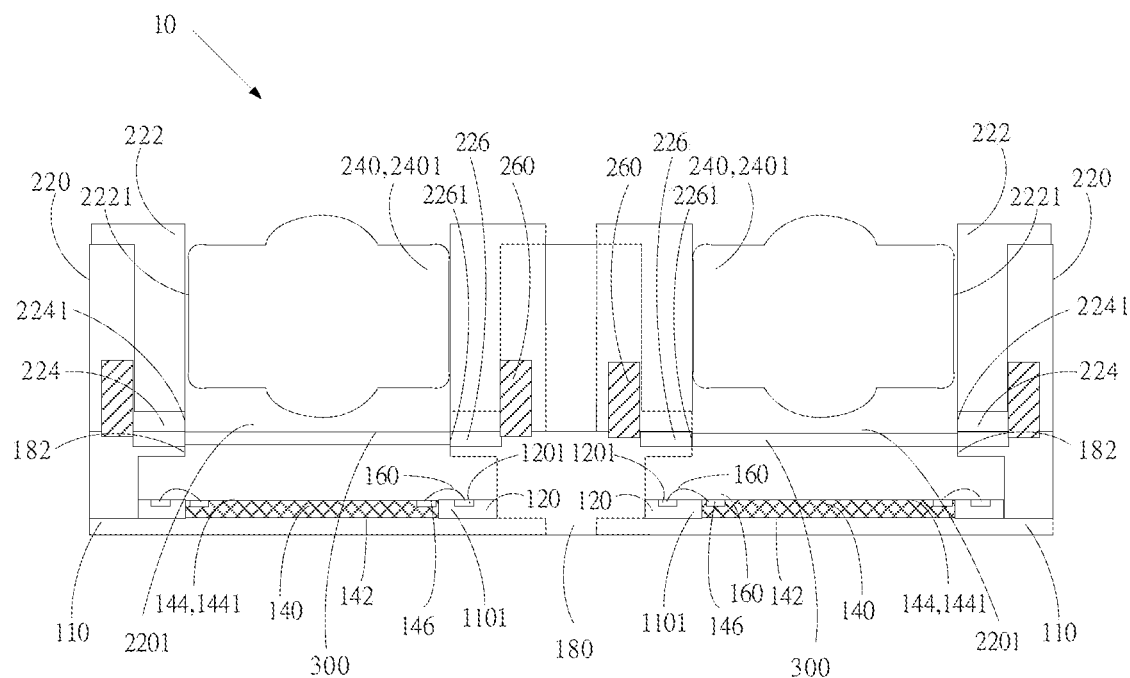
FIG. 6 is a schematic view of an optical image capturing module according to a third embodiment in the present invention.
Figure 7:
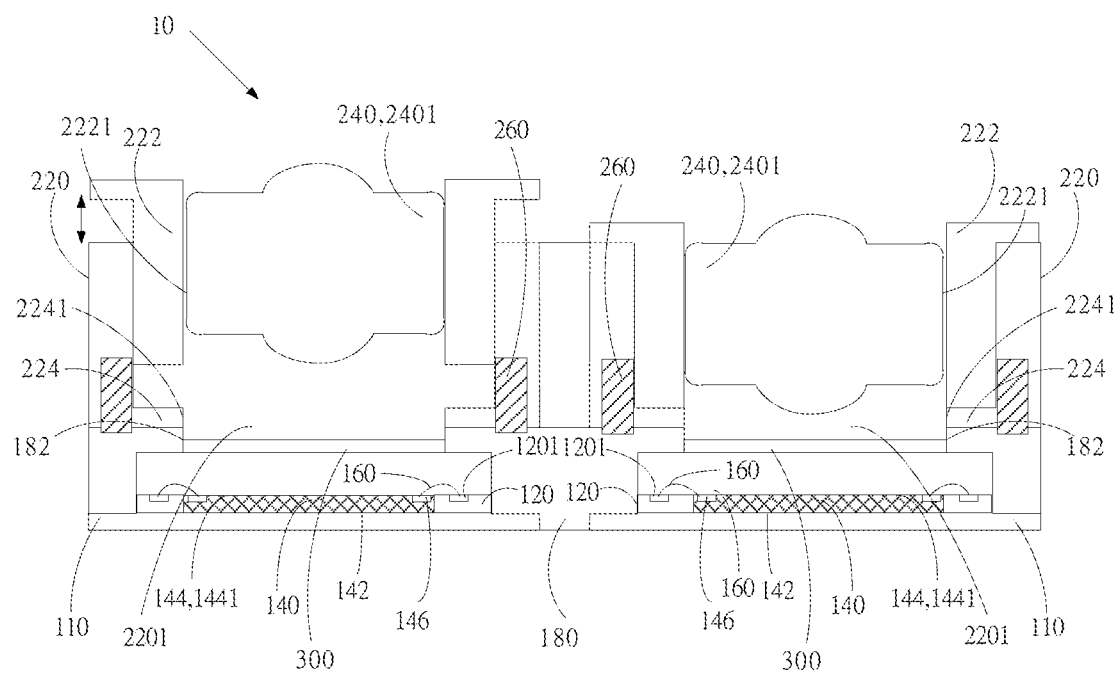
FIG. 7 is a schematic view of an optical image capturing module according to a fourth embodiment in the present invention.

In an embodiment, as shown in FIG. 6, the lens base 220 may include a filter holder 226. The filter holder 226 may have a filter hole 2261. The IR-cut filter 300 may be disposed in the filter holder 226 and be positioned in the filter hole 2261, and the filter holder 226 may correspond to positions of the plurality of light channels 182 and be disposed on the multi-lens frame 180 in such a way that the IR-cut filter 300 is positioned on the image sensor element 40 to filter out the infrared ray. This may prevent image quality of the sensing surface 1441 of the image sensor elements 140 from being affected by the infrared ray.

Furthermore, under a condition that the lens base 220 includes the filter holder 226, and the lens barrel 222 has an upper hole 2221 which passes through two ends of the lens barrel 222, and the lens holder 224 may have a lower hole 2241 which passes through two ends of the lens holder 224, the lens barrel 222 may be disposed in the lens holder 224 and be positioned in the lower hole 2241, The lens holder 224 may be disposed on the filter holder 226, and the lower hole 2241, the upper hole 2221, and the filter hole 2261 can be connected to constitute the accommodating hole 2201 in such a way that the image sensor element 140 is positioned in the filter hole 2261, and the upper hole 2221 of the lens barrel 222 faces the sensing surface 1441 of the image sensor element 140. Furthermore, the auto-focus lens assembly 240 are disposed in the lens barrel 222 and positioned in the upper hole 2221, to filter out infrared ray. This may prevent image quality of the sensing surface 1441 of the image sensor elements 140 from being affected by the infrared ray.

In an embodiment, the optical image capturing module 10 of the present invention can be a two-lens optical image capturing module 10. The optical image capturing module 10 may have at least two auto-focus lens assemblies 240 including a first lens assembly and a second lens assembly 2421. A field of view (FOV) of the second lens assembly is larger than that of the first lens assembly. and the field of view (FOV) of the second lens assembly may be larger than 46°, and the second lens assembly 2421 can be a wide-angle lens assembly.

Furthermore, the focal length of the first lens assembly is larger than that of the second lens assembly. For example, if a traditional photo in the size of 35 mm is regarded as a basis, the focal length may be 50 mm. When the focal length of the first lens assembly is larger than 50 mm, the first lens assembly may be a long focal lens assembly. In a preferred embodiment, a CMOS sensor (with a field of view of 70°) with the diagonal of 4.6 mm is regarded as a basis, the focal length is approximately 3.28 mm. When the focal length of the first lens assembly is larger than 3.28 mm, the first lens assembly may be a long focal lens assembly.

In an embodiment, the present invention may be a three-lens optical image capturing module 10. Thus, the optical image capturing module 10 may have at least three auto-focus lens assemblies 240 which may include a first lens assembly, a second lens assembly, and a third lens assembly. The field of view (FOV) of the second lens assembly may be larger than that of the first lens assembly, and the field of view (FOV) of the second lens assembly may be larger than 46°. Each of plurality of the image sensor elements 140 correspondingly receiving lights from the first lens assembly and the second lens assembly senses a plurality of color images. The image sensor elements 140 corresponding to the third lens assembly may sense a plurality of color images or a plurality of black and white images according to requirements.

In an embodiment, the present invention may be a three-lens optical image capturing module 10. Thus, the optical image capturing module 10 may have at least three auto-focus lens assemblies which may include a first lens assembly, a second lens assembly, and a third lens assembly. The focal length of the first lens assembly may be larger than that of the second lens assembly. For example, if a traditional photo in the size of 35 mm is regarded as a basis, the focal length may be 50 mm. When the focal length of the first lens assembly is larger than 50 mm, the first lens assembly may be a long focal lens assembly. In a preferred embodiment, a CMOS sensor (with a field of view of 700) with the diagonal of 4.6 mm is regarded as a basis, the focal length is approximately 3.28 mm. When the focal length of the first lens assembly is larger than 3.28 mm, the first lens assembly may be a long focal lens assembly. Each of plurality of the image sensor elements 140 correspondingly receiving lights from the first lens assembly and the second lens assembly senses a plurality of color images. The image sensor elements 140 corresponding to the third lens assembly may sense a plurality of color images or a plurality of black and white images according to requirements.

In an embodiment, the optical image capturing module 10 further satisfies the following conditions: $0<(TH1+TH2)/HOI \le 0.95$; Specifically, TH1 is the maximum thickness of the lens holder 214; TH2 is the minimum thickness 212 of the lens barrel; HOI is the maximum image height perpendicular to the optical axis on the image plane.

In an embodiment, the optical image capturing module 10 further satisfies the following conditions:

$$0 \text{ mm} < (TH1+TH2) \le 1.5 \text{ mm}.$$

In an embodiment, the optical image capturing module 10 further satisfies the following conditions: $0<(TH1+TH2)/HOI \le 0.95$.

In an embodiment, the optical image capturing module further satisfies the following conditions: $0.9 \le ARS/EHD \le 2.0$; Specifically, ARS is the arc length along an outline of the lens surface, starting from an intersection point of any lens surface of any lens and the optical axis in the auto-focus lens assembly 240, and ending at a maximum effective half diameter point of the lens surface; EHD is the maximum effective half diameter of any surface of any lens in the auto-focus lens assembly 240.

In an embodiment, the optical image capturing module 10 further satisfies the following conditions: $PLTA \le 100$ μm; $PSTA \le 100$ μm; $NLTA \le 100$ μm; $NSTA \le 100$ μm; $SLTA \le 100$ μm; $SSTA \le 100$ μm; Specifically, HOI is first defined as the maximum image height perpendicular to the optical axis on the image plane; PLTA is the lateral aberration of the longest operation wavelength of visible light of a positive tangential ray fan aberration of the optical image capturing module 10 passing through a margin of an entrance pupil and incident at the image plane by 0.7 HOI; PSTA is the lateral aberration of the shortest operation wavelength of visible light of a positive tangential ray fan aberration of the optical image capturing module 10 passing through a margin of an entrance pupil and incident at the image plane by 0.7 HOI; NLTA is the lateral aberration of the longest operation wavelength of visible light of a negative tangential ray fan aberration of the optical image capturing module 10 passing through a margin of an entrance pupil and incident at the image plane by 0.7 HOI; NSTA is the lateral aberration of the shortest operation wavelength of visible light of a negative tangential ray fan aberration of the optical image capturing module 10 passing through a margin of an entrance pupil and incident at the image plane by 0.7 HOI; SLTA is the lateral aberration of the longest operation wavelength of visible light of a sagittal ray fan aberration of the optical image capturing module 10 passing through the margin of the entrance pupil and incident at the image plane by 0.7 HOI; SSTA is the lateral aberration of the shortest operation wavelength of visible light of a sagittal ray fan aberration of the optical image capturing module 10 passing through the margin of the entrance pupil and incident at the image plane by 0.7 HOI.

In addition to the structural embodiment as mentioned above, an optical embodiment related to the auto-focus lens assembly 240 is to be described as follows. The optical image capturing module in the present invention may be designed using three operational wavelengths, namely 486.1 nm, 587.5 nm, 656.2 nm. Specifically, 587.5 nm is the main reference wavelength for the technical features. The optical image capturing module in the present invention may be designed using five operational wavelengths, namely 470 nm, 510 nm, 555 nm, 610 nm, 650 nm. Specifically, 555 nm is the main reference wavelength for the technical features.

PPR is the ratio of the focal length f of the optical image capturing module 10 to a focal length fp of each of lenses with positive refractive power. NPR is the ratio of the focal length f of the optical image capturing module 10 to the focal length fn of each of lenses with negative refractive power. The sum of the PPR of all the lenses with positive refractive power is ΣPPR. The sum of the NPR of all the lenses with negative refractive power is ΣNPR. Controlling the total refractive power and total length of the optical image capturing module 10 may be achieved when the following conditions are satisfied: $0.5 \leq \Sigma PPR/|\Sigma NPR| \geq 15$. Preferably, the following conditions may be satisfied: $1 \leq \Sigma PPR/|\Sigma NPR| \leq 3.0$.

In addition, HOI is defined as half a diagonal of a sensing field of the image sensor elements 140 (i.e., the imaging height or the maximum imaging height of the optical image capturing module 10). HOS is the distance on the optical axis from an object side surface of the first lens 2411 to the image plane, which satisfies the following conditions: $HOS/HOI \leq 50$; and $0.5 \leq HOS/f \leq 150$. Preferably, the following conditions are satisfied: $1 \leq HOS/HOI \leq 40$; $1 \leq HOS/f \leq 140$. Therefore, the optical image capturing module 10 may be maintained in miniaturization so that the module may be equipped on thin and portable electronic products.

In addition, in an embodiment, at least one aperture may be disposed in the optical image capturing module 10 in the present invention to reduce stray light and enhance imaging quality.

Specifically, the disposition of the aperture may be a front aperture or a middle aperture in the optical image capturing module 10 in the present invention. The front aperture is the aperture disposed between the shot object and the first lens. The middle aperture is the aperture disposed between the first lens and the image plane. If the aperture is the front aperture, a longer distance may be created between the exit pupil and the image plane in the optical image capturing module 10, so that more optical elements may be accommodated and the efficiency of image sensor elements receiving images may be increased. If the aperture is the middle aperture, the field of view of the system may be expended in such a way that the optical image capturing module has the advantages of a wide-angle lens. InS is defined as the distance from the aforementioned aperture to the image plane, which satisfies the following condition: $0.1 \leq InS/HOS \leq 1.1$. Therefore, the features of the optical image capturing module 10 maintained in miniaturization and having wide-angle may be attended simultaneously.

In the optical image capturing module 10 in the present invention, InTL is the distance on the optical axis from an object side surface of the first lens to an image side surface of the sixth lens. ΣTP is the sum of the thicknesses of all the lenses with refractive power on the optical axis. The following conditions are satisfied: $0.1 \leq \Sigma TP/InTL \leq 0.9$. Therefore, the contrast ratio of system imaging and the yield rate of lens manufacturing may be attended simultaneously. Moreover, an appropriate back focal length is provided to accommodate other elements.

R1 is the curvature radius of the object side surface of the first lens. R2 is the curvature radius of the image side surface of the first lens. The following condition is satisfied: $0.001 \leq |R1/R2| \leq 25$. Therefore, the first lens 2411 is e with appropriate intensity of positive refractive power to prevent the spherical aberration from increasing too fast. Preferably, the following condition is satisfied: $0.01 \leq |R1/R2| < 12$.

R11 is the curvature radius of the object side surface of the sixth lens. R12 is the curvature radius of the image side surface of the sixth lens. This following condition is satisfied: $-7 < (R11-R12)/(R11+R12) < 50$. Therefore, it is advantageous to correct the astigmatism generated by the optical image capturing module 10.

IN12 is the distance between the first lens 2411 and the second lens 2421 on the optical axis. The following condition is satisfied: $IN12/f \leq 60$. Therefore, it is beneficial to improve the chromatic aberration of the lenses so as to enhance the performance.

IN56 is the distance between the fifth lens 2451 and the sixth lens 2462 on the optical axis. The following condition is satisfied: $IN56/f \leq 3.0$. Therefore, it is beneficial to improve the chromatic aberration of the lens assemblies so as to enhance the performance.

TP1 and TP2 are respectively the thicknesses of the first lens 2411 and the second lens 2421 on the optical axis. The following condition is satisfied: $0.1 \leq (TP1+IN12)/TP2 \leq 10$. Therefore, it is beneficial to control the sensitivity produced by the optical image capturing module so as to enhance the performance.

TP5 and TP6 are respectively the thicknesses of the fifth lens 2451 and the sixth lens 2461 on the optical axis. The following condition is satisfied: $0.1 \leq (TP6+IN56)/TP5 \leq 15$. Therefore, it is beneficial to control the sensitivity produced by the optical image capturing module so as to enhance the performance.

TP4 is respectively the thicknesses of the fourth lens 2441 on the optical axis. IN34 is the distance between the third lens and the fourth lens on the optical axis. IN45 is the distance between the fourth lens and the fifth lens on the optical axis. InTL is the distance from an object side surface of the first lens to an image side surface of the sixth lens. The following condition is satisfied: $0.1 \leq TP4/(IN34+TP4+IN45) < 1$. Therefore, it is beneficial to slightly correct the aberration generated by the incident light advancing in the process layer upon layer so as to decrease the overall height of the system.

In the optical image capturing module 10, HVT61 is the distance perpendicular to the optical axis between a critical point C61 on an object side surface of the sixth lens 2461 and the optical axis. HVT62 is the distance perpendicular to the optical axis between a critical point C62 on an image side surface of the sixth lens 2461 and the optical axis. SGC61 is the distance parallel to the optical axis from an axial point on the object side surface of the sixth lens to the critical point C61. SGC62 is the distance parallel to the optical axis from an axial point on the image side surface of the sixth lens to the critical point C62. The following conditions may be satisfied: 0 mm≤HVT61≤3 mm; 0 mm<HVT62≤6 mm; 0≤HVT61/HVT62; 0 mm≤|SGC61|≤0.5 mm; 0 mm<|SGC62|≤2 mm; and 0<|SGC62|/(|SGC62|+TP6)≤0.9. Therefore, it may be effective to correct the aberration of the off-axis view field.

The optical image capturing module 10 in the present disclosure satisfies the following condition: 0.2≤HVT62/HOI≤0.9. Preferably, the following condition may be satisfied: 0.3≤HVT62/HOI≤0.8. Therefore, it is beneficial to correct the aberration of surrounding view field for the optical image capturing module.

The optical image capturing module 10 in the present disclosure satisfies the following condition: 0≤HVT62/HOS≤0.5. Preferably, the following condition may be satisfied: 0.2≤HVT62/HOS≤0.45. Hereby, it is beneficial to correct the aberration of surrounding view field for the optical image capturing module.

In the optical image capturing module 10 in the present disclosure, SGI611 denotes a distance parallel to an optical axis from an inflection point on the object side surface of the sixth lens 2461 which is nearest to the optical axis to an axial point on the object side surface of the sixth lens 2461. SGI621 denotes a distance parallel to an optical axis from an inflection point on the image side surface of the sixth lens 2461 which is nearest to the optical axis to an axial point on the image side surface of the sixth lens 2461. The following condition are satisfied: 0<SGI611/(SGI611+TP6)≤0.9; 0<SGI621/(SGI621+TP6)≤0.9. Preferably, the following conditions may be satisfied: 0.1≤SGI611/(SGI611+TP6)≤0.6; 0.1≤SGI621/(SGI621+TP6)≤0.6.

SGI612 denotes a distance parallel to the optical axis from the inflection point on the object side surface of the sixth lens 2461 which is the second nearest to the optical axis to an axial point on the object side surface of the sixth lens 2461. SGI622 denotes a distance parallel to an optical axis from an inflection point on the image side surface of the sixth lens 2461 which is the second nearest to the optical axis to an axial point on the image side surface of the sixth lens 2461. The following conditions are satisfied: 0<SGI612/(SGI612+TP6)≤0.9; 0<SGI622/(SGI622+TP6)≤0.9. Preferably, the following conditions may be satisfied: 0.1≤SGI612/(SGI612+TP6)≤0.6; 0.1≤SGI622/(SGI622+TP6)≤0.6.

HIF611 denotes the distance perpendicular to the optical axis between the inflection point on the object side surface of the sixth lens which is the nearest to the optical axis and the optical axis. HIF621 denotes the distance perpendicular to the optical axis between an axial point on the image side surface of the sixth lens and an inflection point on the image side surface of the sixth lens which is the nearest to the optical axis. The following conditions are satisfied: 0.001 mm≤|HIF611|≤5 mm; 0.001 mm≤|HIF621|≤5 mm. Preferably, the following conditions may be satisfied: 0.1 mm≤|HIF611|≤3.5 mm; 1.5 mm≤|HIF621|≤3.5 mm.

HIF612 denotes the distance perpendicular to the optical axis between the inflection point on the object side surface of the sixth lens which is the second nearest to the optical axis and the optical axis. HIF622 denotes the distance perpendicular to the optical axis between an axial point on the image side surface of the sixth lens and an inflection point on the image side surface of the sixth lens which is the second nearest to the optical axis. The following conditions are satisfied: 0.001 mm≤|HIF612|≤5 mm; 0.001 mm≤|HIF622|≤5 mm. Preferably, the following conditions may be satisfied: 0.1 mm≤|HIF622|≤3.5 mm; 0.1 mm≤|HIF612|≤3.5 mm.

HIF613 denotes the distance perpendicular to the optical axis between the inflection point on the object side surface of the sixth lens which is the third nearest to the optical axis and the optical axis. HIF623 denotes the distance perpendicular to the optical axis between an axial point on the image side surface of the sixth lens and an inflection point on the image side surface of the sixth lens which is the third nearest to the optical axis. The following conditions are satisfied: 0.001 mm≤|HIF613|≤5 mm; 0.001 mm≤|HIF623|≤5 mm. Preferably, the following conditions may be satisfied: 0.1 mm≤|HIF623|≤3.5 mm; 0.1 mm≤|HIF613|≤3.5 mm.

HIF614 denotes the distance perpendicular to the optical axis between the inflection point on the object side surface of the sixth lens which is the fourth nearest to the optical axis and the optical axis. HIF624 denotes the distance perpendicular to the optical axis between an axial point on the image side surface of the sixth lens and an inflection point on the image side surface of the sixth lens which is the fourth nearest to the optical axis. The following conditions are satisfied: 0.001 mm≤|HIF614|≤5 mm; 0.001 mm≤|HIF624|≤5 mm. Preferably, the following relations may be satisfied: 0.1 mm≤|HIF624|≤3.5 mm and 0.1 mm≤|HIF614|≤3.5 mm.

In the optical image capturing module in the present disclosure, (TH1+TH2)/HOI satisfies the following condition: 0<(TH1+TH2)/HOI≤0.95; or, 0<(TH1+TH2)/HOI≤0.5 preferably. (TH1+TH2)/HOS satisfies the following condition: 0<(TH1+TH2)/HOS≤0.95, or 0<(TH1+TH2)/HOS≤0.5 preferably. 2*(TH1+TH2)/PhiA satisfies the following condition: 0<2*(TH1+TH2)/PhiA≤0.95; or 0<2*(TH1+TH2)/PhiA≤0.5 preferably.

In an embodiment of the optical image capturing module in the present disclosure, interchangeably arranging the lenses with a high dispersion coefficient and a low dispersion coefficient is beneficial to correcting the chromatic aberration of optical imaging module.

The equation for the aspheric surface as mentioned above is:

$$z = ch^2/[1+[1-(k+1)c^2h^2]^{0.5}] + A4h^4 + A6h^6 + A8h^8 + A10h^{10} + A12h^{12} + A14h^{14} + A16h^{16} + A18h^{18} + A20h^{20} + \ldots \quad (1)$$

Wherein, z is the position value of the position along the optical axis at the height h where the surface apex is regarded as a reference; k is the conic coefficient; c is the reciprocal of curvature radius; and A4, A6, A8, A10, A12, A14, A16, A18, and A20 are high order aspheric coefficients.

In the optical image capturing module provided by the present disclosure, the material of the lens may be made of glass or plastic. Using plastic as the material for producing the lens may effectively reduce the cost of manufacturing. In addition, using glass as the material for producing the lens may control the heat effect and increase the designed space configured by the refractive power of the optical image capturing module. Moreover, the object side surface and the image side surface from the first lens to the sixth lens may be aspheric, which may obtain more control variables. Apart from eliminating the aberration, the number of lenses used may be reduced compared with that of traditional lenses used made by glass. Thus, the total height of the optical image capturing module may be reduced effectively.

Furthermore, in the optical image capturing module 10 provided by the present disclosure, when the surface of the lens is a convex surface, the surface of the lens adjacent to the optical axis is convex in principle. When the surface of the lens is a concave surface, the surface of the lens adjacent to the optical axis is concave in principle.

The optical image capturing module of the present invention is superior in the correction of aberration and high imaging quality, and may be applied to a dynamic focusing optical system upon demand.

In the optical image capturing module in the present application, at least one of the first lens 2411, the second lens 2421, the third lens 2431, the fourth lens 2441, the fifth lens 2451, sixth lens 2461 and the seventh lens 2471 may further be designed as a light filtration element with a wavelength of less than 500 nm depending on requirements. The light filtration element may be realized by coating at least one surface of the specific lens with the filter function, or may be realized by the lens itself having the material capable of filtering short wavelength.

The image plane of the optical image capturing module 10 in the present application may be a plane or a curved surface depending requirements. When the image plane is a curved surface such as a spherical surface with a curvature radius, the incident angle necessary for focusing light on the image plane may be reduced. Hence, it not only contributes to shortening the length (TTL) of the optical image capturing module, but also promotes the relative illuminance.

The First Optical Embodiment

Figure 18:
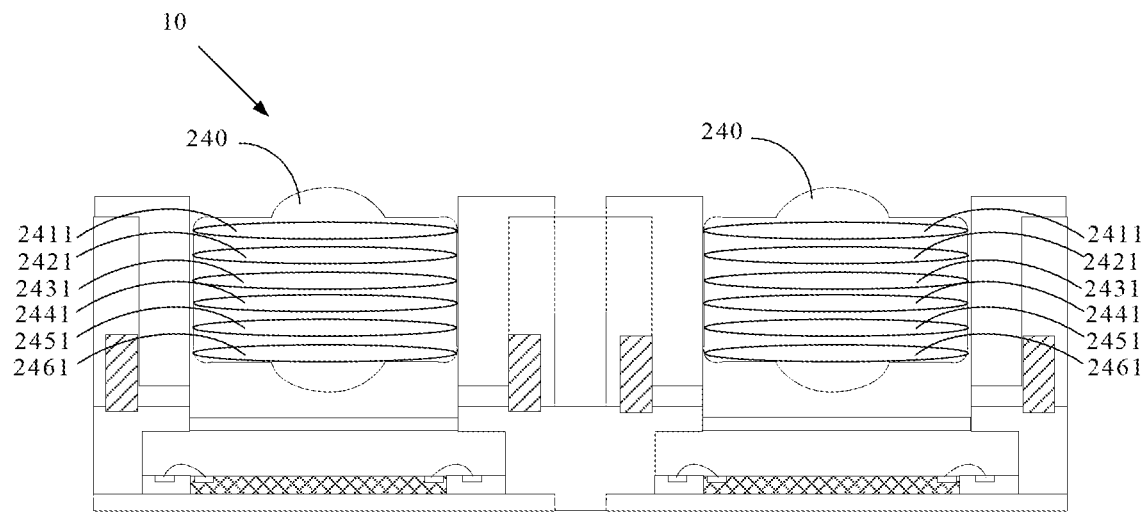
FIG. 18 is a schematic view of an optical image capturing module according to a fifteenth embodiment in the present invention.

As shown in FIG. 18, each auto-focus lens assembly 240 may include six lenses 2401 with refractive power, and includes a first lens 2411, a second lens 2421, a third lens 2431, a four lens 2441, a fifth lens 2451, and a sixth lens 2461 sequentially displayed from an object side surface to an image side surface. Each the auto-focus lens assemblies further satisfies the following conditions: 0.1≤InTL/HOS≤0.95 specifically, HOS is the distance from an object side surface of the first lens 2411 to the imaging surface on an optical axis; InTL is the distance from an object side surface of the first lens 2411 to an image side surface of the sixth lens 2461 on an optical axis.

Figure 20:
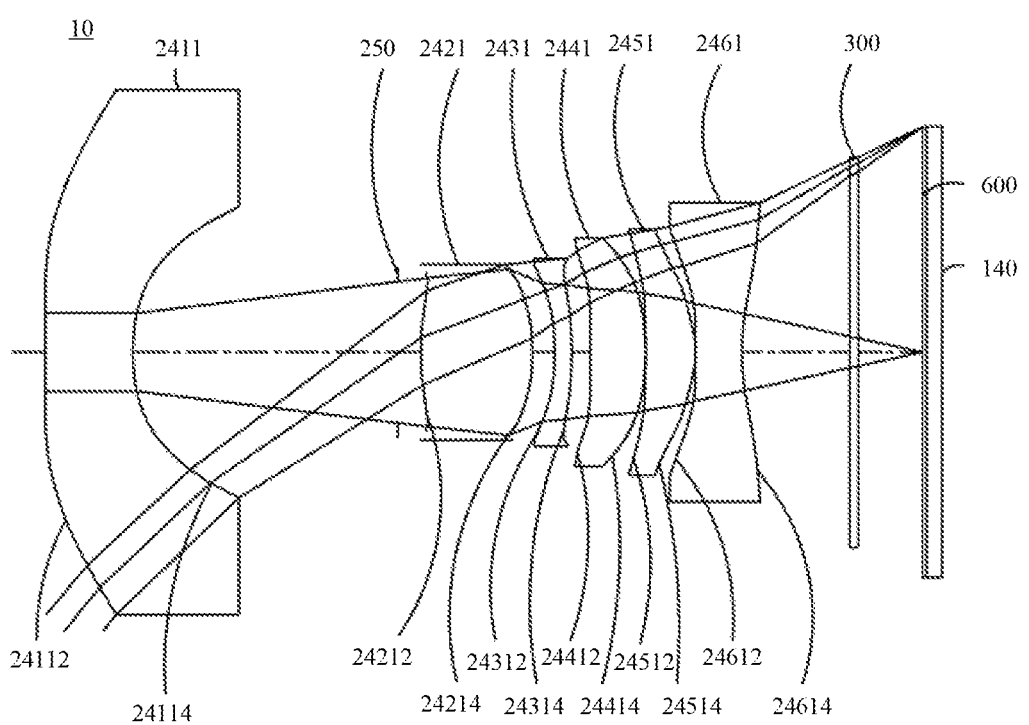
FIG. 20 is a schematic view of an optical image capturing module according to a first optical embodiment in the present invention.
Figure 21:
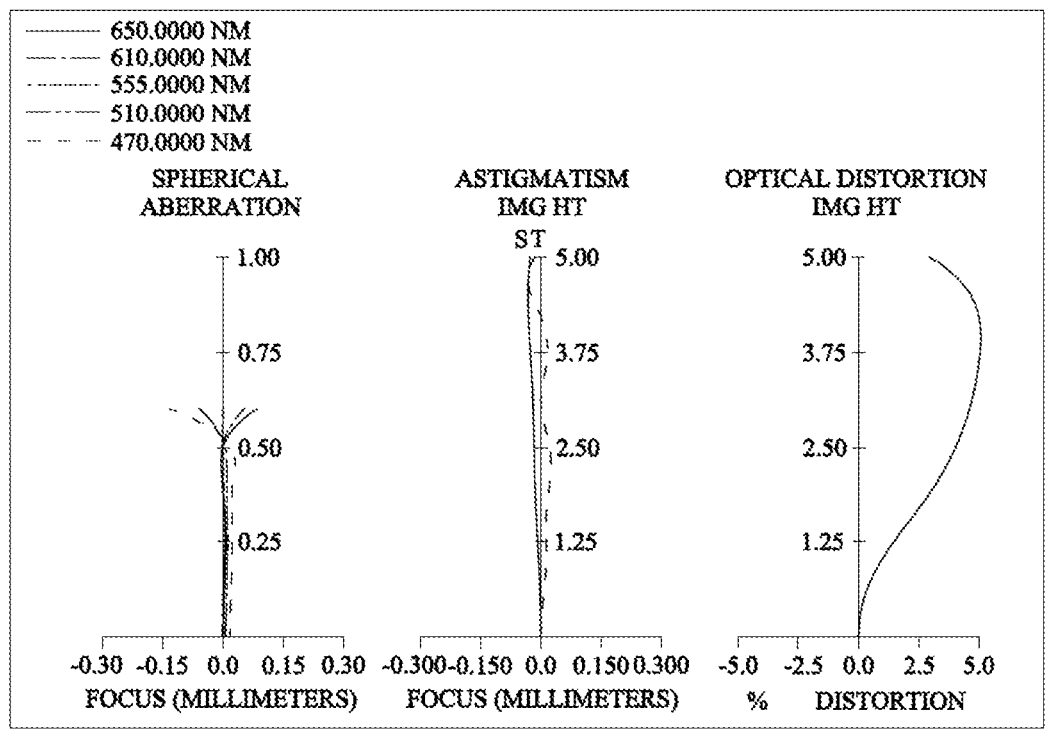
FIG. 21 is curve diagrams of spherical aberration, astigmatism, and optical distortion of the first optical embodiment illustrated sequentially from the left to the right according to the embodiment in the present invention.

Please refer to FIGS. 20 and 21. FIG. 20 is a schematic view of an optical image capturing module according to the first embodiment in the present invention. FIG. 21 is curve diagrams of spherical aberration, astigmatism, and optical distortion of the first optical embodiment illustrated sequentially from the left to the right according to the embodiment in the present invention. As shown in FIG. 20, the optical image capturing module 10 includes a first lens 2411, an aperture 250, a second lens 2421, a third lens 2431, a fourth lens 2441, a fifth lens 2451, a sixth lens 2461, an IR-cut filter 300, an image plane 600, and image sensor elements 140 sequentially displayed from an object side surface to an image side surface.

The first lens 2411 has negative refractive power and is made of a plastic material. The object side surface 24112 thereof is a concave surface and the image side surface 24114 thereof is a concave surface, both of which are aspheric. The object side surface 24112 thereof has two inflection points. ARS11 denotes the arc length of the maximum effective half diameter of the object side surface of the first lens 2411. ARS 12 denotes the arc length of the maximum effective half diameter of the image side surface 24114 of the first lens 2411. ARE11 denotes the arc length of half the entrance pupil diameter (HEP) of the object side surface 24112 of the first lens 2411. ARE12 denotes the arc length of half the entrance pupil diameter (HEP) of the image side surface 24114 of the first lens 2411. TP1 is the thickness of the first lens on the optical axis.

SGI111 denotes a distance parallel to the optical axis from the inflection point on the object side surface 24112 of the first lens 2411 which is the nearest to the optical axis to an axial point on the object side surface 24112 of the first lens 2411. SGI121 denotes a distance parallel to an optical axis from an inflection point on the image side surface 24114 of the first lens 2411 which is the nearest to the optical axis to an axial point on the image side surface 24114 of the first lens 2411. The following conditions are satisfied: SGI111=−0.0031 mm; |SGI111|/(|SGI111|+TP1)=0.0016.

SGI112 denotes the distance parallel to the optical axis from the inflection point on the object side surface 24112 of the first lens 2411 which is the second nearest to the optical axis to an axial point on the object side surface 24112 of the first lens 2411. SGI122 denotes the distance parallel to an optical axis from an inflection point on the image side surface 24114 of the first lens 2411 which is the second nearest to the optical axis to an axial point on the image side surface 24114 of the first lens 2411. The following conditions are satisfied: SGI112=1.3178 mm; |SGI112|/(|SGI12|+TP1)=0.4052.

HIF111 denotes the distance perpendicular to the optical axis between the inflection point on the object side surface 24112 of the first lens 2411 which is the nearest to the optical axis and the optical axis. HIF121 denotes the distance perpendicular to the optical axis between an axial point on the image side surface 24114 of the first lens 2411 and an inflection point on the image side surface 24114 of the first lens 2411 which is the nearest to the optical axis. The following conditions are satisfied: HIF111=0.5557 mm; HIF111/HOI=0.1111.

HIF112 denotes the distance perpendicular to the optical axis between the inflection point on the object side surface 24112 of the first lens 2411 which is the second nearest to the optical axis and the optical axis. HIF122 denotes the distance perpendicular to the optical axis between an axial point on the image side surface 24114 of the first lens 2411 and an inflection point on the image side surface 24114 of the first lens 2411 which is the second nearest to the optical axis. The following conditions are satisfied: HIF112=5.3732 mm; HIF112/HOI=1.0746.

The second lens 2421 has positive refractive power and is made of a plastic material. The object side surface 24212 thereof is a convex surface and the image side surface 24214 thereof is a convex surface, both of which are aspheric. The object side surface 24212 thereof has an inflection point. ARS21 denotes the arc length of the maximum effective half diameter of the object side surface 24212 of the second lens 2421. ARS22 denotes the arc length of the maximum effective half diameter of the image side surface 24214 of the second lens 2421. ARE21 denotes an arc length of half the entrance pupil diameter (HEP) of the object side surface 24212 of the second lens 2421. ARE22 denotes the arc length of half the entrance pupil diameter (HEP) of the image side surface 24214 of the second lens 2421. TP2 is the thickness of the second lens 2421 on the optical axis.

SGI211 denotes the distance parallel to the optical axis from the inflection point on the object side surface 24212 of the second lens 2421 which is the nearest to the optical axis to an axial point on the object side surface 24212 of the second lens 2421. SGI221 denotes the distance parallel to an optical axis from an inflection point on the image side surface 24214 of the second lens 2421 which is the nearest to the optical axis to an axial point on the image side surface 24214 of the second lens 2421. The following conditions are satisfied: SGI211=0.1069 mm; |SGI211|/(|SGI211|+TP2)= 0.0412; SGI221=0 mm; |SGI221|/(|SGI221|+TP2)=0.

HIF211 denotes the distance perpendicular to the optical axis between the inflection point on the object side surface 24212 of the second lens 2421 which is the nearest to the optical axis and the optical axis. HIF221 denotes the distance perpendicular to the optical axis between an axial point on the image side surface 24214 of the second lens 2421 and an inflection point on the image side surface 24214 of the second lens 2421 which is the nearest to the optical axis. The following conditions are satisfied: HIF211=1.1264 mm; HIF211/HOI=0.2253; HIF221=0 mm; HIF221/HOI=0.

The third lens 2431 has negative refractive power and is made of a plastic material. The object side surface 24312 thereof is a concave surface and the image side surface 24314 thereof is a convex surface, both of which are aspheric. The object side surface 24312 and the image side surface 24314 thereof both have an inflection point. ARS31 denotes the arc length of the maximum effective half diameter of the object side surface 24312 of the third lens 2431. ARS32 denotes an arc length of the maximum effective half diameter of the image side surface 24314 of the third lens 2431. ARE31 denotes the arc length of half the entrance pupil diameter (HEP) of the object side surface 24312 of the third lens 2431. ARE32 denotes the arc length of half the entrance pupil diameter (HEP) of the image side surface of the third lens. TP3 is the thickness of the third lens 2431 on the optical axis.

SGI311 denotes the distance parallel to the optical axis from the inflection point on the object side surface 24312 of the third lens 2431 which is the nearest to the optical axis to an axial point on the object side surface 24312 of the third lens 2431. SGI321 denotes the distance parallel to an optical axis from an inflection point on the image side surface 24314 of the third lens 2431 which is the nearest to the optical axis to an axial point on the image side surface 24314 of the third lens 2431. The following conditions are satisfied: SGI311= −0.3041 mm; |SGI311|/(|SGI311|+TP3)=0.4445; SGI321= −0.1172 mm; |SGI321|/(|SGI321|+TP3)=0.2357.

HIF311 denotes the distance perpendicular to the optical axis between the inflection point on the object side surface 24312 of the third lens 2431 which is the nearest to the optical axis and the optical axis. HIF321 denotes the distance perpendicular to the optical axis between an axial point on the image side surface 24314 of the third lens 2431 and an inflection point on the image side surface 24314 of the third lens 2431 which is the nearest to the optical axis. The following conditions are satisfied: HIF311=1.5907 mm; HIF311/HOI=0.3181; HIF321=1.3380 mm; HIF321/HOI=0.2676.

The fourth lens 2441 has positive refractive power and is made of a plastic material. The object side surface 24412 thereof is a convex surface and the image side surface 24414 thereof is a concave surface, both of which are aspheric. The object side surface 24412 thereof has two inflection points and the image side surface 24414 thereof has an inflection point. ARS41 denotes the arc length of the maximum effective half diameter of the object side surface 24412 of the fourth lens 2441. ARS42 denotes the arc length of the maximum effective half diameter of the image side surface 24414 of the fourth lens 2441. ARE41 denotes the arc length of half the entrance pupil diameter (HEP) of the object side surface 24412 of the fourth lens 2441. ARE42 denotes the arc length of half the entrance pupil diameter (HEP) of the image side surface 24414 of the fourth lens 2441. TP4 is the thickness of the fourth lens 2441 on the optical axis.

SGI411 denotes the distance parallel to the optical axis from the inflection point on the object side surface 24412 of the fourth lens 2441 which is the nearest to the optical axis to an axial point on the object side surface 24412 of the fourth lens 2441. SGI421 denotes the distance parallel to an optical axis from an inflection point on the image side surface 24414 of the fourth lens 2441 which is the nearest to the optical axis to an axial point on the image side surface 24414 of the fourth lens 2441. The following conditions are satisfied: SGI411=0.0070 mm; |SGI411|/(|SGI411|+TP4)= 0.0056; SGI421=0.0006 mm; |SGI421|/(|SGI421|+TP4)= 0.0005.

SGI412 denotes the distance parallel to the optical axis from the inflection point on the object side surface 24412 of the fourth lens 2441 which is the second nearest to the optical axis to an axial point on the object side surface 24412 of the fourth lens 2441. SGI422 denotes the distance parallel to an optical axis from an inflection point on the image side surface 24414 of the fourth lens 2441 which is the second nearest to the optical axis to an axial point on the image side surface 24414 of the fourth lens 2441. The following conditions are satisfied: SGI412=−0.2078 mm; |SGI412|/ (|SGI412|+TP4)=0.1439.

HIF411 denotes the distance perpendicular to the optical axis between the inflection point on the object side surface 24412 of the fourth lens 2441 which is the nearest to the optical axis and the optical axis. HIF421 denotes the distance perpendicular to the optical axis between an axial point on the image side surface 24414 of the fourth lens 2441 and an inflection point on the image side surface 24414 of the fourth lens 2441 which is the nearest to the optical axis. The following conditions are satisfied: HIF411=0.4706 mm; HIF411/HOI=0.0941; HIF421=0.1721 mm; HIF421/HOI=0.0344.

HIF412 denotes the distance perpendicular to the optical axis between the inflection point on the object side surface 24412 of the fourth lens 2441 which is the second nearest to the optical axis and the optical axis. HIF422 denotes the distance perpendicular to the optical axis between an axial point on the image side surface 24414 of the fourth lens 2441 and an inflection point on the image side surface 24414 of the fourth lens 2441 which is the second nearest to the optical axis. The following conditions are satisfied: HIF412=2.0421 mm; HIF412/HOI=0.4084.

The fifth lens 2451 has positive refractive power and is made of a plastic material. The object side surface 24512 thereof is a convex surface and the image side surface 24514 thereof is a convex surface, both of which are aspheric. The object side surface 24512 thereof has two inflection points and the image side surface 24514 thereof has an inflection point. ARS51 denotes the arc length of the maximum effective half diameter of the object side surface 24512 of the fifth lens 2451. ARS52 denotes the arc length of the maximum effective half diameter of the image side surface 24514 of the fifth lens 2451. ARE51 denotes the arc length of half the entrance pupil diameter (HEP) of the object side surface 24512 of the fifth lens 2451. ARE52 denotes the arc length of half the entrance pupil diameter (HEP) of the image side surface 24514 of the fifth lens. TP5 is the thickness of the fifth lens 2451 on the optical axis.

SGI511 denotes the distance parallel to the optical axis from the inflection point on the object side surface 24512 of the fifth lens 2451 which is the nearest to the optical axis to an axial point on the object side surface 24512 of the fifth lens 2451. SGI521 denotes the distance parallel to an optical axis from an inflection point on the image side surface 24514 of the fifth lens 2451 which is the nearest to the optical axis to an axial point on the image side surface 24514 of the fifth lens 2451. The following conditions are satisfied: SGI511=0.00364 mm; |SGI511|/(|SGI511|+TP5)=0.00338; SGI521=−0.63365 mm; |SGI521|/(|SGI521|+TP5)=0.37154.

SGI512 denotes the distance parallel to the optical axis from the inflection point on the object side surface 24512 of the fifth lens 2451 which is the second nearest to the optical axis to an axial point on the object side surface 24512 of the fifth lens 2451. SGI522 denotes the distance parallel to an optical axis from an inflection point on the image side surface 24514 of the fifth lens 2451 which is the second nearest to the optical axis to an axial point on the image side surface 24514 of the fifth lens 2451. The following conditions are satisfied: SGI512=−0.32032 mm; |SGI512|/(|SGI512|+TP5)=0.23009.

SGI513 denotes the distance parallel to the optical axis from the inflection point on the object side surface 24512 of the fifth lens 2451 which is the third nearest to the optical axis to an axial point on the object side surface 24512 of the fifth lens 2451. SGI523 denotes the distance parallel to an optical axis from an inflection point on the image side surface 24514 of the fifth lens 2451 which is the third nearest to the optical axis to an axial point on the image side surface 24514 of the fifth lens 2451. The following conditions are satisfied: SGI513=0 mm; |SGI513|/(|SGI513|+TP5)=0; SGI523=0 mm; |SGI523|/(|SGI523|+TP5)=0.

SGI514 denotes the distance parallel to the optical axis from the inflection point on the object side surface 24512 of the fifth lens 2451 which is the fourth nearest to the optical axis to an axial point on the object side surface 24512 of the fifth lens 2451. SGI524 denotes a distance parallel to an optical axis from an inflection point on the image side surface 24514 of the fifth lens 2451 which is the fourth nearest to the optical axis to an axial point on the image side surface 24514 of the fifth lens 2451. The following conditions are satisfied: SGI514=0 mm; |SGI514|/(|SGI514|+TP5)=0; SGI524=0 mm; |SGI524|/(|SGI524|+TP5)=0.

HIF511 denotes the distance perpendicular to the optical axis between the inflection point on the object side surface 24512 of the fifth lens 2451 which is the nearest to the optical axis and the optical axis. HIF521 denotes the distance perpendicular to the optical axis between the optical axis and an inflection point on the image side surface 24514 of the fifth lens 2451 which is the nearest to the optical axis. The following conditions are satisfied: HIF511=0.28212 mm; HIF511/HOI=0.05642; HIF521=2.13850 mm; HIF521/HOI=0.42770.

HIF512 denotes the distance perpendicular to the optical axis between the inflection point on the object side surface 24512 of the fifth lens 2451 which is the second nearest to the optical axis and the optical axis. HIF522 denotes the distance perpendicular to the optical axis between the optical axis and an inflection point on the image side surface 24514 of the fifth lens 2451 which is the second nearest to the optical axis. The following conditions are satisfied: HIF512=2.51384 mm; HIF512/HOI=0.50277.

HIF513 denotes the distance perpendicular to the optical axis between the inflection point on the object side surface 24512 of the fifth lens 2451 which is the third nearest to the optical axis and the optical axis. HIF523 denotes the distance perpendicular to the optical axis between the optical axis and an inflection point on the image side surface 24514 of the fifth lens 2451 which is the third nearest to the optical axis. The following conditions are satisfied: HHIF513=0 mm; HIF513/HOI=0; HIF523=0 mm; HIF523/HOI=0.

HIF514 denotes the distance perpendicular to the optical axis between the inflection point on the object side surface 24512 of the fifth lens 2451 which is the fourth nearest to the optical axis and the optical axis. HIF524 denotes the distance perpendicular to the optical axis between the optical axis and an inflection point on the image side surface 24514 of the fifth lens 2451 which is the fourth nearest to the optical axis. The following conditions are satisfied: HIF514=0 mm; HIF514/HOI=0; HIF524=0 mm; HIF524/HOI=0.

The sixth lens 2461 has negative refractive power and is made of a plastic material. The object side surface 24612 thereof is a concave surface and the image side surface 24614 thereof is a concave surface. The object side surface 24612 has two inflection points and the image side surface 24614 thereof has an inflection point. Therefore, it may be effective to adjust the angle at which each field of view is incident on the sixth lens 2461 to improve the aberration. ARS61 denotes the arc length of the maximum effective half diameter of the object side surface 24612 of the sixth lens 2461. ARS62 denotes the arc length of the maximum effective half diameter of the image side surface 24614 of the sixth lens 2461. ARE61 denotes the arc length of half the entrance pupil diameter (HEP) of the object side surface 24612 of the sixth lens 2461. ARE62 denotes the arc length of half the entrance pupil diameter (HEP) of the image side surface 24614 of the sixth lens 2461. TP6 is the thickness of the sixth lens 2461 on the optical axis.

SGI611 denotes the distance parallel to the optical axis from the inflection point on the object side surface 24612 of the sixth lens 2461 which is the nearest to the optical axis to an axial point on the object side surface 24612 of the sixth lens 2461. SGI621 denotes the distance parallel to an optical axis from an inflection point on the image side surface 24614 of the sixth lens 2461 which is the nearest to the optical axis to an axial point on the image side surface 24614 of the sixth lens 2461. The following conditions are satisfied: SGI611=−0.38558 mm; |SGI611|/(|SGI611|+TP6)=0.27212; SGI621=0.12386 mm; |SGI621|/(|SGI621|+TP6)=0.10722.

SGI612 denotes the distance parallel to the optical axis from the inflection point on the object side surface 24612 of the sixth lens 2461 which is the second nearest to the optical axis to an axial point on the object side surface 24612 of the sixth lens 2461. SGI621 denotes the distance parallel to an optical axis from an inflection point on the image side surface 24614 of the sixth lens 2461 which is the second nearest to the optical axis to an axial point on the image side surface 24614 of the sixth lens 2461. The following conditions are satisfied: SGI612=−0.47400 mm; |SGI612|/(|SGI612|+TP6)=0.31488; SGI622=0 mm; |SGI622|/(|SGI622|+TP6)=0.

HIF611 denotes the distance perpendicular to the optical axis between the inflection point on the object side surface 24612 of the sixth lens 2461 which is the nearest to the optical axis and the optical axis. HIF621 denotes the distance perpendicular to the optical axis between the inflection point on the image side surface 24614 of the sixth lens 2461 which is the nearest to the optical axis and the optical axis. The following conditions are satisfied: HIF611=2.24283 mm; IF611/HOI=0.44857; HIF621=1.07376 mm; HIF621/HOI=0.21475.

HIF612 denotes the distance perpendicular to the optical axis between the inflection point on the object side surface 24612 of the sixth lens 2461 which is the second nearest to the optical axis and the optical axis. HIF622 denotes the distance perpendicular to the optical axis between the inflection point on the image side surface 24614 of the sixth lens 2461 which is the second nearest to the optical axis and the optical axis. The following conditions are satisfied: HIF611=2.24283 mm; HIF612=2.48895 mm; HIF612/HOI=0.49779.

HIF613 denotes the distance perpendicular to the optical axis between the inflection point on the object side surface 24612 of the sixth lens 2461 which is the third nearest to the optical axis and the optical axis. HIF623 denotes the distance perpendicular to the optical axis between the inflection point on the image side surface 24614 of the sixth lens 2461 which is the third nearest to the optical axis and the optical axis. The following conditions are satisfied: HIF613=0 mm; HIF613/HOI=0; HIF623=0 mm; HIF623/HOI=0.

HIF614 denotes the distance perpendicular to the optical axis between the inflection point on the object side surface 24612 of the sixth lens 2461 which is the fourth nearest to the optical axis and the optical axis. HIF624 denotes the distance perpendicular to the optical axis between the inflection point on the image side surface 24614 of the sixth lens 2461 which is the fourth nearest to the optical axis and the optical axis. The following conditions are satisfied: HIF614=0 mm; HIF614/HOI=0; HIF624=0 mm; HIF624/HOI=0.

The IR-cut filter 300 is made of glass and is disposed between the sixth lens 2461 and the image plane 600, which does not affect the focal length of the optical image capturing module.

In the optical image capturing module of the embodiment, f is the focal length of the auto-focus lens assembly 240. HEP is the entrance pupil diameter of the auto-focus lens assembly 240. HAF is half of the maximum view angle of the auto-focus lens assembly 240. The detailed parameters are shown as below: f=4.075 mm, f/HEP=1.4, HAF=50.001°, and tan(HAF)=1.1918.

In the optical image capturing module of the embodiment, f1 is the focal length of the first lens 2411. f6 is the focal length of the sixth lens 2461. The following conditions are satisfied: f1=−7.828 mm; |f/f1|=0.52060; f6=−4.886; and |f1|>|f6|.

In the optical image capturing module of the embodiment, the focal lengths of the second lens 2421 to the fifth lens 2451 are f2, f3, f4, and f5, respectively. The following conditions are satisfied: |f2|+|f3|+|f4|+|f5|=95.50815 mm; |f1|+|f6|=12.71352 mm and |f2|+|f3|+|f4|+|f5|>|f1|+|f6|.

PPR is the ratio of the focal length f of the optical image capturing module to a focal length fp of each of lenses with positive refractive power. NPR is the ratio of the focal length f of the optical image capturing module to a focal length fn of each of lenses with negative refractive power. In the optical image capturing module of the embodiment, The sum of the PPR of all lenses with positive refractive power is ΣPPR=f/f2+f/f4+f/f5=1.63290. The sum of the NPR of all lenses with negative refractive power is ΣNPR=|f/f1|+|f/f3|+|f/f6|=1.51305, and ΣPPR/|ΣNPR|=1.07921. The following conditions are also satisfied: |f/f2|=0.69101; |f/f3|=0.15834; |f/f4|=0.06883; |f/f5|=0.87305; |f/f6|=0.83412.

In the optical image capturing module of the embodiment, InTL is the distance on the optical axis from an object side surface 24112 of the first lens 2411 to an image side surface 24614 of the sixth lens 2461. HOS is the distance on the optical axis from an object side surface 24112 of the first lens 2411 to the image plane 600. InS is the distance from the aperture 250 to the image plane 180. HOI is defined as half the diagonal of the sensing field of the image sensor elements 140. BFL is the distance from the image side surface 24614 of the sixth lens and the image plane 600. The following conditions are satisfied: InTL+BFL=HOS; HOS=19.54120 mm; HOI=5.0 mm; HOS/HOI=3.90824; HOS/f=4.7952; InS=11.685 mm; and InS/HOS=0.59794.

In the optical image capturing module of the embodiment, ΣTP is the sum of the thicknesses of all the lenses with refractive power on the optical axis. The following condition is satisfied: ΣTP=8.13899 mm and ΣTP/InTL=0.52477, and InTL/HOS=0.9171. Therefore, the contrast ratio of system imaging and the yield rate of lens manufacturing may be attended simultaneously. Moreover, an appropriate back focal length is provided to accommodate other elements.

In the optical image capturing module of the embodiment, R1 is the curvature radius of the object side surface 24112 of the sixth lens 2411. R2 is the curvature radius of the image side surface 24114 of the sixth lens 2411. The following condition is satisfied: |R1/R2|=8.99987. Therefore, the first lens 2411 is equipped with appropriate intensity of positive refractive power to prevent the spherical aberration from increasing too fast.

In the optical image capturing module of the embodiment, R11 is the curvature radius of the object side surface 24612 of the sixth lens 2461. R12 is the curvature radius of the image side surface 24614 of the sixth lens 2461. This following condition is satisfied: (R11−R12)/(R11+R12)=1.27780. Therefore, it is advantageous to correct the astigmatism generated by the optical image capturing module.

In the optical image capturing module of the embodiment, ΣPP is the sum of the focal lengths of all lenses with positive refractive power. The following conditions are satisfied: ΣPP=f2+f4+f5=69.770 mm and f5/(f2+f4+f5)=0.067. Therefore, it is beneficial to properly distribute the positive refractive power of a single lens to other positive lenses to suppress the generation of significant aberrations during the traveling of incident light.

In the optical image capturing module of the embodiment, ΣNP is the sum of the focal lengths of all lenses with negative refractive power. The following conditions are satisfied: ΣNP=f1+f3+f6=−38.451 mm and f6/(f1+f3+f6)=0.127. Therefore, it is beneficial to properly distribute the negative refractive power of the sixth lens 2461 to other negative lenses to suppress the generation of significant aberrations during the traveling of incident light.

In the optical image capturing module of the embodiment, IN12 is the distance between the first lens 2411 and the second lens 2421 on the optical axis. The following condition is satisfied: IN12=6.418 mm; IN12/f=1.57491. Therefore, it is beneficial to improve the chromatic aberration of the lenses so as to enhance the performance.

In the optical image capturing module of the embodiment, IN56 is the distance between the fifth lens 2451 and the sixth lens 2461 on the optical axis. The following condition is satisfied: IN56=0.025 mm; IN56/f=0.00613. Therefore, it is beneficial to improve the chromatic aberration of the lenses so as to enhance the performance.

In the optical image capturing module of the embodiment, TP1 and TP2 are respectively the thicknesses of the first lens 2411 and the second lens 2421 on the optical axis. The following condition is satisfied: TP1=1.934 mm; TP2=2.486 mm; and (TP1+IN12)/TP2=3.36005. Therefore, it is beneficial to control the sensitivity produced by the optical image capturing module so as to enhance the performance.

In the optical image capturing module of the embodiment, TP5 and TP6 are respectively the thicknesses of the fifth lens 2451 and the sixth lens 2461 on the optical axis. IN56 is the distance between the two lenses on the optical axis. The following conditions are satisfied: TP5=1.072 mm;

TP6=1.031 mm; (TP6+IN56)/TP5=0.98555. Therefore, it is beneficial to control the sensitivity produced by the optical image capturing module so as to enhance the performance.

In the optical image capturing module of the embodiment, IN34 is the distance between the third lens 2431 and the fourth lens 2441 on the optical axis. The following conditions are satisfied: IN34=0.401 mm; IN45=0.025 mm; and TP4/(IN34+TP4+IN45)=0.74376. Therefore, it is beneficial to slightly correct the aberration generated by the incident light advancing in the process layer upon layer so as to decrease the overall height of the system.

In the optical image capturing module of the embodiment, InRS51 is the horizontal distance parallel to an optical axis from a maximum effective half diameter position to an axial point on the object side surface 24512 of the fifth lens 2451. InRS62 is the horizontal distance parallel to an optical axis from a maximum effective half diameter position to an axial point on the image side surface 24514 of the fifth lens 2451. TP5 is the thickness of the fifth lens 2451 on the optical axis. The following condition is satisfied: InRS51=−0.34789 mm; InRS52=−0.88185 mm; |InRS51|/TP5=0.32458 and |InRS52|/TP5=0.82276. Therefore, it is advantageous for the lens to be manufactured and formed so as to maintain minimization.

In the optical image capturing module of the embodiment, HVT51 is the distance perpendicular to the optical axis between a critical point on an object side surface 24512 of the fifth lens 2451 and the optical axis. HVT52 is the distance perpendicular to the optical axis between a critical point on an image side surface 24514 of the fifth lens 2451 and the optical axis. The following conditions are satisfied: HVT51=0.515349 mm; HVT52=0 mm.

In the optical image capturing module of the embodiment, InRS61 is the horizontal distance parallel to an optical axis from a maximum effective half diameter position to an axial point on the object side surface 24612 of the sixth lens 2461. InRS62 is the horizontal distance parallel to an optical axis from a maximum effective half diameter position to an axial point on the image side surface 24614 of the sixth lens 2461. TP6 is the thickness of the sixth lens 2461 on the optical axis. The following conditions are satisfied: InRS61=−0.58390 mm; InRS62=0.41976 mm; |InRS61|/TP6=0.56616 and |InRS62|/TP6=0.40700. Therefore, it is advantageous for the lens to be manufactured and formed so as to maintain minimization.

In the optical image capturing module of the embodiment, HVT61 is the distance perpendicular to the optical axis between a critical point on an object side surface 24612 of the sixth lens 2461 and the optical axis. HVT62 is the distance perpendicular to the optical axis between a critical point on an image side surface 24614 of the sixth lens 2461 and the optical axis. The following conditions are satisfied: HVT61=0 mm; HVT62=0 mm.

In the optical image capturing module of the embodiment, the following conditions are satisfied: HVT51/HOI=0.1031. Therefore, it is beneficial to correct the aberration of surrounding view field for the optical image capturing module.

In the optical image capturing module of the embodiment, the following conditions are satisfied: HVT51/HOS=0.02634. Therefore, it is beneficial to correct the aberration of surrounding view field for the optical image capturing module.

In the optical image capturing module of the embodiment, the second lens 2421, the third lens 2431, and the sixth lens 2461 have negative refractive power. A dispersion coefficient of the second lens is NA2. A dispersion coefficient of the third lens is NA3. A dispersion coefficient of the sixth lens is NA6. The following condition is satisfied: NA6/NA2≤1. Therefore, it is beneficial to correct the aberration of the optical image capturing module.

In the optical image capturing module of the embodiment, TDT refers to TV distortion when an image is formed. ODT refers to optical distortion when an image is formed. The following conditions are satisfied: TDT=2.124%; ODT=5.076%.

In the optical image capturing module of the embodiment, LS is 12 mm. PhiA is 2*EHD62=6.726 mm (EHD62: the maximum effective half diameter of the image side 24614 of the sixth lens 2461). PhiC=PhiA+2*TH2=7.026 mm; PhiD=PhiC+2*(TH1+TH2)=7.426 mm; TH1 is 0.2 mm; TH2 is 0.15 mm; PhiA/PhiD is 0.9057; TH1+TH2 is 0.35 mm; (TH1+TH2)/HOI is 0.035; (TH1+TH2)/HOS is 0.0179; 2*(TH1+TH2)/PhiA is 0.1041; (TH1+TH2)/LS is 0.0292.

Please refer to Table 1 and Table 2 in the following.

TABLE 1

Data of the optical image capturing module of the first optical embodiment
f = 4.075 mm; f/HEP = 1.4; HAF = 50.000 deg

| Surface | | Curvature Radius | Thickness (mm) | Material |
|---|---|---|---|---|
| 0 | Object | Plano | Plano | |
| 1 | Lens 1 | −40.99625704 | 1.934 | Plastic |
| 2 | | 4.555209289 | 5.923 | |
| 3 | Aperture | Plano | 0.495 | |
| 4 | Lens 2 | 5.333427366 | 2.486 | Plastic |
| 5 | | −6.781659971 | 0.502 | |
| 6 | Lens 3 | −5.697794287 | 0.380 | Plastic |
| 7 | | −8.883957518 | 0.401 | |
| 8 | Lens 4 | 13.19225664 | 1.236 | Plastic |
| 9 | | 21.55681832 | 0.025 | |
| 10 | Lens 5 | 8.987806345 | 1.072 | Plastic |
| 11 | | −3.158875374 | 0.025 | |
| 12 | Lens 6 | −29.46491425 | 1.031 | Plastic |
| 13 | | 3.593484273 | 2.412 | |
| 14 | IR-cut filter | Plano | 0.200 | |
| 15 | | Plano | 1.420 | |
| 16 | Image plane | Plano | | |

| Surface | Refractive index | Dispersion coefficient | Focal length |
|---|---|---|---|
| 0 | | | |
| 1 | 1.515 | 56.55 | −7.828 |
| 2 | | | |
| 3 | | | |
| 4 | 1.544 | 55.96 | 5.897 |
| 5 | | | |
| 6 | 1.642 | 22.46 | −25.738 |
| 7 | | | |
| 8 | 1.544 | 55.96 | 59.205 |
| 9 | | | |
| 10 | 1.515 | 56.55 | 4.668 |
| 11 | | | |
| 12 | 1.642 | 22.46 | −4.886 |
| 13 | | | |
| 14 | 1.517 | 64.13 | |
| 15 | | | |
| 16 | | | |

Reference wavelength = 555 nm; Shield position: The clear aperture of the first surface is 5.800 mm. The clear aperture of the third surface is 1.570 mm.
The clear aperture of the fifth surface is 1.950 mm.

TABLE 2

The aspheric surface parameters of the first optical embodiment
Table 2. Aspheric Coefficients

| Surface | 1 | 2 | 4 | 5 |
|---|---|---|---|---|
| k   | 4.310876E+01  | −4.707622E+00 | 2.616025E+00  | 2.445397E+00  |
| A4  | 7.054243E−03  | 1.714312E−02  | −8.377541E−03 | −1.789549E−02 |
| A6  | −5.233264E−04 | −1.502232E−04 | −1.838068E−03 | −3.657520E−03 |
| A8  | 3.077890E−05  | −1.359611E−04 | 1.233332E−03  | −1.131622E−03 |
| A10 | −1.260650E−06 | 2.680747E−05  | −2.390895E−03 | 1.390351E−03  |
| A12 | 3.319093E−08  | −2.017491E−06 | 1.998555E−03  | −4.152857E−04 |
| A14 | −5.051600E−10 | 6.604615E−08  | −9.734019E−04 | 5.487286E−05  |
| A16 | 3.380000E−12  | −1.301630E−09 | 2.478373E−04  | −2.919339E−06 |

| Surface | 6 | 7 | 8 | 9 |
|---|---|---|---|---|
| k   | 5.645686E+00  | −2.117147E+01 | −5.287220E+00 | 6.200000E+01  |
| A4  | −3.379055E−03 | −1.370959E−02 | −2.937377E−02 | −1.359965E−01 |
| A6  | −1.225453E−03 | 6.250200E−03  | 2.743532E−03  | 6.628518E−02  |
| A8  | −5.979572E−03 | −5.854426E−03 | −2.457574E−03 | −2.129167E−02 |
| A10 | 4.556449E−03  | 4.049451E−03  | 1.874319E−03  | 4.396344E−03  |
| A12 | −1.177175E−03 | −1.314592E−03 | −6.013661E−04 | −5.542899E−04 |
| A14 | 1.370522E−04  | 2.143097E−04  | 8.792480E−05  | 3.768879E−05  |
| A16 | −5.974015E−06 | −1.399894E−05 | −4.770527E−06 | −1.052467E−06 |

| Surface | 10 | 11 | 12 | 13 |
|---|---|---|---|---|
| k   | −2.114008E+01 | −7.699904E+00 | −6.155476E+01 | −3.120467E−01 |
| A4  | −1.263831E−01 | −1.927804E−02 | −2.492467E−02 | −3.521844E−02 |
| A6  | 6.965399E−02  | 2.478376E−03  | −1.835360E−03 | 5.629654E−03  |
| A8  | −2.116027E−02 | 1.438785E−03  | 3.201343E−03  | −5.466925E−04 |
| A10 | 3.819371E−03  | −7.013749E−04 | −8.990757E−04 | 2.231154E−05  |
| A12 | −4.040283E−04 | 1.253214E−04  | 1.245343E−04  | 5.548990E−07  |
| A14 | 2.280473E−05  | −9.943196E−06 | −8.788363E−06 | −9.396920E−08 |
| A16 | −5.165452E−07 | 2.898397E−07  | 2.494302E−07  | 2.728360E−09  |

The values related to arc lengths may be obtained according to Table 1 and Table 2.

First optical embodiment (Reference wavelength = 555 nm)

| ARE | 1/2(HEP) | ARE value | ARE-1/2(HEP) | 2(ARE/HEP) % | TP | ARE/TP (%) |
|---|---|---|---|---|---|---|
| 11 | 1.455 | 1.455 | −0.00033 | 99.98%  | 1.934 | 75.23%  |
| 12 | 1.455 | 1.495 | 0.03957  | 102.72% | 1.934 | 77.29%  |
| 21 | 1.455 | 1.465 | 0.00940  | 100.65% | 2.486 | 58.93%  |
| 22 | 1.455 | 1.495 | 0.03950  | 102.71% | 2.486 | 60.14%  |
| 31 | 1.455 | 1.486 | 0.03045  | 102.09% | 0.380 | 391.02% |
| 32 | 1.455 | 1.464 | 0.00830  | 100.57% | 0.380 | 385.19% |
| 41 | 1.455 | 1.458 | 0.00237  | 100.16% | 1.236 | 117.95% |
| 42 | 1.455 | 1.484 | 0.02825  | 101.94% | 1.236 | 120.04% |
| 51 | 1.455 | 1.462 | 0.00672  | 100.46% | 1.072 | 136.42% |
| 52 | 1.455 | 1.499 | 0.04335  | 102.98% | 1.072 | 139.83% |
| 61 | 1.455 | 1.465 | 0.00964  | 100.66% | 1.031 | 142.06% |
| 62 | 1.455 | 1.469 | 0.01374  | 100.94% | 1.031 | 142.45% |

| ARS | EHD | ARS value | ARS-EHD | (ARS/EHD)% | TP | ARS/TP (%) |
|---|---|---|---|---|---|---|
| 11 | 5.800 | 6.141 | 0.341 | 105.88% | 1.934 | 317.51% |
| 12 | 3.299 | 4.423 | 1.125 | 134.10% | 1.934 | 228.70% |
| 21 | 1.664 | 1.674 | 0.010 | 100.61% | 2.486 | 67.35%  |
| 22 | 1.950 | 2.119 | 0.169 | 108.65% | 2.486 | 85.23%  |
| 31 | 1.980 | 2.048 | 0.069 | 103.47% | 0.380 | 539.05% |
| 32 | 2.084 | 2.101 | 0.017 | 100.83% | 0.380 | 552.87% |
| 41 | 2.247 | 2.287 | 0.040 | 101.80% | 1.236 | 185.05% |
| 42 | 2.530 | 2.813 | 0.284 | 111.22% | 1.236 | 227.63% |
| 51 | 2.655 | 2.690 | 0.035 | 101.32% | 1.072 | 250.99% |
| 52 | 2.764 | 2.930 | 0.166 | 106.00% | 1.072 | 273.40% |
| 61 | 2.816 | 2.905 | 0.089 | 103.16% | 1.031 | 281.64% |
| 62 | 3.363 | 3.391 | 0.029 | 100.86% | 1.031 | 328.83% |

Table 1 is the detailed structure data to the first optical embodiment, wherein the unit of the curvature radius, the thickness, the distance, and the focal length is millimeters (mm). Surfaces 0-16 illustrate the surfaces from the object side to the image side. Table 2 is the aspheric coefficients of the first optical embodiment, wherein k is the conic coefficient in the aspheric surface formula. A1-A20 are aspheric surface coefficients from the first to the twentieth orders for each surface. In addition, the tables for each of the embodiments as follows correspond to the schematic views and the aberration graphs for each of the embodiments. The definitions of data in the tables are the same as those in Table 1 and Table 2 for the first optical embodiment. Therefore, similar description shall not be illustrated again. Furthermore, the definitions of element parameters in each of the embodiments are the same as those in the first optical embodiment.

The Second Optical Embodiment

Figure 19:
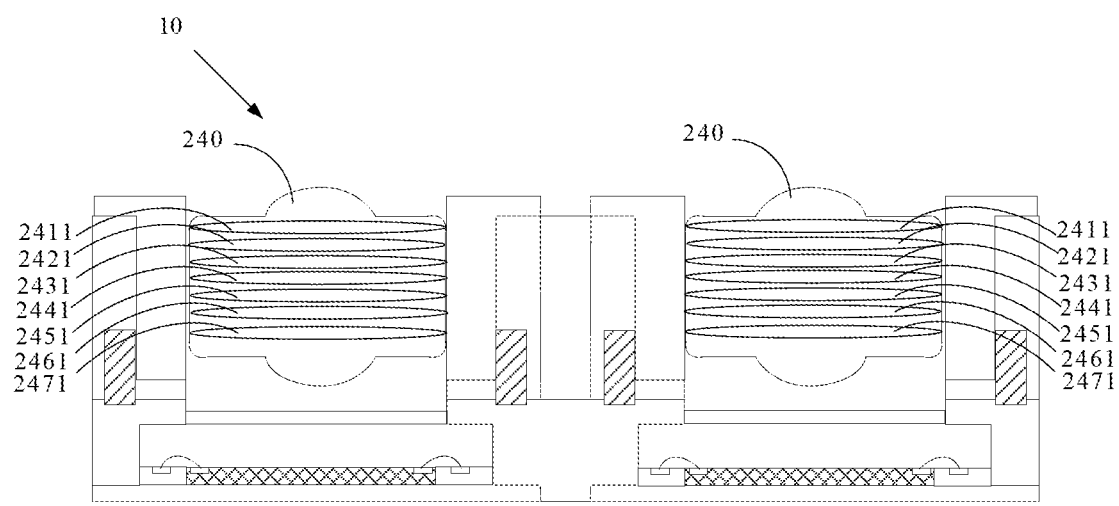
FIG. 19 is a schematic view of an optical image capturing module according to a sixteenth embodiment in the present invention.

As shown in FIG. 19, the auto-focus lens assembly 240 may include seven lenses 2401 with refractive power, the auto-focus lens assembly 240 includes a first lens 2411, a second lens 2421, a third lens 2431, a four lens 2441, a fifth lens 2451, a sixth lens 2461, and a seventh lens 2471 sequentially displayed from an object side surface to an image side surface. Each auto-focus lens 240 assemblies satisfies the following condition: 0.1≤InTL/HOS≤0.95; specifically, HOS is the distance from an object side surface of the first lens to the imaging surface on an optical axis; InTL is the distance from an object side surface of the first lens to an image side surface of the seventh lens on an optical axis.

Figure 22:
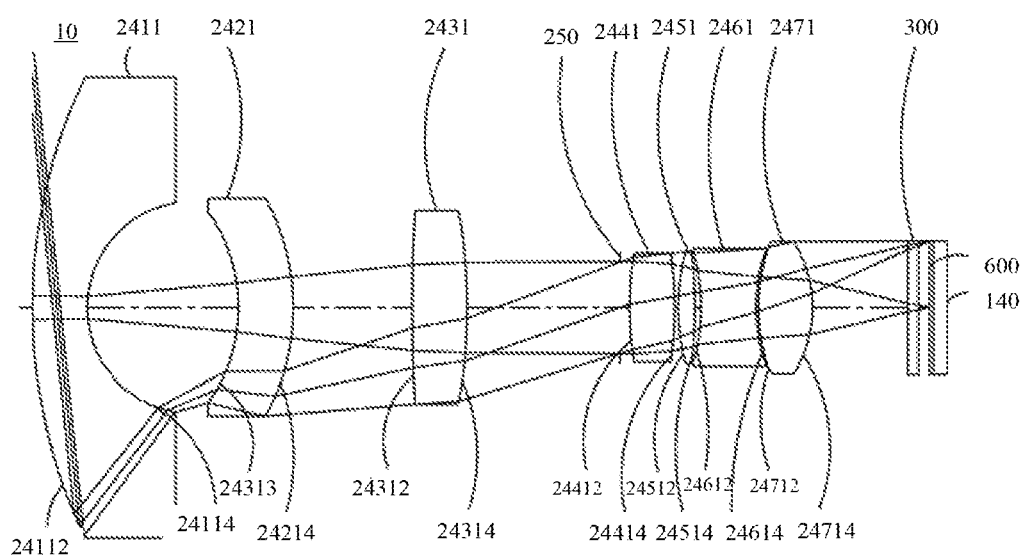
FIG. 22 is a schematic view of an optical image capturing module according to a second optical embodiment in the present invention.
Figure 23:
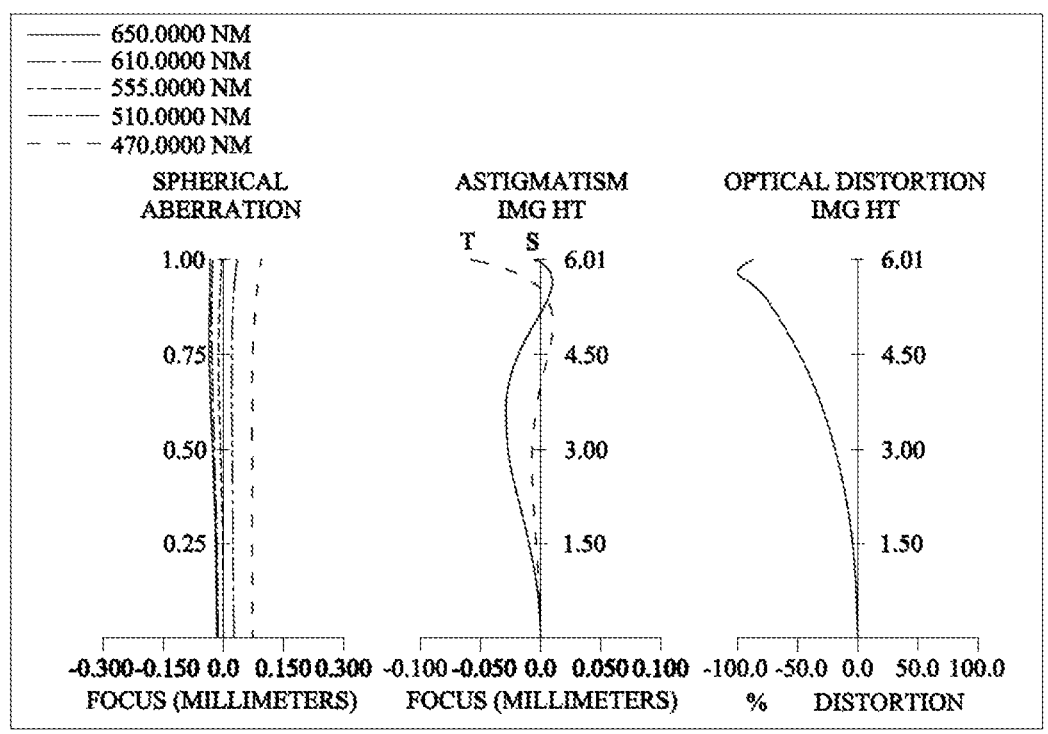
FIG. 23 is curve diagrams of spherical aberration, astigmatism, and optical distortion of the second optical embodiment illustrated sequentially from the left to the right according to the embodiment in the present invention.

Please refer to FIG. 22 and FIG. 23. FIG. 22 is a schematic diagram of the optical image capturing module according to the second optical embodiment of the present invention. FIG. 23 is a curve diagram of spherical aberration, astigmatism, and optical distortion of the optical image capturing module sequentially displayed from left to right according to the second optical embodiment of the present invention. As shown in FIG. 22, the optical image capturing module includes a first lens 2411, a second lens 2421, a third lens 2431, an aperture 250, a four lens 2441, a fifth lens 2451, a sixth lens 2461, a seventh lens 2471, an IR-cut filter 300, an image plane 600, and image sensor elements 140 sequentially displayed from an object side surface to an image side surface.

The first lens 2411 has negative refractive power and is made of a plastic material. The object side surface 24112 thereof is a convex surface and the image side surface 24114 thereof is a concave surface, both of which are aspheric. Each of the object side surface 24112 and image side surface 24114 thereof has an inflection point.

The second lens 2421 has negative refractive power and is made of a plastic material. The object side surface thereof 24212 is a convex surface and the image side surface thereof 24214 is a concave surface, both of which are aspheric. Each of the object side surface 24212 and image side surface 24214 thereof has an inflection point.

The third lens 2431 has positive refractive power and is made of a plastic material. The object side surface 24312 thereof is a convex surface and the image side surface 24314 thereof is a concave surface, both of which are aspheric. The object side surface 24312 has an inflection point.

The fourth lens 2441 has positive refractive power and is made of a plastic material. The object side surface 24412 thereof is a concave surface and the image side surface 24414 thereof is a convex surface, both of which are aspheric. The object side surface 24412 has an inflection point, and the image side surface 24414 thereof has two inflection points.

The fifth lens 2451 has positive refractive power and is made of a plastic material. The object side surface 24512 thereof is a convex surface and the image side surface 24514 thereof is a concave surface, both of which are aspheric. Each of the object side surface 24512 and image side surface 24514 thereof has an inflection point.

The sixth lens 2461 has negative refractive power and is made of a plastic material. The object side surface 24612 thereof is a concave surface and the image side surface 24614 thereof is a convex surface, both of which are aspheric. Each of the object side surface 24612 and image side surface 24614 thereof has two inflection points. Therefore, it may be effective to adjust the angle at which each field of view is incident on the sixth lens 2461 to improve the aberration.

The seventh lens 2471 has negative refractive power and is made of a plastic material. The object side surface 24712 thereof is a convex surface and the image side surface 24714 thereof is a concave surface. Therefore, it is advantageous for the lens to reduce the back focal length to maintain minimization. In addition, each of the object side surface 24712 and image side surface 24714 thereof has an inflection point, so it is effective to suppress the incident angle with incoming light from an off-axis view field and further correct the aberration in the off-axis view field.

The IR-cut filter 300 is made of glass and is disposed between the seventh lens 2471 and the image plane 600, which does not affect the focal length of the optical image capturing module.

Please refer to the following Table 3 and Table 4.

TABLE 3

Data of the optical image capturing
module of the second optical embodiment
f = 4.7601 mm; f/HEP = 2.2; HAF = 95.98 deg

| Surface | | Curvature Radius | Thickness(mm) | Material |
|---|---|---|---|---|
| 0 | Object | 1E+18 | 1E+18 | |
| 1 | Lens 1 | 47.71478323 | 4.977 | Glass |
| 2 | | 9.527614761 | 13.737 | |
| 3 | Lens 2 | −14.88061107 | 5.000 | Glass |
| 4 | | −20.42046946 | 10.837 | |
| 5 | Lens 3 | 182.4762997 | 5.000 | Glass |
| 6 | | −46.71963608 | 13.902 | |
| 7 | Aperture | 1E+18 | 0.850 | |
| 8 | Lens 4 | 28.60018103 | 4.095 | Glass |
| 9 | | −35.08507586 | 0.323 | |
| 10 | Lens 5 | 18.25991342 | 1.539 | Glass |
| 11 | | −36.99028878 | 0.546 | |
| 12 | Lens 6 | −18.24574524 | 5.000 | Glass |
| 13 | | 15.33897192 | 0.215 | |
| 14 | Lens 7 | 16.13218937 | 4.933 | Glass |
| 15 | | −11.24007 | 8.664 | |
| 16 | IR-cut filter | 1E+18 | 1.000 | BK_7 |
| 17 | | 1E+18 | 1.007 | |
| 18 | Image plane | 1E+18 | −0.007 | |

| Surface | Refractive index | Dispersion coefficient | Focal length |
|---|---|---|---|
| 0 | | | |
| 1 | 2.001 | 29.13 | −12.647 |
| 2 | | | |
| 3 | 2.001 | 29.13 | −99.541 |
| 4 | | | |
| 5 | 1.847 | 23.78 | 44.046 |
| 6 | | | |
| 7 | | | |
| 8 | 1.834 | 37.35 | 19.369 |
| 9 | | | |
| 10 | 1.609 | 46.44 | 20.223 |
| 11 | | | |
| 12 | 2.002 | 19.32 | −7.668 |
| 13 | | | |
| 14 | 1.517 | 64.20 | 13.620 |
| 15 | | | |
| 16 | 1.517 | 64.2 | |
| 17 | | | |
| 18 | | | |

Reference wavelength (d-line) = 555 nm
Reference Wavelength = 555 nm

TABLE 4

The aspheric surface parameters of the second optical embodiment
Table 4. Aspheric Coefficients

| Surface | 1 | 2 | 3 | 4 |
|---|---|---|---|---|
| k | 0.000000E+00 | 0.000000E+00 | 0.000000E+00 | 0.000000E+00 |
| A4 | 0.000000E+00 | 0.000000E+00 | 0.000000E+00 | 0.000000E+00 |
| A6 | 0.000000E+00 | 0.000000E+00 | 0.000000E+00 | 0.000000E+00 |
| A8 | 0.000000E+00 | 0.000000E+00 | 0.000000E+00 | 0.000000E+00 |

TABLE 4-continued

The aspheric surface parameters of the second optical embodiment
Table 4. Aspheric Coefficients

| | | | | |
|---|---|---|---|---|
| A10 | 0.000000E+00 | 0.000000E+00 | 0.000000E+00 | 0.000000E+00 |
| A12 | 0.000000E+00 | 0.000000E+00 | 0.000000E+00 | 0.000000E+00 |

| Surface | 5 | 6 | 8 | 9 |
|---|---|---|---|---|
| k  | 0.000000E+00 | 0.000000E+00 | 0.000000E+00 | 0.000000E+00 |
| A4 | 0.000000E+00 | 0.000000E+00 | 0.000000E+00 | 0.000000E+00 |
| A6 | 0.000000E+00 | 0.000000E+00 | 0.000000E+00 | 0.000000E+00 |
| A8 | 0.000000E+00 | 0.000000E+00 | 0.000000E+00 | 0.000000E+00 |
| A10 | 0.000000E+00 | 0.000000E+00 | 0.000000E+00 | 0.000000E+00 |
| A12 | 0.000000E+00 | 0.000000E+00 | 0.000000E+00 | 0.000000E+00 |

| Surface | 10 | 11 | 12 | 13 |
|---|---|---|---|---|
| k  | 0.000000E+00 | 0.000000E+00 | 0.000000E+00 | 0.000000E+00 |
| A4 | 0.000000E+00 | 0.000000E+00 | 0.000000E+00 | 0.000000E+00 |
| A6 | 0.000000E+00 | 0.000000E+00 | 0.000000E+00 | 0.000000E+00 |
| A8 | 0.000000E+00 | 0.000000E+00 | 0.000000E+00 | 0.000000E+00 |
| A10 | 0.000000E+00 | 0.000000E+00 | 0.000000E+00 | 0.000000E+00 |
| A12 | 0.000000E+00 | 0.000000E+00 | 0.000000E+00 | 0.000000E+00 |

| Surface | 14 | 15 |
|---|---|---|
| k  | 0.000000E+00 | 0.000000E+00 |
| A4 | 0.000000E+00 | 0.000000E+00 |
| A6 | 0.000000E+00 | 0.000000E+00 |
| A8 | 0.000000E+00 | 0.000000E+00 |
| A10 | 0.000000E+00 | 0.000000E+00 |
| A12 | 0.000000E+00 | 0.000000E+00 |

In the second optical embodiment, the aspheric surface formula is presented in the same way in the first optical embodiment. In addition, the definitions of parameters in following tables are the same as those in the first optical embodiment. Therefore, similar description shall not be illustrated again.

The values stated as follows may be deduced according to Table 3 and Table 4.

The values stated as follows may be deduced according to Table 3 and Table 4.

The second optical embodiment (Primary reference wavelength: 555 nm)

| ARE | 1/2(HEP) | ARE value | ARE−1/2(HEP) | 2(ARE/HEP) % | TP | ARE/TP (%) |
|---|---|---|---|---|---|---|
| 11 | 1.082 | 1.081 | −0.00075 | 99.93% | 4.977 | 21.72% |
| 12 | 1.082 | 1.083 | 0.00149 | 100.14% | 4.977 | 21.77% |

The second optical embodiment (Primary reference wavelength: 555 nm)

| \|f/f1\| | \|f/f2\| | \|f/f3\| | \|f/f4\| | \|f/f5\| | \|f/f6\| |
|---|---|---|---|---|---|
| 0.3764 | 0.0478 | 0.1081 | 0.2458 | 0.2354 | 0.6208 |
| \|f/f7\| | ΣPPR | ΣNPR | \|ΣPPR/ΣNPR\| | IN12/f | IN67/f |
| 0.3495 | 1.3510 | 0.6327 | 2.1352 | 2.8858 | 0.0451 |
| \|f1/f2\| | \|f2/f3\| | (TP1 + IN12)/TP2 | | (TP7 + IN67)/TP6 | |
| 0.1271 | 2.2599 | 3.7428 | | 1.0296 | |
| HOS | InTL | HOS/HOI | InS/HOS | ODT % | TDT % |
| 81.6178 | 70.9539 | 13.6030 | 0.3451 | −113.2790 | 84.4806 |
| HVT11 | HVT12 | HVT21 | HVT22 | HVT31 | HVT32 |
| 0.0000 | 0.0000 | 0.0000 | 0.0000 | 0.0000 | 0.0000 |
| HVT61 | HVT62 | HVT71 | HVT72 | HVT72/HOI | HVT72/HOS |
| 0.0000 | 0.0000 | 0.0000 | 0.0000 | 0.0000 | 0.0000 |
| PhiA | PhiC | PhiD | TH1 | TH2 | HOI |
| 11.962 mm | 12.362 mm | 12.862 mm | 0.25 mm | 0.2 mm | 6 mm |
| PhiA/PhiD | TH1 + TH2 | (TH1 + TH2)/HOI | (TH1 + TH2)/HOS | 2(TH1 + TH2)/PhiA | InTL/HOS |
| 0.9676 | 0.45 mm | 0.075 | 0.0055 | 0.0752 | 0.8693 |
| PSTA | PLTA | NSTA | NLTA | SSTA | SLTA |
| 0.060 mm | −0.005 mm | 0.016 mm | 0.006 mm | 0.020 mm | −0.008 mm |

-continued

The second optical embodiment (Primary reference wavelength: 555 nm)

| | | | | | | |
|---|---|---|---|---|---|---|
| 21 | 1.082 | 1.082 | 0.00011 | 100.01% | 5.000 | 21.64% |
| 22 | 1.082 | 1.082 | −0.00034 | 99.97% | 5.000 | 21.63% |
| 31 | 1.082 | 1.081 | −0.00084 | 99.92% | 5.000 | 21.62% |
| 32 | 1.082 | 1.081 | −0.00075 | 99.93% | 5.000 | 21.62% |
| 41 | 1.082 | 1.081 | −0.00059 | 99.95% | 4.095 | 26.41% |
| 42 | 1.082 | 1.081 | −0.00067 | 99.94% | 4.095 | 26.40% |
| 51 | 1.082 | 1.082 | −0.00021 | 99.98% | 1.539 | 70.28% |
| 52 | 1.082 | 1.081 | −0.00069 | 99.94% | 1.539 | 70.25% |
| 61 | 1.082 | 1.082 | −0.00021 | 99.98% | 5.000 | 21.63% |
| 62 | 1.082 | 1.082 | 0.00005 | 100.00% | 5.000 | 21.64% |
| 71 | 1.082 | 1.082 | −0.00003 | 100.00% | 4.933 | 21.93% |
| 72 | 1.082 | 1.083 | 0.00083 | 100.08% | 4.933 | 21.95% |

| ARS | EHD | ARS value | ARS-EHD | (ARS/EHD)% | TP | ARS/TP (%) |
|---|---|---|---|---|---|---|
| 11 | 20.767 | 21.486 | 0.719 | 103.46% | 4.977 | 431.68% |
| 12 | 9.412 | 13.474 | 4.062 | 143.16% | 4.977 | 270.71% |
| 21 | 8.636 | 9.212 | 0.577 | 106.68% | 5.000 | 184.25% |
| 22 | 9.838 | 10.264 | 0.426 | 104.33% | 5.000 | 205.27% |
| 31 | 8.770 | 8.772 | 0.003 | 100.03% | 5.000 | 175.45% |
| 32 | 8.511 | 8.558 | 0.047 | 100.55% | 5.000 | 171.16% |
| 41 | 4.600 | 4.619 | 0.019 | 100.42% | 4.095 | 112.80% |
| 42 | 4.965 | 4.981 | 0.016 | 100.32% | 4.095 | 121.64% |
| 51 | 5.075 | 5.143 | 0.067 | 101.33% | 1.539 | 334.15% |
| 52 | 5.047 | 5.062 | 0.015 | 100.30% | 1.539 | 328.89% |
| 61 | 5.011 | 5.075 | 0.064 | 101.28% | 5.000 | 101.50% |
| 62 | 5.373 | 5.489 | 0.116 | 102.16% | 5.000 | 109.79% |
| 71 | 5.513 | 5.625 | 0.112 | 102.04% | 4.933 | 114.03% |
| 72 | 5.981 | 6.307 | 0.326 | 105.44% | 4.933 | 127.84% |

The values stated as follows may be deduced according to Table 3 and Table 4.

Related inflection point values of second optical embodiment (Primary reference wavelength: 555 nm)

| HIF111 | 0 | HIF111/HOI | 0 | SGI111 | 0 | \| SGI111 \|/(\| SGI111 \| + TP1) | 0 |
|---|---|---|---|---|---|---|---|

The Third Optical Embodiment

As shown in FIG. 18, each auto-focus lens assembly 240 include six lenses 2401 with refractive power. The auto-focus lens assembly 240 includes a first lens 2411, a second lens 2421, a third lens 2431, a four lens 2441, a fifth lens 2451, and a sixth lens 2461 sequentially displayed from an object side surface to an image side surface. Each auto-focus lens assemblies satisfies the following condition: 0.1≤InTL/HOS≤0.95; specifically, HOS is the distance on the optical axis from an object side surface of the first lens to the image plane, and InTL is the distance on the optical axis from an object side surface of the first lens to an image side surface of the fifth lens.

Figure 24:
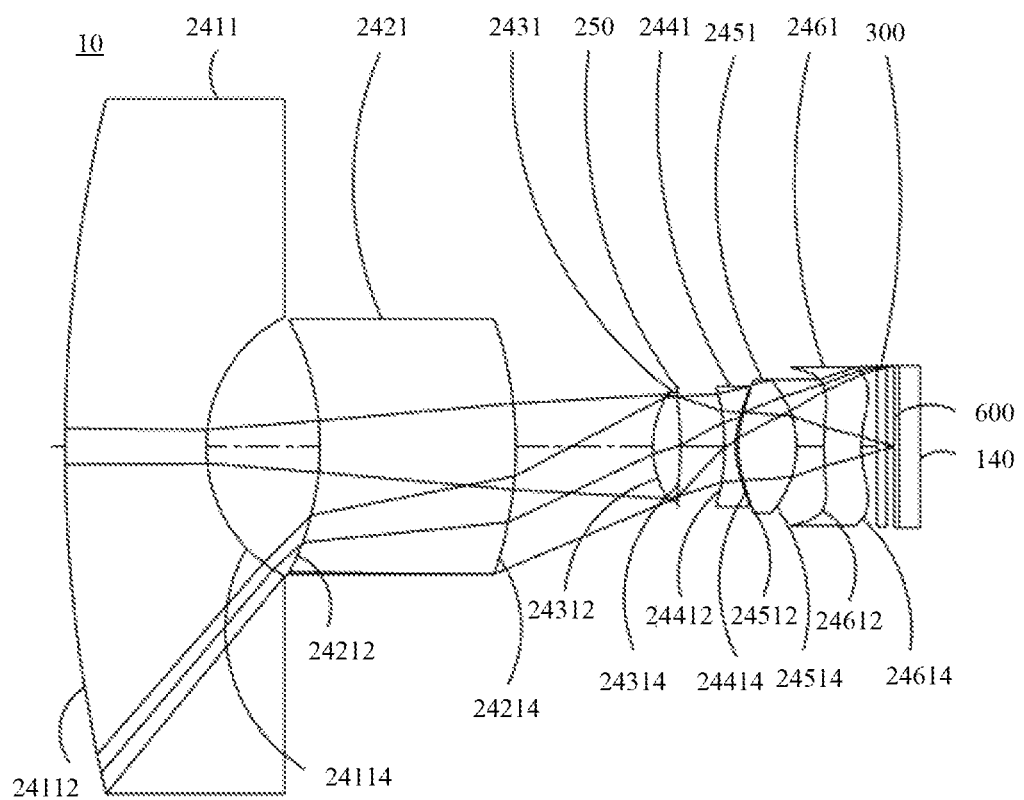
FIG. 24 is a schematic view of an optical image capturing module according to a third optical embodiment in the present invention.
Figure 25:
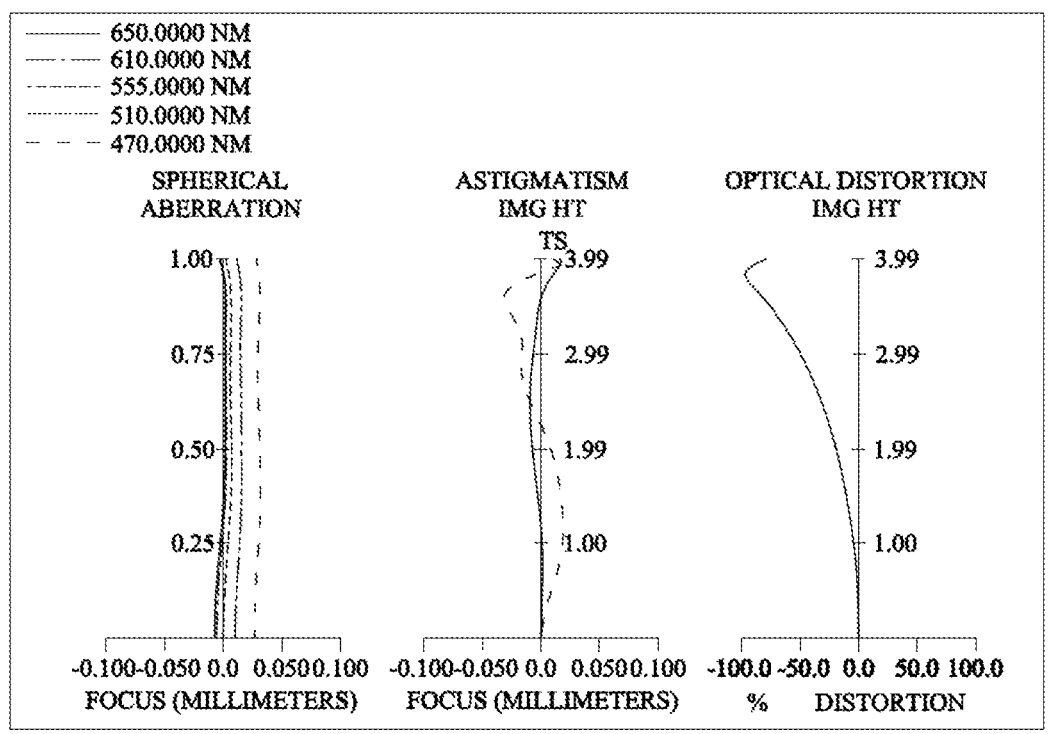
FIG. 25 is curve diagrams of spherical aberration, astigmatism, and optical distortion of the third optical embodiment illustrated sequentially from the left to the right according to the embodiment in the present invention.

Please refer to FIG. 24 and FIG. 25. FIG. 24 is a schematic diagram of the optical image capturing module according to the third optical embodiment of the present invention. FIG. 25 is a curve diagram of spherical aberration, astigmatism, and optical distortion of the optical image capturing module sequentially displayed from left to right according to the third optical embodiment of the present invention. As shown in FIG. 24, the optical image capturing module includes a first lens 2411, a second lens 2421, a third lens 2431, an aperture 250, a four lens 2441, a fifth lens 2451, a sixth lens 2461, an IR-cut filter 300, an image plane 600, and image sensor elements 140 sequentially displayed from an object side surface to an image side surface.

The first lens 2411 has negative refractive power and is made of a glass material. The object side surface 24112 thereof is a convex surface and the image side surface 24114 thereof is a concave surface, both of which are spherical.

The second lens 2421 has negative refractive power and is made of a glass material. The object side surface thereof 24212 is a concave surface and the image side surface thereof 24214 is a convex surface, both of which are spherical.

The third lens 2431 has positive refractive power and is made of a plastic material. The object side surface 24312 thereof is a convex surface and the image side surface 24314 thereof is a convex surface, both of which are aspheric. The object side surface 24312 thereof has an inflection point.

The fourth lens 2441 has negative refractive power and is made of a plastic material. The object side surface thereof 24412 is a concave surface and the image side surface thereof 24414 is a concave surface, both of which are aspheric. The image side surface 24414 thereof both have an inflection point.

The fifth lens 2451 has positive refractive power and is made of a plastic material. The object side surface 24512 thereof is a convex surface and the image side surface 24514 thereof is a convex surface, both of which are aspheric.

The sixth lens 2461 has negative refractive power and is made of a plastic material. The object side surface 24612 thereof is a convex surface and the image side surface 24614 thereof is a concave surface. The object side surface 24612 and the image side surface 24614 thereof both have an inflection point. Therefore, it is advantageous for the lens to reduce the back focal length to maintain minimization. In addition, it is effective to suppress the incident angle with incoming light from an off-axis view field and further correct the aberration in the off-axis view field.

The IR-cut filter 300 is made of glass and is disposed between the sixth lens 2461 and the image plane 600, which does not affect the focal length of the optical image capturing module.

Please refer to the following Table 5 and Table 6.

TABLE 5

Data of the optical image capturing module of the third optical embodiment
f = 2.808 mm; f/HEP = 1.6; HAF = 100 deg

| Surface | | Curvature radius | Thickness (mm) | Material |
|---|---|---|---|---|
| 0 | Object | 1E+18 | 1E+18 | |
| 1 | Lens 1 | 71.398124 | 7.214 | Glass |
| 2 | | 7.117272355 | 5.788 | |
| 3 | Lens 2 | −13.29213699 | 10.000 | Glass |
| 4 | | −18.37509887 | 7.005 | |
| 5 | Lens 3 | 5.039114804 | 1.398 | Plastic |
| 6 | | −15.53136631 | −0.140 | |
| 7 | Aperture | 1E+18 | 2.378 | |
| 8 | Lens 4 | −18.68613609 | 0.577 | Plastic |
| 9 | | 4.086545927 | 0.141 | |
| 10 | Lens 5 | 4.927609282 | 2.974 | Plastic |
| 11 | | −4.551946605 | 1.389 | |
| 12 | Lens 6 | 9.184876531 | 1.916 | Plastic |
| 13 | | 4.845500046 | 0.800 | |
| 14 | IR-cut filter | 1E+18 | 0.500 | BK_7 |
| 15 | | 1E+18 | 0.371 | |
| 16 | image plane | 1E+18 | 0.005 | |

| Surface | Refractive Index | Dispersion coefficient | Focal length |
|---|---|---|---|
| 0 | | | |
| 1 | 1.702 | 41.15 | −11.765 |
| 2 | | | |
| 3 | 2.003 | 19.32 | −4537.460 |
| 4 | | | |

TABLE 5-continued

Data of the optical image capturing
module of the third optical embodiment
f = 2.808 mm; f/HEP = 1.6; HAF = 100 deg

| | | | |
|---|---|---|---|
| 5 | 1.514 | 56.80 | 7.553 |
| 6 | | | |
| 7 | | | |
| 8 | 1.661 | 20.40 | -4.978 |
| 9 | | | |
| 10 | 1.565 | 58.00 | 4.709 |
| 11 | | | |
| 12 | 1.514 | 56.80 | -23.405 |
| 13 | | | |
| 14 | 1.517 | 64.13 | |
| 15 | | | |
| 16 | | | |

Reference wavelength (d-line) = 555 nm

TABLE 6

The aspheric surface parameters of the third optical embodiment
Table 6. Aspheric Coefficients

| Surface No | 1 | 2 | 3 | 4 |
|---|---|---|---|---|
| k | 0.000000E+00 | 0.000000E+00 | 0.000000E+00 | 0.000000E+00 |
| A4 | 0.000000E+00 | 0.000000E+00 | 0.000000E+00 | 0.000000E+00 |
| A6 | 0.000000E+00 | 0.000000E+00 | 0.000000E+00 | 0.000000E+00 |
| A8 | 0.000000E+00 | 0.000000E+00 | 0.000000E+00 | 0.000000E+00 |
| A10 | 0.000000E+00 | 0.000000E+00 | 0.000000E+00 | 0.000000E+00 |

| Surface No | 5 | 6 | 8 | 9 |
|---|---|---|---|---|
| k | 1.318519E-01 | 3.120384E+00 | -1.494442E+01 | 2.744228E-02 |
| A4 | 6.405246E-05 | 2.103942E-03 | -1.598286E-03 | -7.291825E-03 |
| A6 | 2.278341E-05 | -1.050629E-04 | -9.177115E-04 | 9.730714E-05 |
| A8 | -3.672908E-06 | 6.168906E-06 | 1.011405E-04 | 1.101816E-06 |
| A10 | 3.748457E-07 | -1.224682E-07 | -4.919835E-06 | -6.849076E-07 |

| Surface No | 10 | 11 | 12 | 13 |
|---|---|---|---|---|
| k | -7.864013E+00 | -2.263702E+00 | -4.206923E+01 | -7.030803E+00 |
| A4 | 1.405243E-04 | -3.919567E-03 | -1.679499E-03 | -2.640099E-03 |
| A6 | 1.837602E-04 | 2.683449E-04 | -3.518520E-04 | -4.507651E-05 |
| A8 | -2.173368E-05 | -1.229452E-05 | 5.047353E-05 | -2.600391E-05 |
| A10 | 7.328496E-07 | 4.222621E-07 | -3.851055E-06 | 1.161811E-06 |

In the third optical embodiment, the aspheric surface formula is presented in the same way in the first optical embodiment. In addition, the definitions of parameters in following tables are the same as those in the first optical embodiment. Therefore, similar description shall not be illustrated again.

The values stated as follows may be deduced according to Table 5 and Table 6.

| Third optical embodiment (Primary reference wavelength: 555 nm) | | | | | |
|---|---|---|---|---|---|
| \| f/f1 \| | \| f/f2 \| | \| f/f3 \| | \| f/f4 \| | \| f/f5 \| | \| f/f6 \| |
| 0.23865 | 0.00062 | 0.37172 | 0.56396 | 0.59621 | 0.11996 |
| ΣPPR | ΣNPR | ΣPPR/\|ΣNPR\| | IN12/f | IN56/f | TP4/(IN34 + TP4 + IN45) |
| 1.77054 | 0.12058 | 14.68400 | 2.06169 | 0.49464 | 0.19512 |
| \| f1/f2 \| | \| f2/f3 \| | (TP1 + IN12)/TP2 | | (TP6 + IN56)/TP5 | |
| 0.00259 | 600.74778 | 1.30023 | | 1.11131 | |
| HOS | InTL | HOS/HOI | InS/HOS | ODT % | TDT % |
| 42.31580 | 40.63970 | 10.57895 | 0.26115 | -122.32700 | 93.33510 |
| HVT51 | HVT52 | HVT61 | HVT62 | HVT62/HOI | HVT62/HOS |
| 0 | 0 | 2.22299 | 2.60561 | 0.65140 | 0.06158 |
| TP2/TP3 | TP3/TP4 | InRS61 | InRS62 | \| InRS61 \|/TP6 | \| InRS62 \|/TP6 |
| 7.15374 | 2.42321 | -0.20807 | -0.24978 | 0.10861 | 0.13038 |
| PhiA | PhiC | PhiD | TH1 | TH2 | HOI |
| 6.150 mm | 6.41 mm | 6.71 mm | 0.15 mm | 0.13 mm | 4 mm |
| PhiA/PhiD | TH1 + TH2 | (TH1 + TH2)/HOI | (TH1 + TH2)/HOS | 2(TH1 + TH2)/PhiA | InTL/HOS |
| 0.9165 | 0.28 mm | 0.07 | 0.0066 | 0.0911 | 0.9604 |
| PSTA | PLTA | NSTA | NLTA | SSTA | SLTA |
| 0.014 mm | 0.002 mm | -0.003 mm | -0.002 mm | 0.011 mm | -0.001 mm |

The values related to arc lengths may be obtained according to table 5 and table 6.

| Third optical embodiment (Reference wavelength = 555 nm) | | | | | |
|---|---|---|---|---|---|
| ARE | 1/2(HEP) | ARE value | ARE-1/2(HEP) | 2(ARE/HEP) % | TP | ARE/TP (%) |
| 11 | 0.877 | 0.877 | −0.00036 | 99.96% | 7.214 | 12.16% |
| 12 | 0.877 | 0.879 | 0.00186 | 100.21% | 7.214 | 12.19% |
| 21 | 0.877 | 0.878 | 0.00026 | 100.03% | 10.000 | 8.78% |
| 22 | 0.877 | 0.877 | −0.00004 | 100.00% | 10.000 | 8.77% |
| 31 | 0.877 | 0.882 | 0.00413 | 100.47% | 1.398 | 63.06% |
| 32 | 0.877 | 0.877 | 0.00004 | 100.00% | 1.398 | 62.77% |
| 41 | 0.877 | 0.877 | −0.00001 | 100.00% | 0.577 | 152.09% |
| 42 | 0.877 | 0.883 | 0.00579 | 100.66% | 0.577 | 153.10% |
| 51 | 0.877 | 0.881 | 0.00373 | 100.43% | 2.974 | 29.63% |
| 52 | 0.877 | 0.883 | 0.00521 | 100.59% | 2.974 | 29.68% |
| 61 | 0.877 | 0.878 | 0.00064 | 100.07% | 1.916 | 45.83% |
| 62 | 0.877 | 0.881 | 0.00368 | 100.42% | 1.916 | 45.99% |

| ARS | EHD | ARS value | ARS-EHD | (ARS/EHD)% | TP | ARS/TP (%) |
|---|---|---|---|---|---|---|
| 11 | 17.443 | 17.620 | 0.178 | 101.02% | 7.214 | 244.25% |
| 12 | 6.428 | 8.019 | 1.592 | 124.76% | 7.214 | 111.16% |
| 21 | 6.318 | 6.584 | 0.266 | 104.20% | 10.000 | 65.84% |
| 22 | 6.340 | 6.472 | 0.132 | 102.08% | 10.000 | 64.72% |
| 31 | 2.699 | 2.857 | 0.158 | 105.84% | 1.398 | 204.38% |
| 32 | 2.476 | 2.481 | 0.005 | 100.18% | 1.398 | 177.46% |
| 41 | 2.601 | 2.652 | 0.051 | 101.96% | 0.577 | 459.78% |
| 42 | 3.006 | 3.119 | 0.113 | 103.75% | 0.577 | 540.61% |
| 51 | 3.075 | 3.171 | 0.096 | 103.13% | 2.974 | 106.65% |
| 52 | 3.317 | 3.624 | 0.307 | 109.24% | 2.974 | 121.88% |
| 61 | 3.331 | 3.427 | 0.095 | 102.86% | 1.916 | 178.88% |
| 62 | 3.944 | 4.160 | 0.215 | 105.46% | 1.916 | 217.14% |

The values stated as follows may be deduced according to Table 5 and Table 6.

| Related inflection point values of third optical embodiment (Primary reference wavelength: 555 nm) | | | | | | |
|---|---|---|---|---|---|---|
| HIF321 | 2.0367 | HIF321/HOI | 0.5092 | SGI321 | −0.1056 | \| SGI321 \|/(\| SGI321 \| + TP3) | 0.0702 |
| HIF421 | 2.4635 | HIF421/HOI | 0.6159 | SGI421 | 0.5780 | \| SGI421 \|/(\| SGI421 \| + TP4) | 0.5005 |
| HIF611 | 1.2364 | HIF611/HOI | 0.3091 | SGI611 | 0.0668 | \| SGI611 \|/(\| SGI611 \| + TP6) | 0.0337 |
| HIF621 | 1.5488 | HIF621/HOI | 0.3872 | SGI621 | 0.2014 | \| SGI621 \|/(\| SGI621 \| + TP6) | 0.0951 |

The Fourth Optical Embodiment

Figure 17:
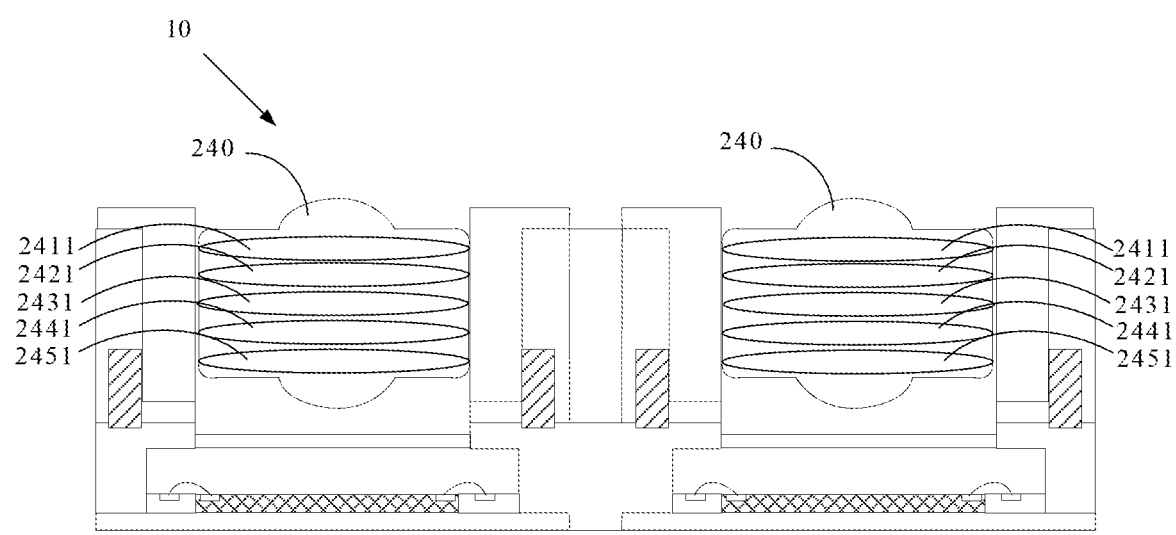
FIG. 17 is a schematic view of an optical image capturing module according to a fourteenth embodiment in the present invention.

As shown in FIG. 17, the auto-focus lens assembly 240 may respectively include five lenses 2401 with refractive power. The auto-focus lens assembly 240 includes a first lens 2411, a second lens 2421, a third lens 2431, a four lens 2441, a fifth lens 2451 sequentially displayed from an object side surface to an image side surface. Each auto-focus lens assemblies satisfies the following condition: 0.1≤InTL/HOS≤0.95; specifically, HOS is the distance on the optical axis from an object side surface of the first lens to the image plane, and InTL is the distance on the optical axis from an object side surface of the first lens to an image side surface of the fifth lens 2451.

Figure 26:
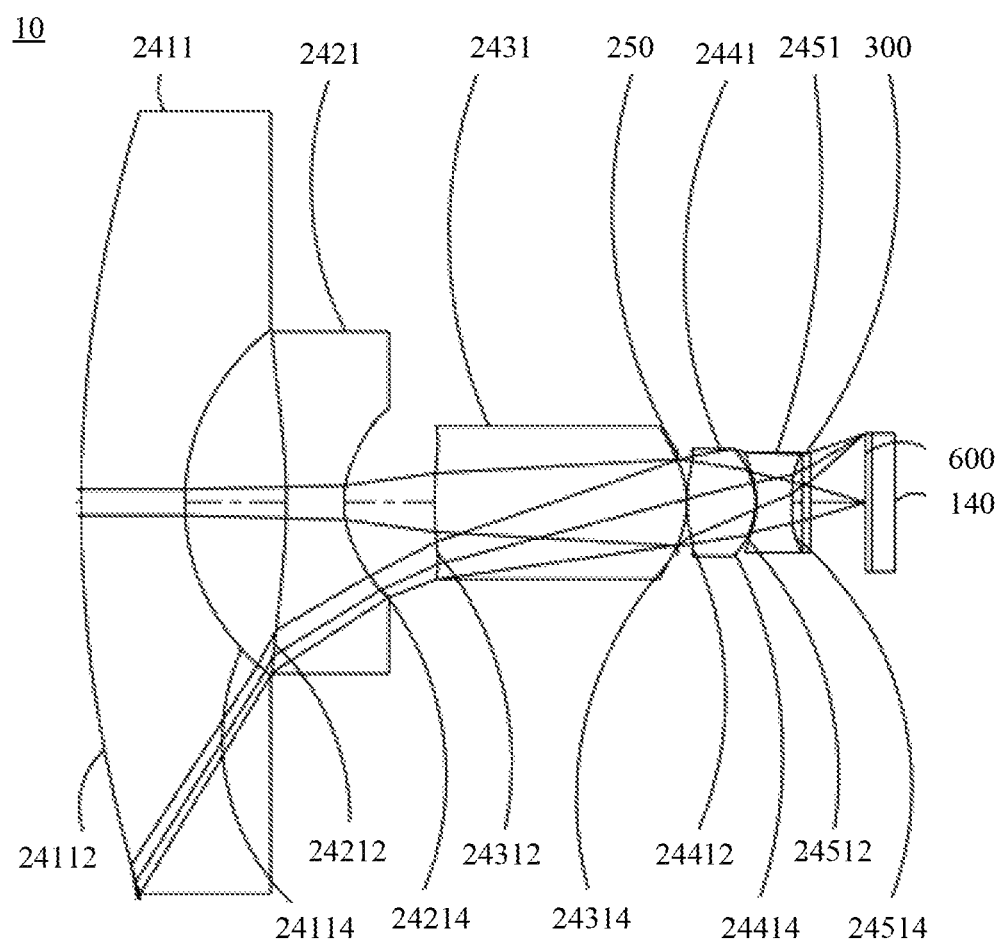
FIG. 26 is a schematic view of an optical image capturing module according to a fourth embodiment in the present invention.
Figure 27:
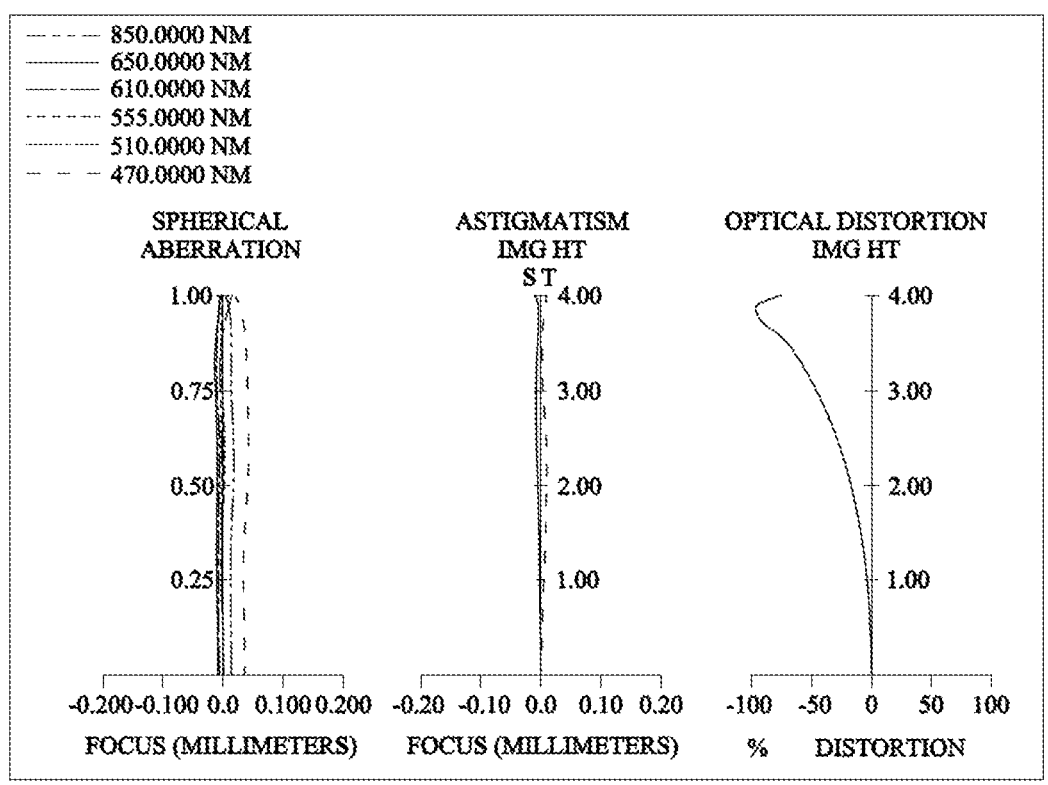
FIG. 27 is curve diagrams of spherical aberration, astigmatism, and optical distortion of the fourth optical embodiment illustrated sequentially from the left to the right according to the embodiment in the present invention.

Please refer to FIG. 26 and FIG. 27. FIG. 26 is a schematic diagram of the optical image capturing module according to the fourth optical embodiment of the present invention. FIG. 27 is a curve diagram of spherical aberration, astigmatism, and optical distortion of the optical image capturing module sequentially displayed from left to right according to the fourth optical embodiment of the present invention. As shown in FIG. 26, the optical image capturing module includes a first lens 2411, a second lens 2421, a third lens 2431, an aperture 250, a four lens 2441, a fifth lens 2451, an IR-cut filter 300, an image plane 600, and image sensor elements 140 sequentially displayed from an object side surface to an image side surface.

The first lens 2411 has negative refractive power and is made of a glass material. The object side surface 24112 thereof is a convex surface and the image side surface 24114 thereof is a concave surface, both of which are spherical.

The second lens 2421 has negative refractive power and is made of a plastic material. The object side surface thereof 24212 is a concave surface and the image side surface thereof 24214 is a concave surface, both of which are aspheric. The object side surface 24212 has an inflection point.

The third lens 2431 has positive refractive power and is made of a plastic material. The object side surface 24312 thereof is a convex surface and the image side surface 24314 thereof is a convex surface, both of which are aspheric. The object side surface 24312 thereof has an inflection point.

The fourth lens 2441 has positive refractive power and is made of a plastic material. The object side surface 24412 thereof is a convex surface and the image side surface 24414 thereof is a convex surface, both of which are aspheric. The object side surface 24412 thereof has an inflection point.

The fifth lens 2451 has negative refractive power and is made of a plastic material. The object side surface thereof 24512 is a concave surface and the image side surface thereof 24514 is a concave surface, both of which are aspheric. The object side surface 24512 has two inflection points. Therefore, it is advantageous for the lens to reduce the back focal length to maintain minimization.

The IR-cut filter 300 is made of glass and is disposed between the fifth lens 2451 and the image plane 600, which does not affect the focal length of the optical image capturing module.

Please refer to the following Table 7 and Table 8.

TABLE 7

Data of the optical image capturing module of the fourth optical embodiment
f = 2.7883 mm; f/HEP = 1.8; HAF = 101 deg

| Surface | | Curvature radius | Thickness(mm) | Material |
|---|---|---|---|---|
| 0 | Object | 1E+18 | 1E+18 | |
| 1 | Lens 1 | 76.84219 | 6.117399 | Glass |
| 2 | | 12.62555 | 5.924382 | |
| 3 | Lens 2 | −37.0327 | 3.429817 | Plastic |
| 4 | | 5.88556 | 5.305191 | |
| 5 | Lens 3 | 17.99395 | 14.79391 | |
| 6 | | −5.76903 | −0.4855 | Plastic |
| 7 | Aperture | 1E+18 | 0.535498 | |

TABLE 7-continued

Data of the optical image capturing module of the fourth optical embodiment
f = 2.7883 mm; f/HEP = 1.8; HAF = 101 deg

| | | | | |
|---|---|---|---|---|
| 8 | Lens 4 | 8.19404 | 4.011739 | Plastic |
| 9 | | −3.84363 | 0.050366 | |
| 10 | Lens 5 | −4.34991 | 2.088275 | Plastic |
| 11 | | 16.6609 | 0.6 | |
| 12 | IR-cut filter | 1E+18 | 0.5 | BK_7 |
| 13 | | 1E+18 | 3.254927 | |
| 14 | Image plane | 1E+18 | −0.00013 | |

| Surface | Refractive index | Dispersion coefficient | Focal length |
|---|---|---|---|
| 0 | | | |
| 1 | 1.497 | 81.61 | −31.322 |
| 2 | | | |
| 3 | 1.565 | 54.5 | −8.70843 |
| 4 | | | |
| 5 | | | |
| 6 | 1.565 | 58 | 9.94787 |
| 7 | | | |
| 8 | 1.565 | 58 | 5.24898 |
| 9 | | | |
| 10 | 1.661 | 20.4 | −4.97515 |
| 11 | | | |
| 12 | 1.517 | 64.13 | |
| 13 | | | |
| 14 | | | |

Reference wavelength(d-line) = 555 nm

TABLE 8

The aspheric surface parameters of the fourth optical embodiment
Table 8. Aspheric Coefficients

| Surface | 1 | 2 | 3 | 4 |
|---|---|---|---|---|
| k | 0.000000E+00 | 0.000000E+00 | 0.131249 | −0.069541 |
| A4 | 0.000000E+00 | 0.000000E+00 | 3.99823E−05 | −8.55712E−04 |
| A6 | 0.000000E+00 | 0.000000E+00 | 9.03636E−08 | −1.96175E−06 |
| A8 | 0.000000E+00 | 0.000000E+00 | 1.91025E−09 | −1.39344E−08 |
| A10 | 0.000000E+00 | 0.000000E+00 | −1.18567E−11 | −4.17090E−09 |
| A12 | 0.000000E+00 | 0.000000E+00 | 0.000000E+00 | 0.000000E+00 |

| Surface | 5 | 6 | 8 | 9 |
|---|---|---|---|---|
| k | −0.324555 | 0.009216 | −0.292346 | −0.18604 |
| A4 | −9.07093E−04 | 8.80963E−04 | −1.02138E−03 | 4.33629E−03 |
| A6 | −1.02465E−05 | 3.14497E−05 | −1.18559E−04 | −2.91588E−04 |
| A8 | −8.18157E−08 | −3.15863E−06 | 1.34404E−05 | 9.11419E−06 |
| A10 | −2.42621E−09 | 1.44613E−07 | −2.80681E−06 | 1.28365E−07 |
| A12 | 0.000000E+00 | 0.000000E+00 | 0.000000E+00 | 0.000000E+00 |

| Surface | 10 | 11 |
|---|---|---|
| k | −6.17195 | 27.541383 |
| A4 | 1.58379E−03 | 7.56932E−03 |
| A6 | −1.81549E−04 | −7.83858E−04 |
| A8 | −1.18213E−05 | 4.79120E−05 |
| A10 | 1.92716E−06 | −1.73591E−06 |
| A12 | 0.000000E+00 | 0.000000E+00 |

In the fourth optical embodiment, the aspheric surface formula is presented in the same way in the first optical embodiment. In addition, the definitions of parameters in following tables are the same as those in the first optical embodiment. Therefore, similar description shall not be illustrated again.

The values stated as follows may be deduced according to Table 7 and Table 8.

Fourth optical embodiment (Primary reference wavelength: 555 nm)

| | f/f1 | | f/f2 | | f/f3 | | f/f4 | | f/f5 | | f1/f2 |
|---|---|---|---|---|---|---|---|---|---|---|---|
| | 0.08902 | | 0.32019 | | 0.28029 | | 0.53121 | | 0.56045 | | 3.59674 |
| ΣPPR | | ΣNPR | | ΣPPR/\| ΣNPR \| | | IN12/f | | IN45/f | | \| f2/f3 \| | |
| 1.4118 | | 0.3693 | | 3.8229 | | 2.1247 | | 0.0181 | | 0.8754 | |
| TP3/(IN23 + TP3 + IN34) | | | | (TP1 + IN12)/TP2 | | | | (TP5 + IN45)/TP4 | | | |
| 0.73422 | | | | 3.51091 | | | | 0.53309 | | | |
| HOS | | InTL | | HOS/HOI | | InS/HOS | | ODT % | | TDT % | |
| 46.12590 | | 41.77110 | | 11.53148 | | 0.23936 | | −125.266 | | 99.1671 | |
| HVT41 | | HVT42 | | HVT51 | | HVT52 | | HVT52/HOI | | HVT52/HOS | |
| 0.00000 | | 0.00000 | | 0.00000 | | 0.00000 | | 0.00000 | | 0.00000 | |
| TP2/TP3 | | TP3/TP4 | | InRS51 | | InRS52 | | \| InRS51 \|/TP5 | | \| InRS52 \|/TP5 | |
| 0.23184 | | 3.68765 | | −0.679265 | | 0.5369 | | 0.32528 | | 0.25710 | |

-continued

| Fourth optical embodiment (Primary reference wavelength: 555 nm) | | | | | |
|---|---|---|---|---|---|
| PhiA | PhiC | PhiD | TH1 | TH2 | HOI |
| 5.598 mm | 5.858 mm | 6.118 mm | 0.13 mm | 0.13 mm | 4 mm |
| PhiA/PhiD | TH1 + TH2 | (TH1 + TH2)/HOI | (TH1 + TH2)/HOS | 2(TH1 + TH2)/PhiA | InTL/HOS |
| 0.9150 | 0.26 mm | 0.065 | 0.0056 | 0.0929 | 0.9056 |
| PSTA | PLTA | NSTA | NLTA | SSTA | SLTA |
| −0.011 mm | 0.005 mm | −0.010 mm | −0.003 mm | 0.005 mm | −0.00026 mm |

The values related to arc lengths may be obtained according to table 7 and table 8.

| Fourth optical embodiment (Reference wavelength = 555 nm) | | | | | | |
|---|---|---|---|---|---|---|
| ARE | 1/2(HEP) | ARE value | ARE−1/2(HEP) | 2(ARE/HEP) % | TP | ARE/TP (%) |
| 11 | 0.775 | 0.774 | −0.00052 | 99.93% | 6.117 | 12.65% |
| 12 | 0.775 | 0.774 | −0.00005 | 99.99% | 6.117 | 12.66% |
| 21 | 0.775 | 0.774 | −0.00048 | 99.94% | 3.430 | 22.57% |
| 22 | 0.775 | 0.776 | 0.00168 | 100.22% | 3.430 | 22.63% |
| 31 | 0.775 | 0.774 | −0.00031 | 99.96% | 14.794 | 5.23% |
| 32 | 0.775 | 0.776 | 0.00177 | 100.23% | 14.794 | 5.25% |
| 41 | 0.775 | 0.775 | 0.00059 | 100.08% | 4.012 | 19.32% |
| 42 | 0.775 | 0.779 | 0.00453 | 100.59% | 4.012 | 19.42% |
| 51 | 0.775 | 0.778 | 0.00311 | 100.40% | 2.088 | 37.24% |
| 52 | 0.775 | 0.774 | −0.00014 | 99.98% | 2.088 | 37.08% |

| ARS | EHD | ARS value | ARS−EHD | (ARS/EHD)% | TP | ARS/TP (%) |
|---|---|---|---|---|---|---|
| 11 | 23.038 | 23.397 | 0.359 | 101.56% | 6.117 | 382.46% |
| 12 | 10.140 | 11.772 | 1.632 | 116.10% | 6.117 | 192.44% |
| 21 | 10.138 | 10.178 | 0.039 | 100.39% | 3.430 | 296.74% |
| 22 | 5.537 | 6.337 | 0.800 | 114.44% | 3.430 | 184.76% |
| 31 | 4.490 | 4.502 | 0.012 | 100.27% | 14.794 | 30.43% |
| 32 | 2.544 | 2.620 | 0.076 | 102.97% | 14.794 | 17.71% |
| 41 | 2.735 | 2.759 | 0.024 | 100.89% | 4.012 | 68.77% |
| 42 | 3.123 | 3.449 | 0.326 | 110.43% | 4.012 | 85.97% |
| 51 | 2.934 | 3.023 | 0.089 | 103.04% | 2.088 | 144.74% |
| 52 | 2.799 | 2.883 | 0.084 | 103.00% | 2.088 | 138.08% |

The values stated as follows may be deduced according to Table 7 and Table 8.

| Related inflection point values of fourth optical embodiment (Primary reference wavelength: 555 nm) | | | | | | |
|---|---|---|---|---|---|---|
| HIF211 | 6.3902 | HIF211/HOI | 1.5976 | SGI211 | −0.4793 | \| SGI211 \|/(\| SGI211 \| + TP2) | 0.1226 |
| HIF311 | 2.1324 | HIF311/HOI | 0.5331 | SGI311 | 0.1069 | \| SGI311 \|/(\| SGI311 \| + TP3) | 0.0072 |
| HIF411 | 2.0278 | HIF411/HOI | 0.5070 | SGI411 | 0.2287 | \| SGI411 \|/(\| SGI411 \| + TP4) | 0.0539 |
| HIF511 | 2.6253 | HIF511/HOI | 0.6563 | SGI511 | −0.5681 | \| SGI511 \|/(\| SGI511 \| + TP5) | 0.2139 |
| HIF512 | 2.1521 | HIF512/HOI | 0.5380 | SGI512 | −0.8314 | \| SGI512 \|/(\| SGI512 \| + TP5) | 0.2848 |

The Fifth Optical Embodiment

Figure 16:
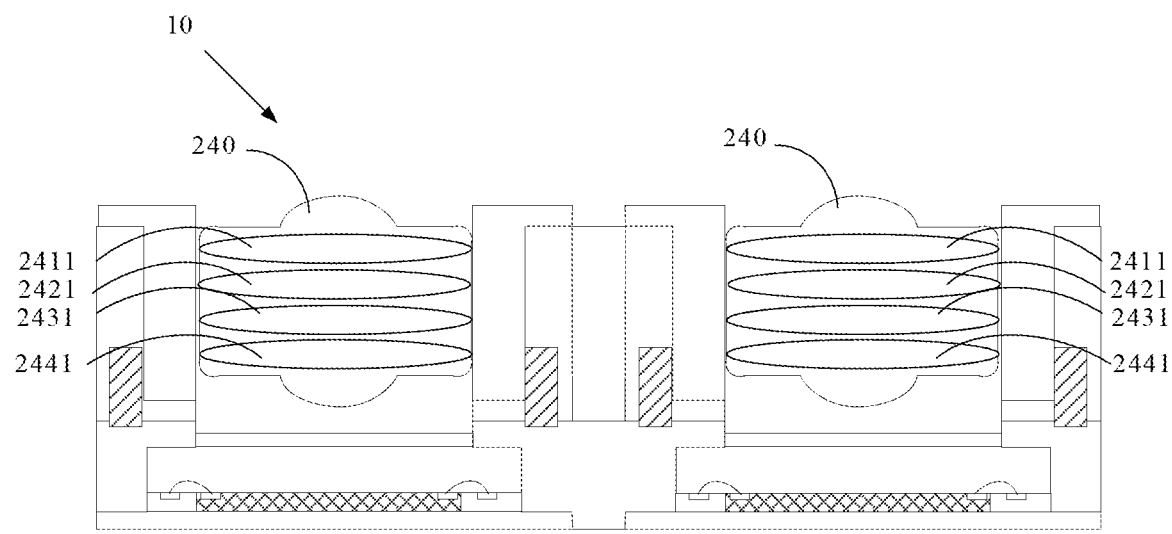
FIG. 16 is a schematic view of an optical image capturing module according to a thirteenth embodiment in the present invention.

As shown in FIG. 16, the auto-focus lens assembly 240 may include four lenses 2401 with refractive power. The auto-focus lens assembly 240 may include a first lens 2411, a second lens 2421, a third lens 2431, and a fourth lens 2441 sequentially displayed from an object side surface to an image side surface. Each auto-focus lens assemblies satisfies the following condition: $0.1 \leq \text{InTL/HOS} \leq 0.95$; specifically, HOS is the distance from an object side surface of the first lens to the imaging surface on an optical axis; InTL is the distance from an object side surface of the first lens to an image side surface of the fourth lens on an optical axis.

Figure 28:
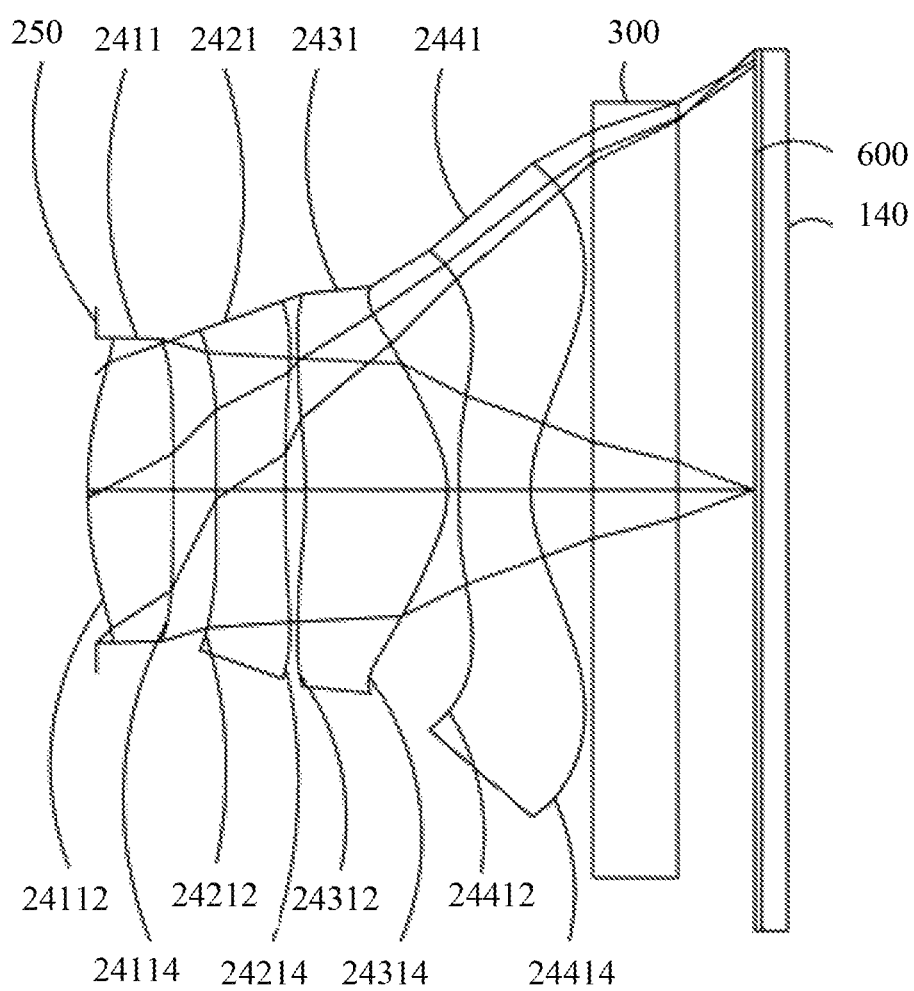
FIG. 28 is a schematic view of an optical image capturing module according to a fifth optical embodiment in the present invention.
Figure 29:
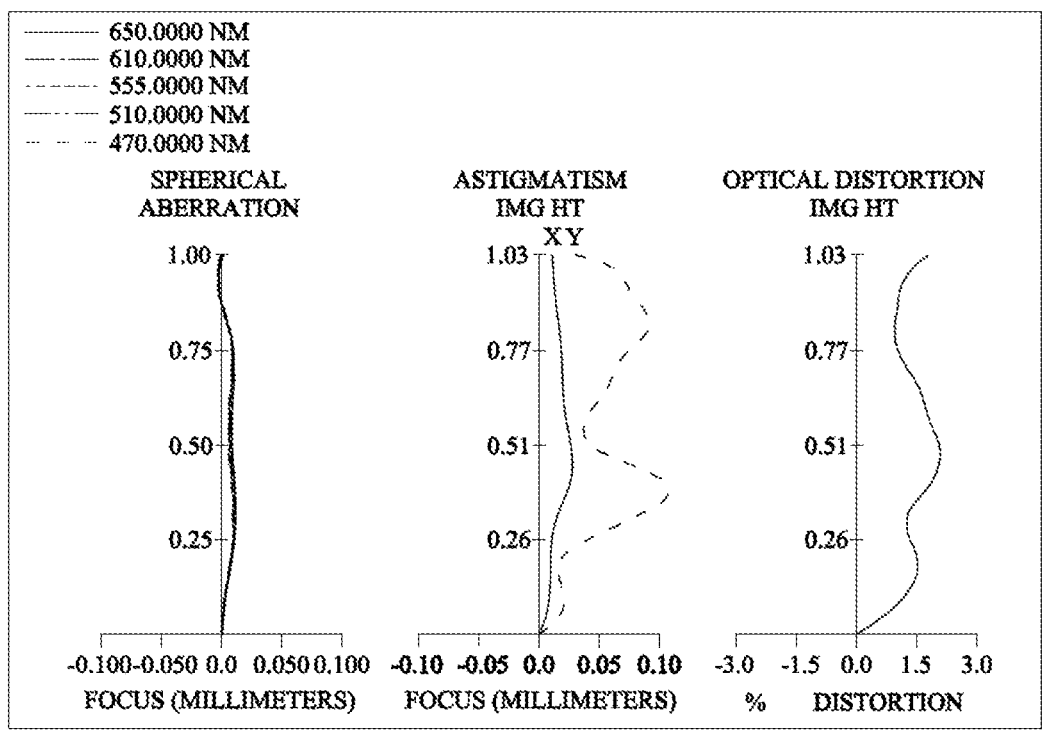
FIG. 29 is curve diagrams of spherical aberration, astigmatism, and optical distortion of the fifth optical embodiment illustrated sequentially from the left to the right according to the embodiment in the present invention.

Please refer to FIG. 28 and FIG. 29. FIG. 28 is a schematic diagram of the optical image capturing module according to the fifth optical embodiment of the present invention. FIG. 29 is a curve diagram of spherical aberration, astigmatism, and optical distortion of the optical image capturing module sequentially displayed from left to right according to the fifth optical embodiment of the present invention. As shown in FIG. 28, the optical image capturing module includes an aperture 250, a first lens 2411, a second lens 2421, a third lens 2431, a four lens 2441, an IR-cut filter 300, an image plane 600, and image sensor elements 140 sequentially displayed from an object side surface to an image side surface.

The first lens 2411 has positive refractive power and is made of a plastic material. The object side surface 24112 thereof is a convex surface and the image side surface 24114 thereof is a convex surface, both of which are aspheric. The object side surface 24112 thereof has an inflection point.

The second lens 2421 has negative refractive power and is made of a plastic material. The object side surface thereof 24212 is a convex surface and the image side surface thereof 24214 is a concave surface, both of which are aspheric. The object side surface 24212 has two inflection points and the image side surface 24214 thereof has an inflection point.

The third lens 2431 has positive refractive power and is made of a plastic material. The object side surface 24312 thereof is a concave surface and the image side surface 24314 thereof is a convex surface, both of which are aspheric. The object side surface 24312 thereof has three inflection points and the image side surface 24314 thereof has an inflection point.

The fourth lens 2441 has negative refractive power and is made of a plastic material. The object side surface thereof 24412 is a concave surface and the image side surface thereof 24414 is a concave surface, both of which are aspheric. The object side surface thereof 24412 has two inflection points and the image side surface 24414 thereof has an inflection point.

The IR-cut filter 300 is made of glass and is disposed between the fourth lens 2441 and the image plane 600, which does not affect the focal length of the optical image capturing module.

Please refer to the following Table 9 and Table 10.

TABLE 9

Data of the optical image capturing module of the fifth optical embodiment
f = 1.04102 mm; f/HEP = 1.4; HAF = 44.0346 deg

| Surface | | Curvature Radius | Thickness (mm) | Material |
|---|---|---|---|---|
| 0 | Object | 1E+18 | 600 | |
| 1 | Aperture | 1E+18 | −0.020 | |
| 2 | Lens 1 | 0.890166851 | 0.210 | Plastic |
| 3 | | −29.11040115 | −0.010 | |
| 4 | | 1E+18 | 0.116 | |
| 5 | Lens 2 | 10.67765398 | 0.170 | Plastic |
| 6 | | 4.977771922 | 0.049 | |
| 7 | Lens 3 | −1.191436932 | 0.349 | Plastic |
| 8 | | −0.248990674 | 0.030 | |
| 9 | Lens 4 | −38.08537212 | 0.176 | Plastic |
| 10 | | 0.372574476 | 0.152 | |
| 11 | IR-cut filter | 1E+18 | 0.210 | BK_7 |

TABLE 9-continued

Data of the optical image capturing module of the fifth optical embodiment
f = 1.04102 mm; f/HEP = 1.4; HAF = 44.0346 deg

| | | | |
|---|---|---|---|
| 12 | | 1E+18 | 0.185 |
| 13 | Image plane | 1E+18 | 0.005 |

| Surface | Refractive index | Dispersion coefficient | Focal length |
|---|---|---|---|
| 0 | | | |
| 1 | | | |
| 2 | 1.545 | 55.96 | 1.587 |
| 3 | | | |
| 4 | | | |
| 5 | 1.642 | 22.46 | −14.569 |
| 6 | | | |
| 7 | 1.545 | 55.96 | 0.510 |
| 8 | | | |
| 9 | 1.642 | 22.46 | −0.569 |
| 10 | | | |
| 11 | 1.517 | 64.13 | |
| 12 | | | |
| 13 | | | |

Reference wavelength (d-line) = 555 nm.
Shield position: The radius of the clear aperture of the fourth surface is 0.360 mm.

TABLE 10

The aspheric surface parameters of the fifth optical embodiment
Table 10. Aspheric Coefficients

| Surface | 2 | 3 | 5 | 6 |
|---|---|---|---|---|
| k= | −1.106629E+00 | 2.994179E−07 | −7.788754E+01 | −3.440335E+01 |
| A4= | 8.291155E−01 | −6.401113E−01 | −4.958114E+00 | −1.875957E+00 |
| A6= | −2.398799E+01 | −1.265726E+01 | 1.299769E+02 | 8.568480E+01 |
| A8= | 1.825378E+02 | 8.457286E+01 | −2.736977E+03 | −1.279044E+03 |
| A10= | −6.211133E+02 | −2.157875E+02 | 2.908537E+04 | 8.661312E+03 |
| A12= | −4.719066E+02 | −6.203600E+02 | −1.499597E+05 | −2.875274E+04 |
| A14= | 0.000000E+00 | 0.000000E+00 | 2.992026E+05 | 3.764871E+04 |
| A16= | 0.000000E+00 | 0.000000E+00 | 0.000000E+00 | 0.000000E+00 |
| A18= | 0.000000E+00 | 0.000000E+00 | 0.000000E+00 | 0.000000E+00 |
| A20= | 0.000000E+00 | 0.000000E+00 | 0.000000E+00 | 0.000000E+00 |

| Surface | 7 | 8 | 9 | 10 |
|---|---|---|---|---|
| k= | −8.522097E−01 | −4.735945E+00 | −2.277155E+01 | −8.039778E−01 |
| A4= | −4.878227E−01 | −2.490377E+00 | 1.672704E+01 | −7.613206E+00 |
| A6= | 1.291242E+02 | 1.524149E+02 | −3.260722E+02 | 3.374046E+01 |
| A8= | −1.979689E+03 | −4.841033E+03 | 3.373231E+03 | −1.368453E+02 |
| A10= | 1.456076E+04 | 8.053747E+04 | −2.177676E+04 | 4.049486E+02 |
| A12= | −5.975920E+04 | −7.936887E+05 | 8.951687E+04 | −9.711797E+02 |
| A14= | 1.351676E+05 | 4.811528E+06 | −2.363737E+05 | 1.942574E+03 |
| A16= | −1.329001E+05 | −1.762293E+07 | 3.983151E+05 | −2.876356E+03 |
| A18= | 0.000000E+00 | 3.579891E+07 | −4.090689E+05 | 2.562386E+03 |
| A20= | 0.000000E+00 | −3.094006E+07 | 2.056724E+05 | −9.943657E+02 |

In the fifth optical embodiment, the aspheric surface formula is presented in the same way in the first optical embodiment. In addition, the definitions of parameters in following tables are the same as those in the first optical embodiment. Therefore, similar description shall not be illustrated again.

The values stated as follows may be deduced according to Table 9 and Table 10.

Fifth optical embodiment (Primary reference wavelength: 555 nm)

| InRS41 | InRS42 | HVT41 | HVT42 | ODT % | TDT % |
|---|---|---|---|---|---|
| −0.07431 | 0.00475 | 0.00000 | 0.53450 | 2.09403 | 0.84704 |
| \| f/f1 \| | \| f/f2 \| | \| f/f3 \| | \| f/f4 \| | \| f1/f2 \| | \| f2/f3 \| |
| 0.65616 | 0.07145 | 2.04129 | 1.83056 | 0.10890 | 28.56826 |
| ΣPPR | ΣNPR | ΣPPR/\|ΣNPR\| | ΣPP | ΣNP | f1/ΣPP |

| Fifth optical embodiment (Primary reference wavelength: 555 nm) | | | | | |
|---|---|---|---|---|---|
| 2.11274 | 2.48672 | 0.84961 | −14.05932 | 1.01785 | 1.03627 |
| f4/ΣNP | IN12/f | IN23/f | IN34/f | TP3/f | TP4/f |
| 1.55872 | 0.10215 | 0.04697 | 0.02882 | 0.33567 | 0.16952 |
| InTL | HOS | HOS/HOI | InS/HOS | InTL/HOS | ΣTP/InTL |
| 1.09131 | 1.64329 | 1.59853 | 0.98783 | 0.66410 | 0.83025 |
| (TP1 + IN12)/TP2 | (TP4 + IN34)/TP3 | TP1/TP2 | TP3/TP4 | IN23/(TP2 + IN23 + TP3) | |
| 1.86168 | 0.59088 | 1.23615 | 1.98009 | 0.08604 | |
| \| InRS41 \|/TP4 | \| InRS42 \|/TP4 | HVT42/HOI | HVT42/HOS | InTL/HOS | |
| 0.4211 | 0.0269 | 0.5199 | 0.3253 | 0.6641 | |
| PhiA | PhiC | PhiD | TH1 | TH2 | HOI |
| 1.596 mm | 1.996 mm | 2.396 mm | 0.2 mm | 0.2 mm | 1.028 mm |
| PhiA/PhiD | TH1 + TH2 | (TH1 + TH2)/HOI | (TH1 + TH2)/HOS | 2(TH1 + TH2)/PhiA | |
| 0.7996 | 0.4 mm | 0.3891 | 0.2434 | 0.5013 | |
| PSTA | PLTA | NSTA | NLTA | SSTA | SLTA |
| −0.029 mm | −0.023 mm | −0.011 mm | −0.024 mm | 0.010 mm | 0.011 mm |

The values stated as follows may be deduced according to Table 9 and Table 10.

| Related inflection point values of fifth optical embodiment (Primary reference wavelength: 555 nm) | | | | | |
|---|---|---|---|---|---|
| HIF111 | 0.28454 | HIF111/HOI | 0.27679 | SGI111 | 0.04361 | \| SGI111 \|/(\| SGI111 \| + TP1) | 0.17184 |
| HIF211 | 0.04198 | HIF211/HOI | 0.04083 | SGI211 | 0.00007 | \| SGI211 \|/(\| SGI211 \| + TP2) | 0.00040 |
| HIF212 | 0.37903 | HIF212/HOI | 0.36871 | SGI212 | −0.03682 | \| SGI212 \|/(\| SGI212 \| + TP2) | 0.17801 |
| HIF221 | 0.25058 | HIF221/HOI | 0.24376 | SGI221 | 0.00695 | \| SGI221 \|/(\| SGI221 \| + TP2) | 0.03927 |
| HIF311 | 0.14881 | HIF311/HOI | 0.14476 | SGI311 | −0.00854 | \| SGI311 \|/(\| SGI311 \| + TP3) | 0.02386 |
| HIF312 | 0.31992 | HIF312/HOI | 0.31120 | SGI312 | −0.01783 | \| SGI312 \|/(\| SGI312 \| + TP3) | 0.04855 |
| HIF313 | 0.32956 | HIF313/HOI | 0.32058 | SGI313 | −0.01801 | \| SGI313 \|/(\| SGI313 \| + TP3) | 0.04902 |
| HIF321 | 0.36943 | HIF321/HOI | 0.35937 | SGI321 | −0.14878 | \| SGI321 \|/(\| SGI321 \| + TP3) | 0.29862 |
| HIF411 | 0.01147 | HIF411/HOI | 0.01116 | SGI411 | −0.00000 | \| SGI411 \|/(\| SGI411 \| + TP4) | 0.00001 |
| HIF412 | 0.22405 | HIF412/HOI | 0.21795 | SGI412 | 0.01598 | \| SGI412 \|/(\| SGI412 \| + TP4) | 0.08304 |
| HIF421 | 0.24105 | HIF421/HOI | 0.23448 | SGI421 | 0.05924 | \| SGI421 \|/(\| SGI421 \| + TP4) | 0.25131 |

The values related to arc lengths may be obtained according to table 9 and table 10.

| Fifth optical embodiment (Reference wavelength = 555 nm) | | | | | | |
|---|---|---|---|---|---|---|
| ARE | 1/2(HEP) | ARE value | ARE−1/2(HEP) | 2(ARE/HEP) % | TP | ARE/TP (%) |
| 11 | 0.368 | 0.374 | 0.00578 | 101.57% | 0.210 | 178.10% |
| 12 | 0.366 | 0.368 | 0.00240 | 100.66% | 0.210 | 175.11% |
| 21 | 0.372 | 0.375 | 0.00267 | 100.72% | 0.170 | 220.31% |
| 22 | 0.372 | 0.371 | −0.00060 | 99.84% | 0.170 | 218.39% |
| 31 | 0.372 | 0.372 | −0.00023 | 99.94% | 0.349 | 106.35% |
| 32 | 0.372 | 0.404 | 0.03219 | 108.66% | 0.349 | 115.63% |
| 41 | 0.372 | 0.373 | 0.00112 | 100.30% | 0.176 | 211.35% |
| 42 | 0.372 | 0.387 | 0.01533 | 104.12% | 0.176 | 219.40% |
| ARS | EHD | ARS value | ARS−EHD | (ARS/EHD)% | TP | ARS/TP (%) |
| 11 | 0.368 | 0.374 | 0.00578 | 101.57% | 0.210 | 178.10% |
| 12 | 0.366 | 0.368 | 0.00240 | 100.66% | 0.210 | 175.11% |
| 21 | 0.387 | 0.391 | 0.00383 | 100.99% | 0.170 | 229.73% |
| 22 | 0.458 | 0.460 | 0.00202 | 100.44% | 0.170 | 270.73% |
| 31 | 0.476 | 0.478 | 0.00161 | 100.34% | 0.349 | 136.76% |
| 32 | 0.494 | 0.538 | 0.04435 | 108.98% | 0.349 | 154.02% |
| 41 | 0.585 | 0.624 | 0.03890 | 106.65% | 0.176 | 353.34% |
| 42 | 0.798 | 0.866 | 0.06775 | 108.49% | 0.176 | 490.68% |

The Sixth Optical Embodiment

Figure 30:
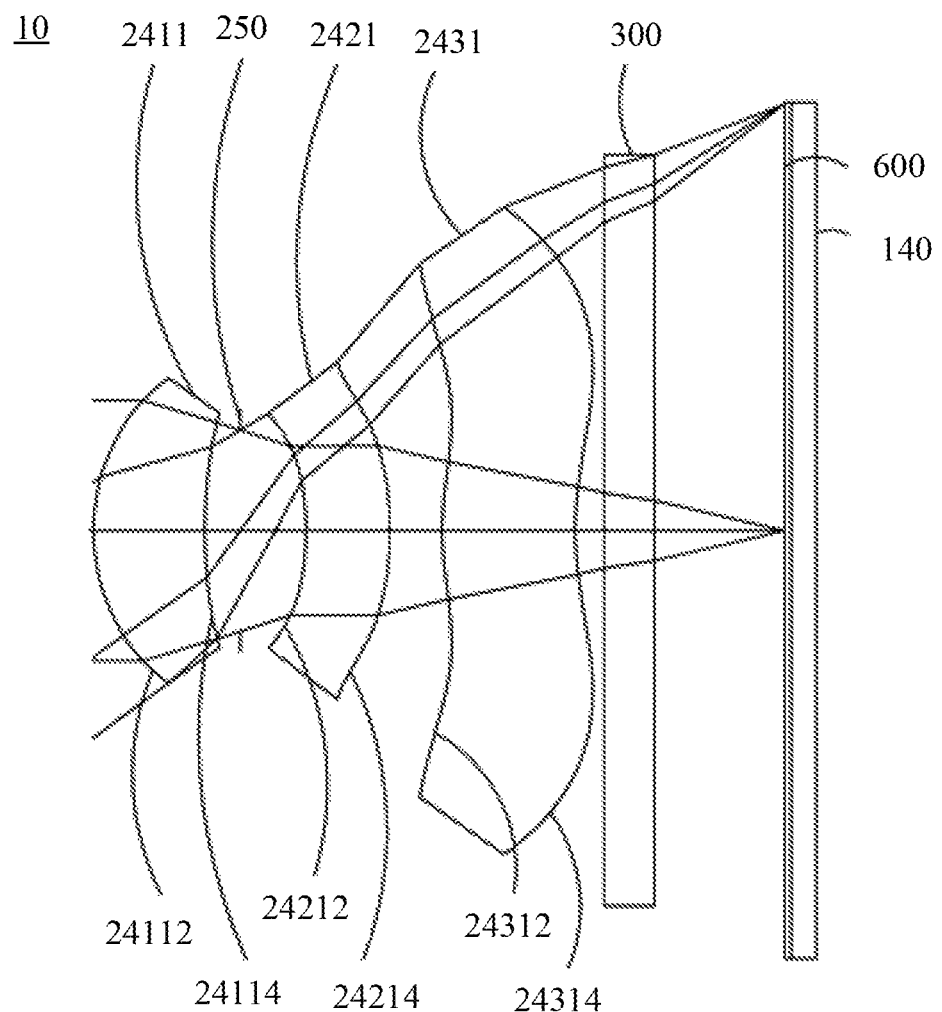
FIG. 30 is a schematic view of an optical image capturing module according to a sixth optical embodiment in the present invention.
Figure 31:
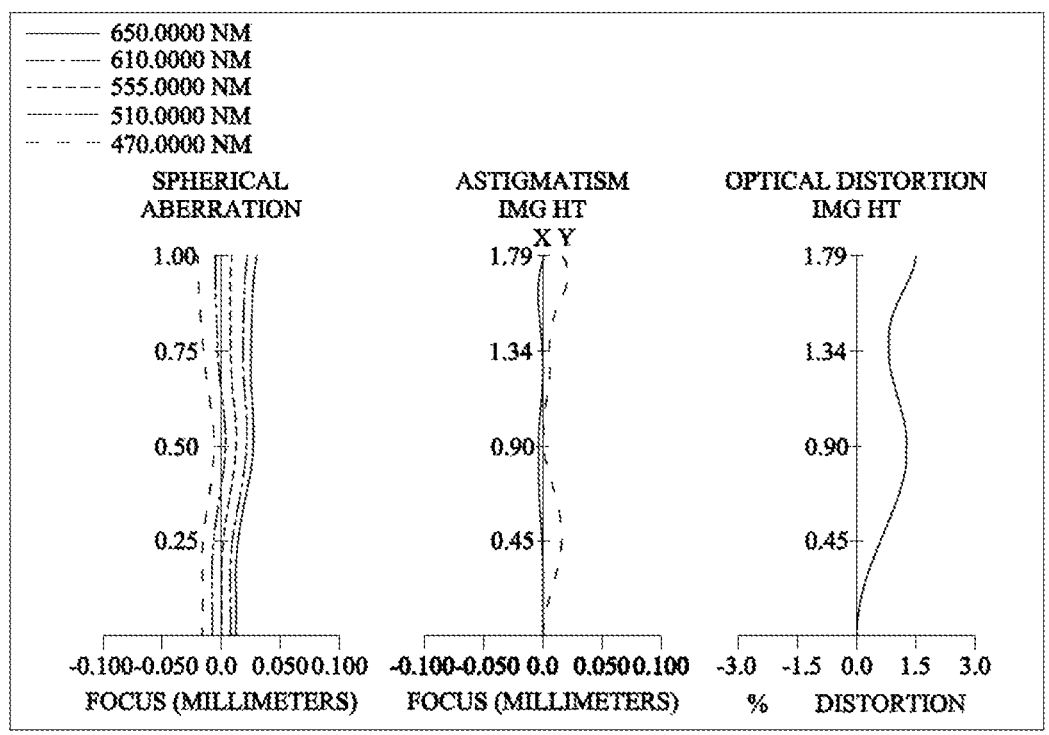
FIG. 31 is curve diagrams of spherical aberration, astigmatism, and optical distortion of the sixth optical embodiment illustrated sequentially from the left to the right according to the embodiment in the present invention.

Please refer to FIG. 30 and FIG. 31. FIG. 30 is a schematic diagram of the optical image capturing module according to the sixth optical embodiment of the present invention. FIG. 31 is a curve diagram of spherical aberration, astigmatism, and optical distortion of the optical image capturing module sequentially displayed from left to right according to the sixth optical embodiment of the present invention. As shown in FIG. 30, the optical image capturing module includes a first lens 2411, an aperture 250, a second lens 2421, a third lens 2431, an IR-cut filter 300, an image plane 600, and image sensor elements 140 sequentially displayed from an object side surface to an image side surface.

The first lens 2411 has positive refractive power and is made of a plastic material. The object side surface 24112 thereof is a convex surface and the image side surface 24114 thereof is a concave surface, both of which are aspheric.

The second lens 2421 has negative refractive power and is made of a plastic material. The object side surface thereof 24212 is a concave surface and the image side surface thereof 24214 is a convex surface, both of which are aspheric. The image side surface 24214 thereof both has an inflection point.

The third lens 2431 has positive refractive power and is made of a plastic material. The object side surface 24312 thereof is a convex surface and the image side surface 24314 thereof is a convex surface, both of which are aspheric. The object side surface 24312 thereof has two inflection points and the image side surface 24314 thereof has an infection point.

The IR-cut filter 300 is made of glass and is disposed between the third lens 2431 and the image plane 600, which does not affect the focal length of the optical image capturing module.

Please refer to the following Table 11 and Table 12.

TABLE 11

Data of the optical image capturing module of the sixth optical embodiment
f = 2.41135 mm; f/HEP = 2.22; HAF = 36 deg

| Surface | | Curvature radius | Thickness (mm) | Material |
|---|---|---|---|---|
| 0 | Object | 1E+18 | 600 | |
| 1 | Lens 1 | 0.840352226 | 0.468 | Plastic |
| 2 | | 2.271975602 | 0.148 | |
| 3 | Aperture | 1E+18 | 0.277 | |
| 4 | Lens 2 | −1.157324239 | 0.349 | Plastic |
| 5 | | −1.968404008 | 0.221 | |
| 6 | Lens 3 | 1.151874235 | 0.559 | Plastic |
| 7 | | 1.338105159 | 0.123 | |
| 8 | IR-cut filter | 1E+18 | 0.210 | BK7 |
| 9 | | 1E+18 | 0.547 | |
| 10 | Image plane | 1E+18 | 0.000 | |

| Surface | Refractive index | Dispersion coefficient | Focal length |
|---|---|---|---|
| 0 | | | |
| 1 | 1.535 | 56.27 | 2.232 |
| 2 | | | |
| 3 | | | |
| 4 | 1.642 | 22.46 | −5.221 |
| 5 | | | |
| 6 | 1.544 | 56.09 | 7.360 |
| 7 | | | |
| 8 | 1.517 | 64.13 | |
| 9 | | | |
| 10 | | | |

Reference wavelength (d-line) = 555 nm.
Shield position: The radius of the clear aperture of the first surface is 0.640 mm

TABLE 12

The aspheric surface parameters of the sixth optical embodiment
Table 12. Aspheric Coefficients

| Surface | 1 | 2 | 4 | 5 |
|---|---|---|---|---|
| k= | −2.019203E−01 | 1.528275E+01 | 3.743939E+00 | −1.207814E+01 |
| A4= | 3.944883E−02 | −1.670490E−01 | −4.266331E−01 | −1.696843E+00 |
| A6= | 4.774062E−01 | 3.857435E+00 | −1.423859E+00 | 5.164775E+00 |
| A8= | −1.528780E+00 | −7.091408E+01 | 4.119587E+01 | −1.445541E+01 |
| A10= | 5.133947E+00 | 6.365801E+02 | −3.456462E+02 | 2.876958E+01 |
| A12= | −6.250496E+00 | −3.141002E+03 | 1.495452E+03 | −2.662400E+01 |
| A14= | 1.068803E+00 | 7.962834E+03 | −2.747802E+03 | 1.661634E+01 |
| A16= | 7.995491E+00 | −8.268637E+03 | 1.443133E+03 | −1.327827E+01 |

| Surface | 6 | 7 |
|---|---|---|
| k= | −1.276860E+01 | −3.034004E+00 |
| A4= | −7.396546E−01 | −5.308488E−01 |
| A6= | 4.449101E−01 | 4.374142E−01 |
| A8= | 2.622372E−01 | −3.111192E−01 |
| A10= | −2.510946E−01 | 1.354257E−01 |
| A12= | −1.048030E−01 | −2.652902E−02 |
| A14= | 1.462137E−01 | −1.203306E−03 |
| A16= | −3.676651E−02 | 7.805611E−04 |

In the sixth optical embodiment, the aspheric surface formula is presented in the same way in the first optical embodiment. In addition, the definitions of parameters in following tables are the same as those in the first optical embodiment. Therefore, similar description shall not be illustrated again.

The values stated as follows may be deduced according to Table 11 and Table 12.

Sixth optical embodiment (Primary reference wavelength: 555 nm)

| |f/f1| | |f/f2| | |f/f3| | |f1/f2| | |f2/f3| | TP1/TP2 |
|---|---|---|---|---|---|
| 1.08042 | 0.46186 | 0.32763 | 2.33928 | 1.40968 | 1.33921 |
| ΣPPR | ΣNPR | ΣPPR/|ΣNPR| | IN12/f | IN23/f | TP2/TP3 |

-continued

| Sixth optical embodiment (Primary reference wavelength: 555 nm) | | | | | |
|---|---|---|---|---|---|
| 1.40805 | 0.46186 | 3.04866 | 0.17636 | 0.09155 | 0.62498 |
| TP2/(IN12 + TP2 + IN23) | | (TP1 + IN12)/TP2 | | (TP3 + IN23)/TP2 | |
| 0.35102 | | 2.23183 | | 2.23183 | |
| HOS | InTL | HOS/HOI | InS/HOS | \| ODT \| % | \| TDT \| % |
| 2.90175 | 2.02243 | 1.61928 | 0.78770 | 1.50000 | 0.71008 |
| HVT21 | HVT22 | HVT31 | HVT32 | HVT32/HOI | HVT32/HOS |
| 0.00000 | 0.00000 | 0.46887 | 0.67544 | 0.37692 | 0.23277 |
| PhiA | PhiC | PhiD | TH1 | TH2 | HOI |
| 2.716 mm | 3.116 mm | 3.616 mm | 0.25 mm | 0.2 mm | 1.792 mm |
| PhiA/PhiD | TH1 + TH2 | (TH1 + TH2)/HOI | (TH1 + TH2)/HOS | 2(TH1 + TH2)/PhiA | InTL/HOS |
| 0.7511 | 0.45 mm | 0.2511 | 0.1551 | 0.3314 | 0.6970 |
| PLTA | PSTA | NLTA | NSTA | SLTA | SSTA |
| −0.002 mm | 0.008 mm | 0.006 mm | −0.008 mm | −0.007 mm | 0.006 mm |

The values stated as follows may be deduced according to Table 11 and Table 12.

| Related inflection point values of sixth optical embodiment (Primary reference wavelength: 555 nm) | | | | | |
|---|---|---|---|---|---|
| HIF221 | 0.5599 | HIF221/HOI | 0.3125 | SGI221 | −0.1487 \| SGI221 \|/ | 0.2412 |
| | | | | | (\| SGI221 \| + TP2) | |
| HIF311 | 0.2405 | HIF311/HOI | 0.1342 | SGI311 | 0.0201 \| SGI311 \|/ | 0.0413 |
| | | | | | (\| SGI311 \| + TP3) | |
| HIF312 | 0.8255 | HIF312/HOI | 0.4607 | SGI312 | −0.0234 \| SGI312 \|/ | 0.0476 |
| | | | | | (\| SGI312 \| + TP3) | |
| HIF321 | 0.3505 | HIF321/HOI | 0.1956 | SGI321 | 0.0371 \| SGI321 \|/ | 0.0735 |
| | | | | | (\| SGI321 \| + TP3) | |

The values related to arc lengths may be obtained according to table 11 and table 12.

| Sixth optical embodiment (Reference wavelength = 555 nm) | | | | | | |
|---|---|---|---|---|---|---|
| ARE | 1/2(HEP) | ARE value | ARE−1/2(HEP) | 2(ARE/HEP) % | TP | ARE/TP (%) |
| 11 | 0.546 | 0.598 | 0.052 | 109.49% | 0.468 | 127.80% |
| 12 | 0.500 | 0.506 | 0.005 | 101.06% | 0.468 | 108.03% |
| 21 | 0.492 | 0.528 | 0.036 | 107.37% | 0.349 | 151.10% |
| 22 | 0.546 | 0.572 | 0.026 | 104.78% | 0.349 | 163.78% |
| 31 | 0.546 | 0.548 | 0.002 | 100.36% | 0.559 | 98.04% |
| 32 | 0.546 | 0.550 | 0.004 | 100.80% | 0.559 | 98.47% |
| ARS | EHD | ARS value | ARS−EHD | (ARS/EHD)% | TP | ARS/TP (%) |
| 11 | 0.640 | 0.739 | 0.099 | 115.54% | 0.468 | 158.03% |
| 12 | 0.500 | 0.506 | 0.005 | 101.06% | 0.468 | 108.03% |
| 21 | 0.492 | 0.528 | 0.036 | 107.37% | 0.349 | 151.10% |
| 22 | 0.706 | 0.750 | 0.044 | 106.28% | 0.349 | 214.72% |
| 31 | 1.118 | 1.135 | 0.017 | 101.49% | 0.559 | 203.04% |
| 32 | 1.358 | 1.489 | 0.131 | 109.69% | 0.559 | 266.34% |

The optical image capturing module 10 in the present invention may be applied to one of an electronic portable device, an electronic wearable device, an electronic monitoring device, an electronic information device, an electronic communication device, a machine vision device, a vehicle electronic device, and combinations thereof.

Specifically, the optical image capturing module in the present invention may be one of an electronic portable device, an electronic wearable device, an electronic monitoring device, an electronic information device, an electronic communication device, a machine vision device, a vehicle electronic device, and combinations thereof. Moreover, required space may be minimized and visible areas of the screen may be increased by using different numbers of lens assemblies depending on requirements.

Figure 32:
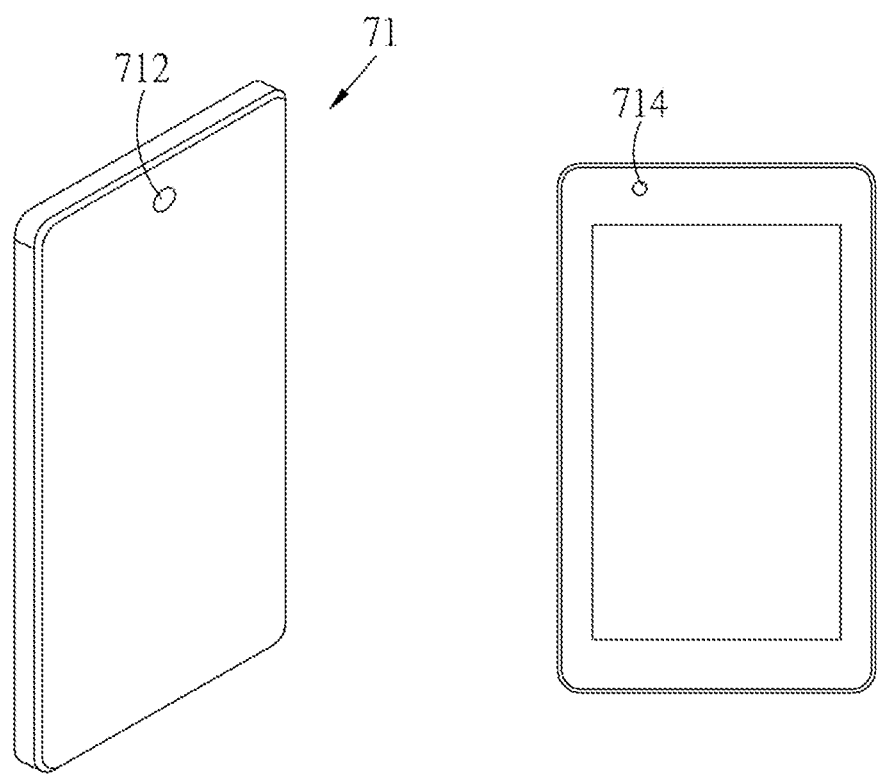
FIG. 32 is a schematic diagram of the optical image capturing module applied to a mobile communication device according to the embodiment in the present invention.
Figure 33:
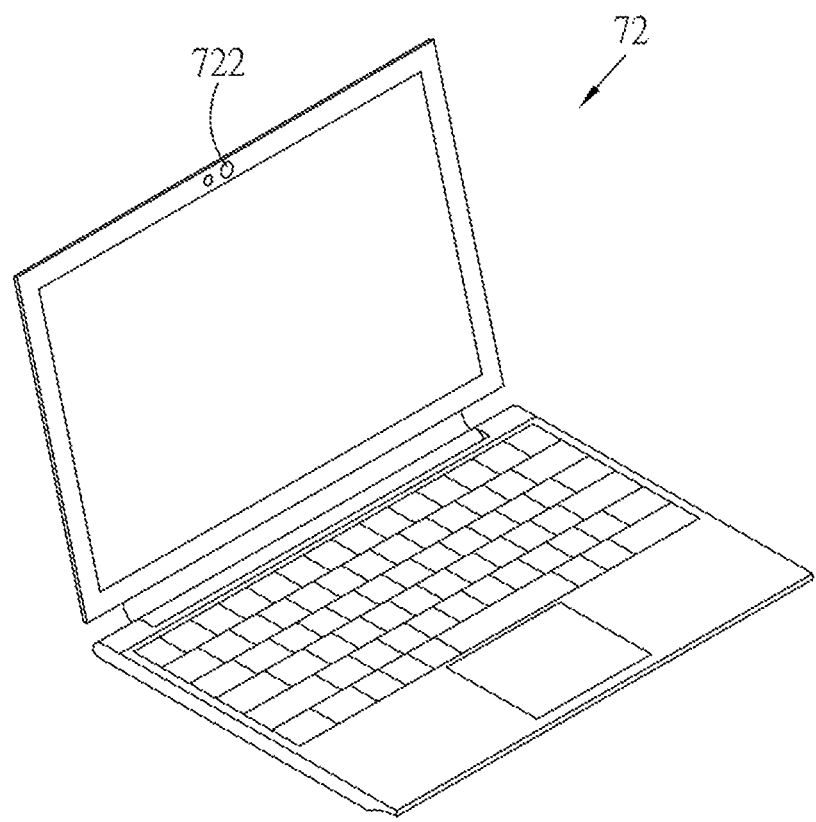
FIG. 33 is a schematic diagram of the optical image capturing module applied to a mobile information device according to the embodiment in the present invention.
Figure 34:
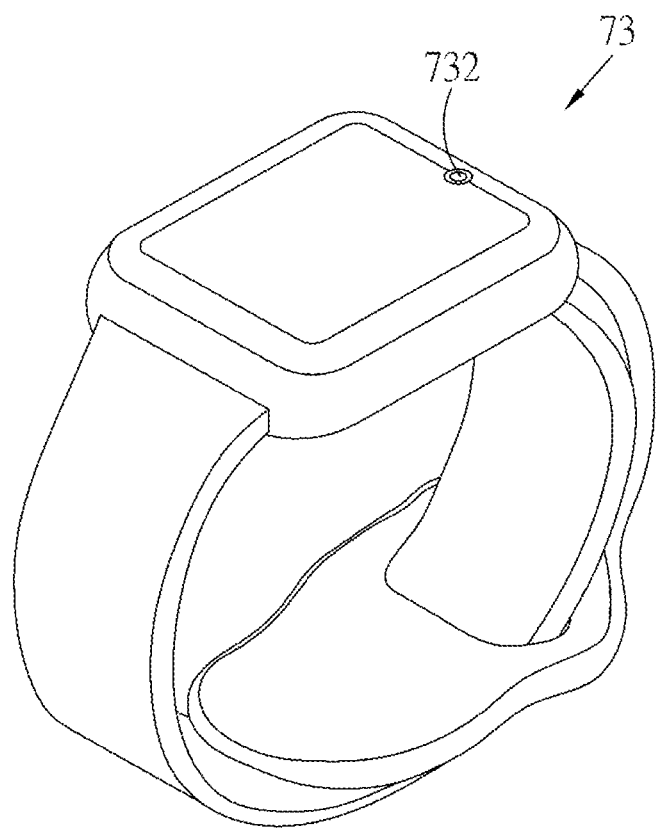
FIG. 34 is a schematic diagram of the optical image capturing module applied to a smart watch according to the embodiment in the present invention.
Figure 35:
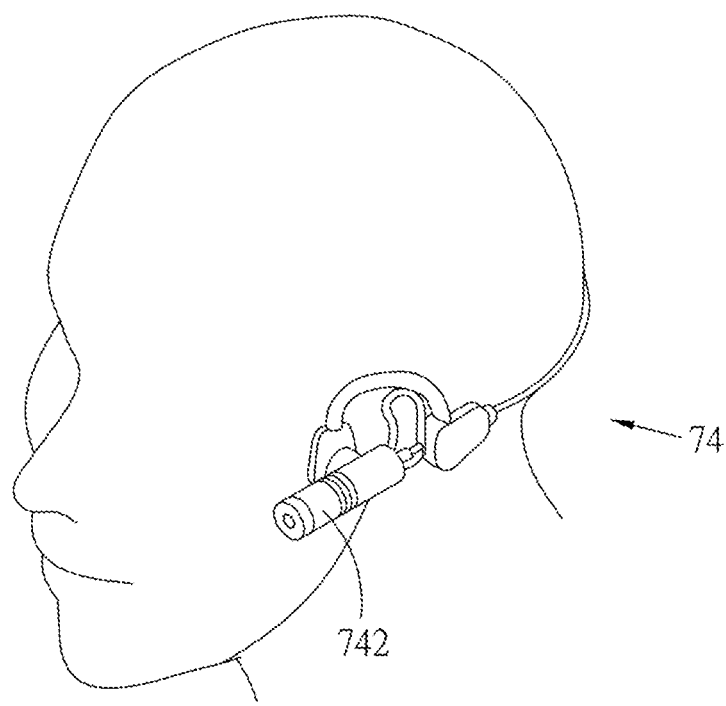
FIG. 35 is a schematic diagram of the optical image capturing module applied to a smart head-mounted device according to the embodiment in the present invention.
Figure 36:
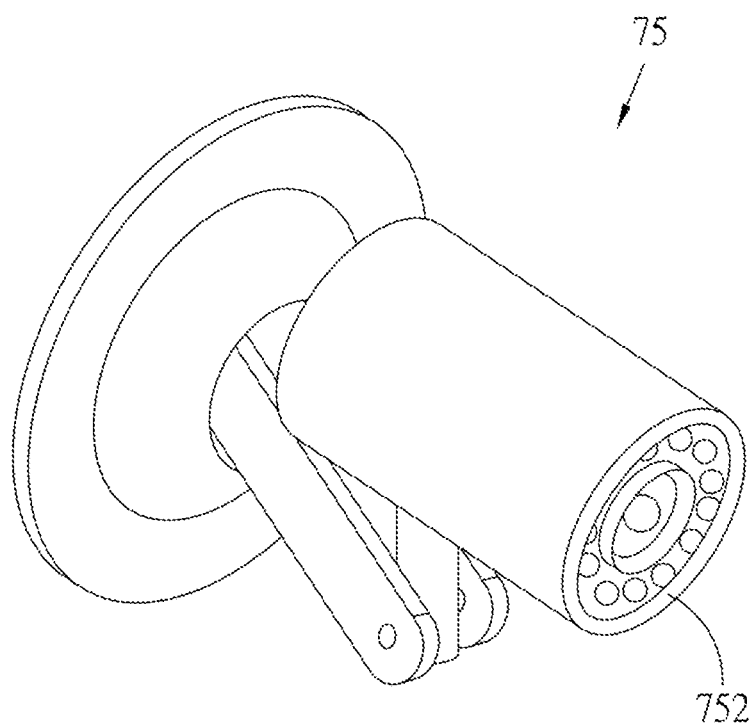
FIG. 36 is a schematic diagram of the optical image capturing module applied to a security monitoring device according to the embodiment in the present invention.
Figure 37:
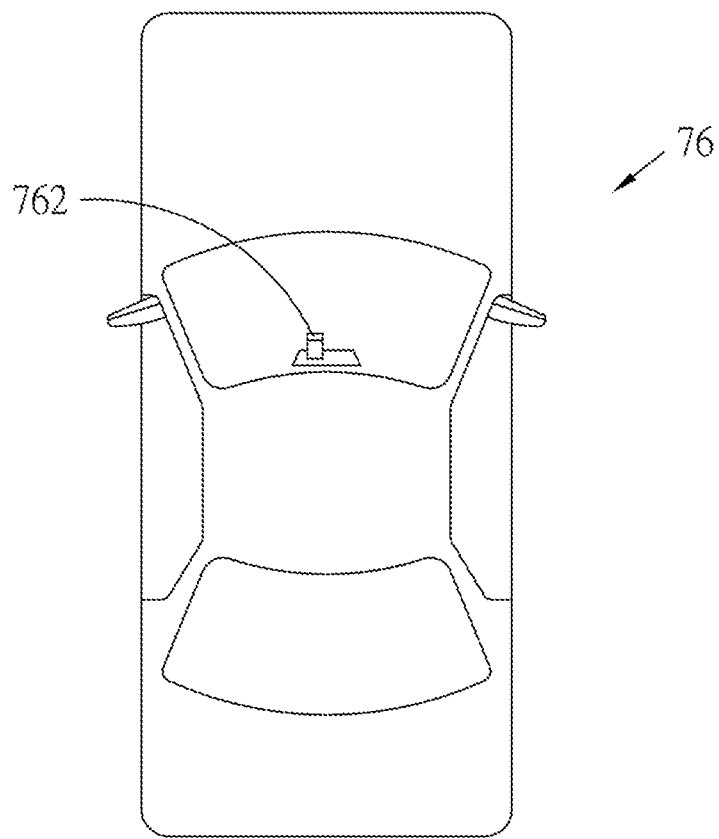
FIG. 37 is a schematic diagram of the optical image capturing module applied to a vehicle imaging device according to the embodiment in the present invention.
Figure 38:
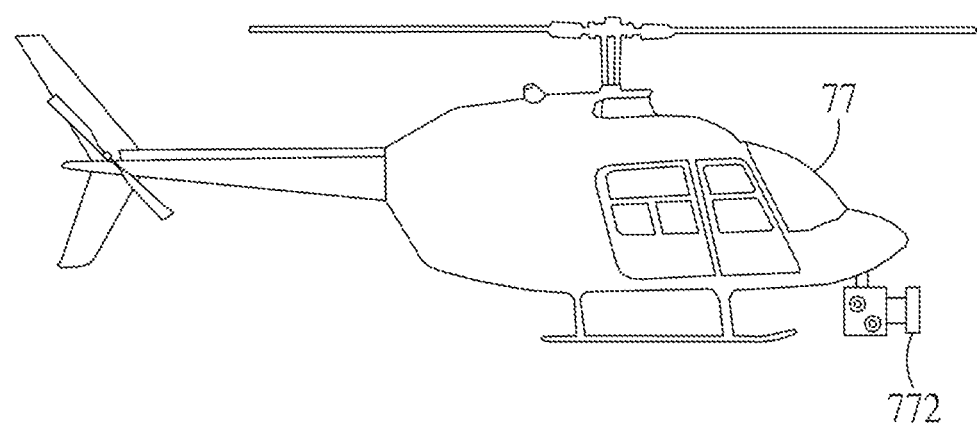
FIG. 38 is a schematic diagram of the optical image capturing module applied to an unmanned aircraft device according to the embodiment in the present invention.
Figure 39:
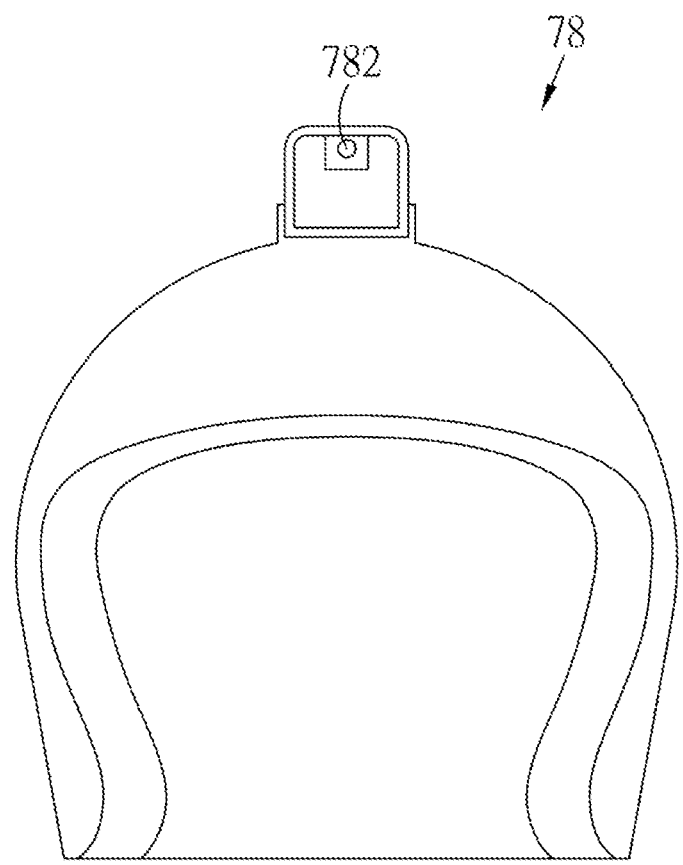
FIG. 39 is a schematic diagram of the optical image capturing module applied to an extreme sport imaging device according to the embodiment in the present invention.
Figure 40:
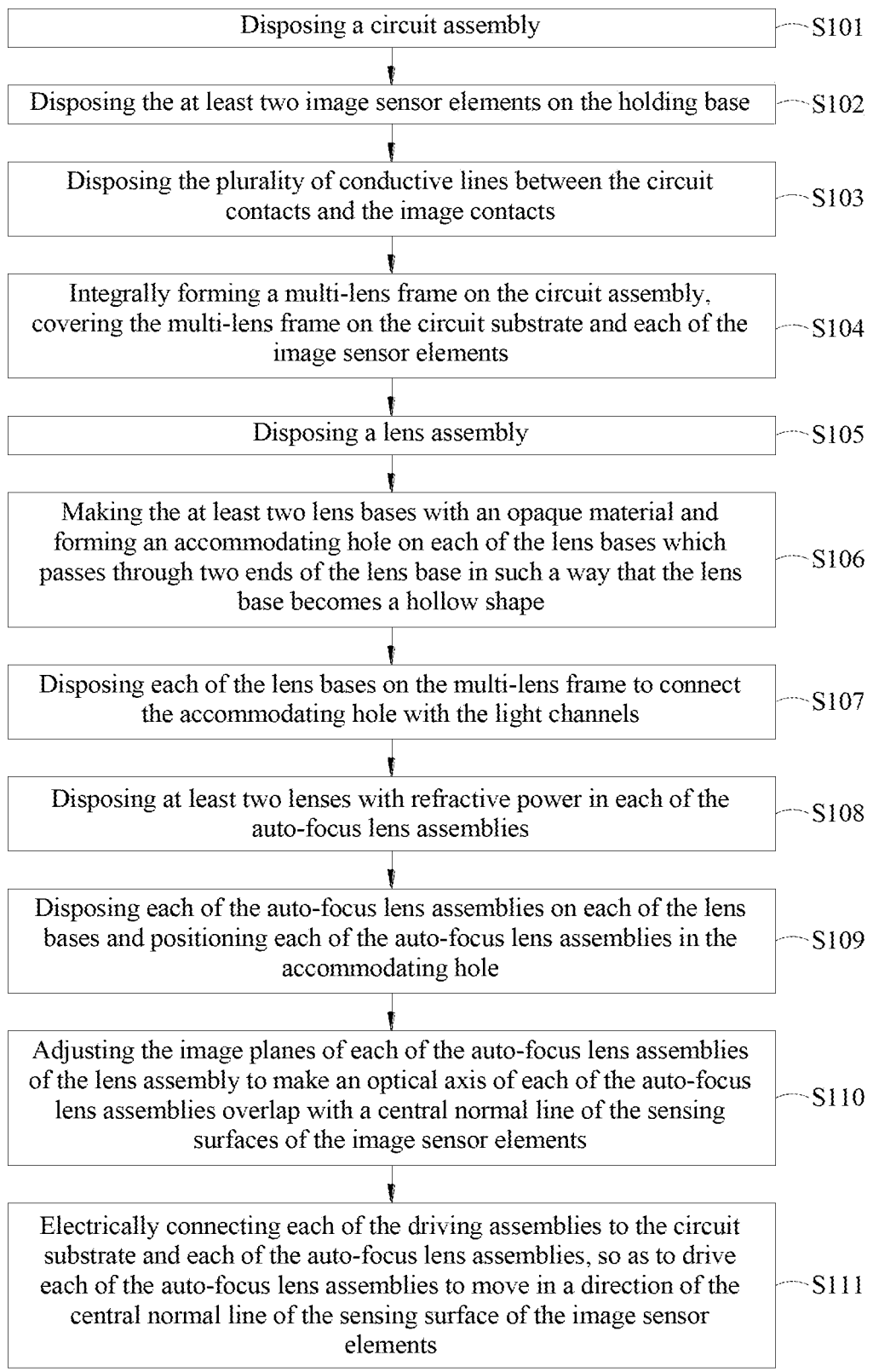
FIG. 40 is a schematic view of a flow according to the embodiment in the present invention.
Figure 41:
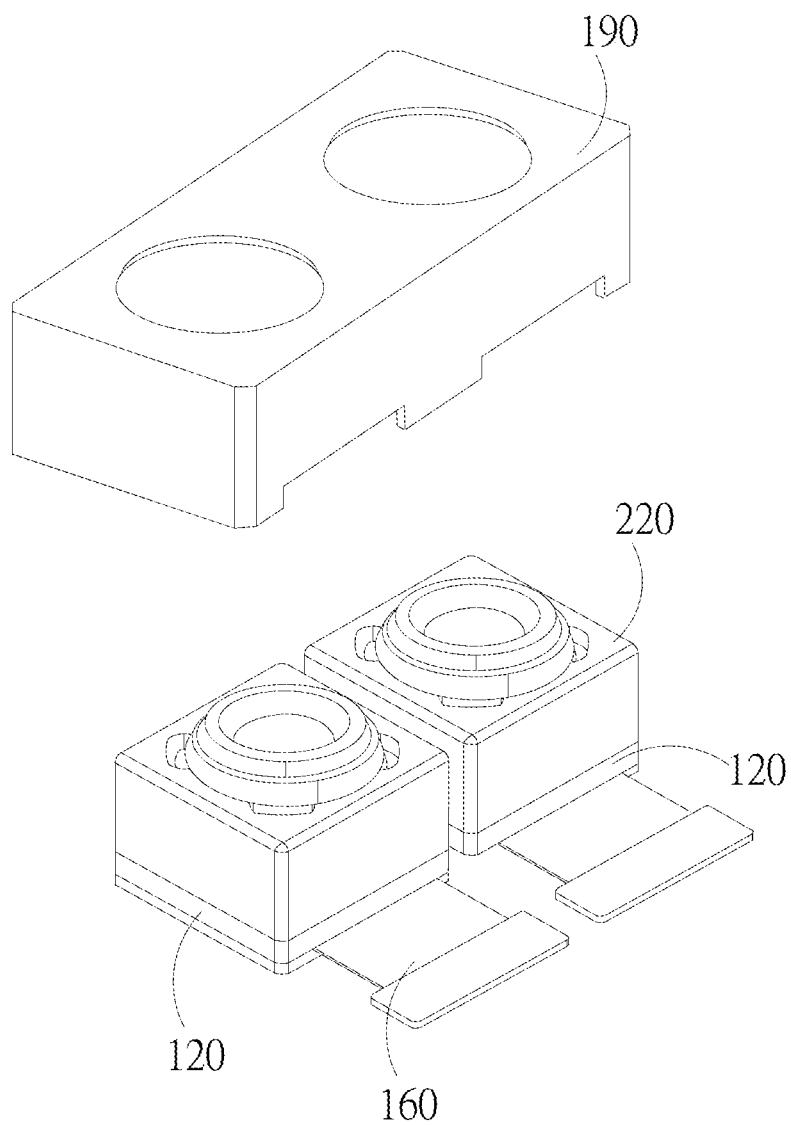
FIG. 41 is a schematic view of an optical image capturing module according to the seventeenth embodiment in the present invention.
Figure 42:
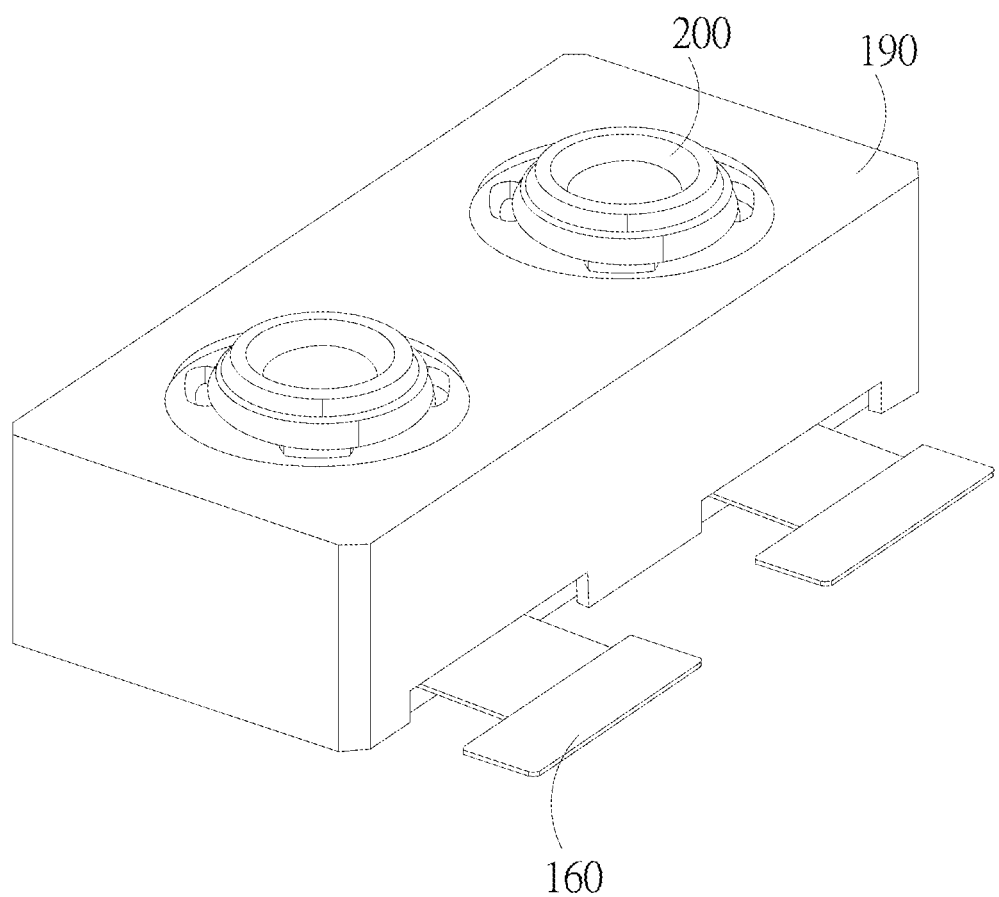
FIG. 42 is a schematic view of an optical image capturing module according to the eighteenth embodiment in the present invention.
Figure 43:
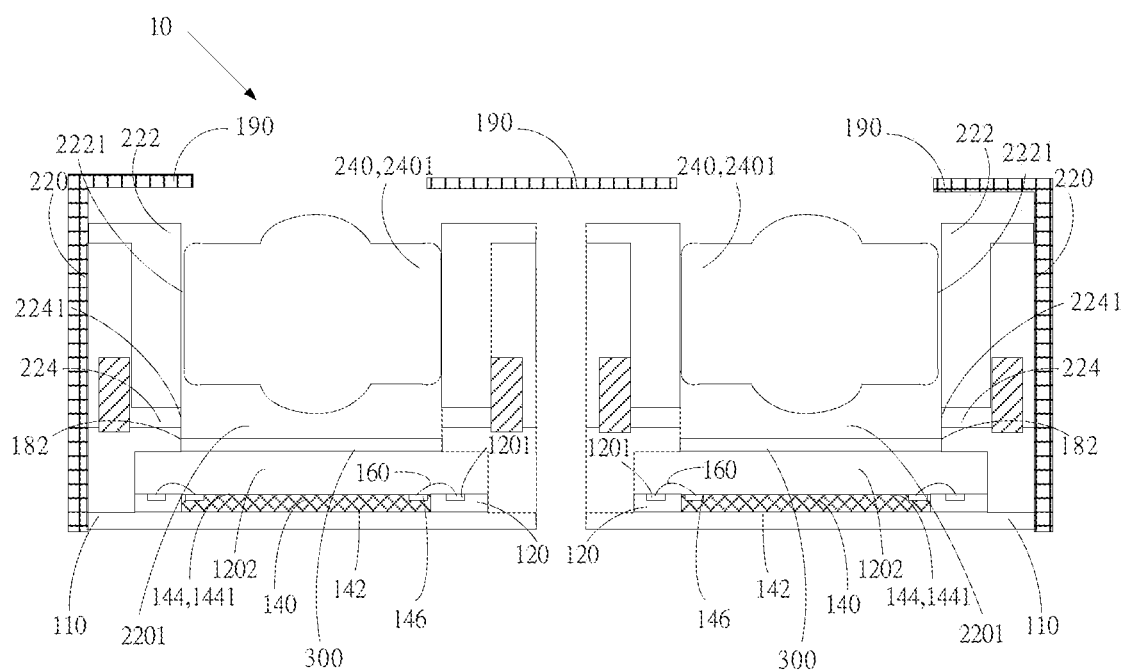
FIG. 43 is a schematic view of an optical image capturing module according to the nineteenth embodiment in the present invention.

Please refer to FIG. 32 which illustrates the optical image capturing module 712 and the optical image capturing module 714 in the present invention applied to a mobile communication device 71 (Smart Phone). FIG. 33 illustrates the optical image capturing module 722 in the present invention applied to a mobile information device 72 (Notebook). FIG. 34 illustrates the optical image capturing module 732 in the present invention applied to a smart watch 73. FIG. 35 illustrates the optical image capturing module 742 in the present invention applied to a smart hat 74. FIG. 36 illustrates the optical image capturing module 752 in the present invention applied to a safety monitoring device 75 (IP Cam). FIG. 37 illustrates the optical image capturing module 762 in the present invention applied to a vehicle imaging device 76. FIG. 38 illustrates the optical image capturing module 772 in the present invention applied to a unmanned aircraft device 77. FIG. 39 illustrates the optical image capturing module 782 in the present invention applied to an extreme sport imaging device 78.

In addition, the present invention further provides a manufacturing method of an optical image capturing module, and the manufacturing method may include the following steps:

S101: disposing a circuit assembly 100, which includes at least one holding base 110, at least two circuit substrate 120, at least two image sensor elements 140, and a plurality of conductive lines 160, wherein the at least two circuit substrates 120 include a plurality of circuit contacts 1210 disposed thereon;

S102: disposing the at least two image sensor elements 140 on the at least one holding base 110, wherein each of the at least two circuit substrates 140 may be disposed on the holding base 110 and surround the at least two image sensor elements 140, and each image sensor element includes a first surface 142 and a second surface 144, and the second surface 144 has a sensing surface 1441 and a plurality of image contacts 146;

S103: disposing the conductive lines 160 between the circuit substrate 120 and the image contacts 146 of the image sensor elements 140;

S104: forming a multi-lens frame 180 on the circuit assembly 100 integrally to cover each circuit substrate 120 and the image sensor elements 140, and forming a plurality of light channels 182 on a sensing surface 1441 of the second surface 144 corresponding to each of the image sensor elements 140;

S105: disposing a lens assembly 200, which includes at least two lens bases 220, at least two auto-focus lens assembly 240, and at least two driving assembly 260;

S106: making the at least two lens bases 220 with an opaque material and forming an accommodating hole 2201 on the lens bases 220 which passes through two ends of the lens base 220 in such a way that the lens base 220 becomes a hollow shape;

S107: disposing the lens bases 220 on the multi-lens frame 180 to connect the accommodating hole 2201 with the light channel 182;

S108: disposing at least two lenses 2401 with refractive power in each auto-focus lens assembly 240 and making each auto-focus lens assembly 240 satisfy the following conditions:

$1.0 \leq f/HEP \leq 10.0$;

$0 \deg < HAF \leq 150 \deg$;

$0 mm < PhiD \leq 18 mm$;

$0 < PhiA/PhiD \leq 0.99$; and $0 \leq 2(ARE/HEP) \leq 2.0$;

In the conditions above, f is the focal length of the auto-focus lens assembly 240. HEP is the entrance pupil diameter of the auto-focus lens assembly 240. HAF is the half maximum angle of view of the auto-focus lens assembly 240. PhiD is the maximum value of a minimum side length of an outer periphery of the lens base 220 perpendicular to an optical axis of the auto-focus lens assembly 240. PhiA is the maximum effective diameter of the auto-focus lens assembly 240 nearest to a lens surface of an image plane. ARE is the arc length along an outline of the lens 2401 surface, starting from an intersection point of any lens surface of any lens and the optical axis in the auto-focus lens assembly 240, and ending at a point with a vertical height which is the distance from the optical axis to half the entrance pupil diameter.

S109: disposing the auto-focus lens assembly 240 on each of the lens bases 220 and positioning the auto-focus lens assembly 240 in the accommodating hole 2201;

S110: adjusting the image planes of the auto-focus lens assembly 240 of the lens assembly to make the image plane of each of the auto-focus lens assembly 240 of the lens assembly 200 position on the sensing surface 1441 of each image sensor elements 140, to make the optical axis of each auto-focus lens assembly 240 overlap with a central normal line of the sensing surface 1441 of the image sensor element 140; and S111: electrically connecting the driving assembly 260 to the circuit substrate 120 to couple with the auto-focus lens assembly 240 so as to drive the auto-focus lens assembly 240 to move in a direction of the central normal line of the sensing surface 1441 of the image sensor element 140.

Specifically, by employing the step S101 and the step S111, smoothness is ensured with the feature of the multi-lens frame 180 manufactured integrally. Through the manufacturing process of AA (Active Alignment), in any step from the step S101 and the step S110, the relative positions between each of the elements may be adjusted, including the holding base 110, the circuit substrate 12, the image sensor elements 140, the lens base 220, the auto-focus lens assembly 240, drive assembly 260, and the optical image capturing module 10. This allows light to be able to pass through the auto-focus lens assembly 240 in the accommodating hole 2101, pass through the light channel 182, and be emitted to the sensing surface 1441. The image planes of the auto-focus lens assembly 240 may be disposed on the sensing surface 1441. An optical axis of the auto-focus lens assembly 240 may overlap the central normal line of the sensing surface 1441 to ensure image quality.

Furthermore, the circuit assembly 120 can surround the image sensor elements 140, so as to effectively reduce the height of the optical image capturing module 10, and make the entire structure of the optical image capturing module 10 more compact.

Please refer to FIGS. 2 to 8, and FIG. 41 to FIG. 43. The present invention further provides an optical image capturing module 10 including a circuit assembly 100, a lens assembly 200, and a multi-lens outer frame 190. The lens assembly 100 includes at least one holding base 110, at least one circuit substrate 120, a plurality of image sensor elements 140, and a plurality of conductive lines 160. The lens assembly 200 may include at least two lens bases 210, at least two auto-focus lens assemblies 240, and at least two drive assemblies 260.

The at least two image sensor elements 140 may be disposed on the holding base 110. Each image sensor element 140 may include a first surface 142 and a second surface 144. LS is the maximum value of a minimum side length of an outer periphery of the image sensor elements 140 perpendicular to the optical axis on the surface. The second surface 144 may have a sensing surface 1441 and a plurality of image contacts 146. The holding base 110 can effectively protect the image sensor elements 140 from external impact and dust.

The at least two circuit substrates 120 can be disposed on the holding base 110 and surround the image sensor elements 140, so that the height of the optical image capturing module 10 can be reduced and structure of the optical image capturing module 10 can be more compact.

In an embodiment, the surface of each circuit substrate 120 close to the multi-lens frame 180 and the second surface 144 are placed on the same plane, to ensure that the circuit substrate 120 and the image sensor elements 140 are disposed on the holding base 110. In another embodiment, the horizontal level of the sensing surfaces 1441 of the image sensor elements 140 can be the same as or differ from that of the surface of the circuit substrate 120 close to the multi-lens frame 180; in other words, the horizontal level of the sensing surface 1441 of each image sensor element 140 can be the same as, higher than or lower than that of the surface of the circuit substrate 120 close to the multi-lens frame 180. On the basis of the bottom surface of the holding base, the height of the auto-focus lens assembly 240 can be slightly different from the height of the circuit substrate 120, and these two heights are not at the same horizontal level; however, the circuit substrate 120 and the image sensor element 140 are still at the same plane.

Figure 8:
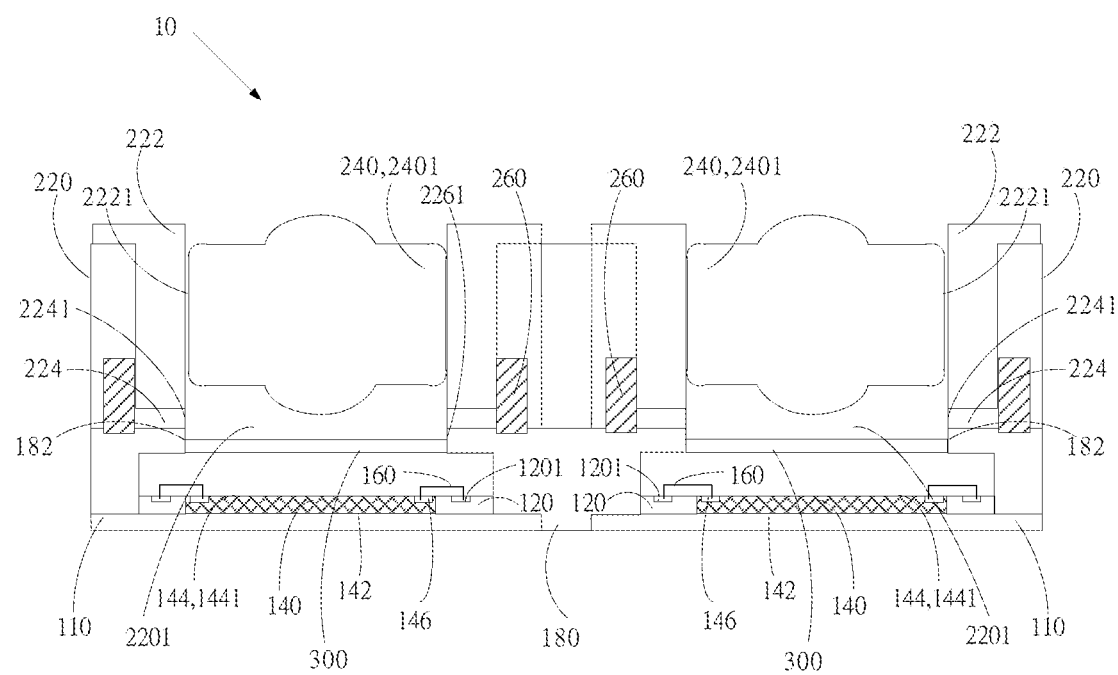
FIG. 8 is a schematic view of an optical image capturing module according to a fifth embodiment in the present invention.

The plurality of conductive lines 160 may be electrically connected between the plurality of circuit contacts 1201 and the plurality of image contacts 146 of each image sensor elements 140. In an embodiment, as shown in FIG. 8, the conductive lines 160 may be made from the material selected from gold wires, flexible circuit boards, spring needles, solder balls, bumps, or the combination thereof, and used to connect the image contacts 146 and the circuit contacts 1201, thereby transmitting the image sensing signals sensed by the image sensor elements 140.

The at least two lens bases 210 may be made of opaque material and have an accommodating hole 2101 passing through two ends of the lens bases 210 so that the lens bases 210 become hollow, and the lens bases 210 may be disposed on the circuit substrate 120. In an embodiment, the multi-lens frame 180 may be disposed on the circuit substrate 120, and then the lens bases 220 may be disposed on the multi-lens frame 180 and the circuit substrate 120 integrally.

Each auto-focus lens assemblies 240 may have at least two lenses 2401 with refractive power, be disposed on the lens base 210 and be positioned in the accommodating hole 2101. The image planes of each auto-focus lens assemblies 240 may be disposed on the sensing surface 1441 of the image sensor element 140. An optical axis of each auto-focus lens assemblies 240 may overlap the central normal line of the sensing surface 1441 of the image sensor element 140 in such a way that light is able to pass through each of the auto-focus lens assemblies 240 in the accommodating hole 2101, pass through the light channel 182, and be emitted to the sensing surface 1441 of the image sensor element 140 to ensure image quality. In addition, PhiB denotes the maximum diameter of the image side surface of the lens nearest to the image plane in each auto-focus lens assemblies 240. PhiA, also called the optical exit pupil, denotes a maximum effective diameter of the image side surface of the lens nearest to the image plane (image space) in each the auto-focus lens assemblies 240.

The drive assembly 260 is electrically connected to the circuit substrate 120, and can drive each of the auto-focus lens assemblies 240 to move in a direction of the central normal line of the sensing surface 1441 of the image sensor element 140. In an embodiment, each of the driving assemblies 260 may include a voice coil motor to drive each of the auto-focus lens assemblies 240 to move in a direction of the central normal line of the sensing surface 1441 of the image sensor element 140.

In addition, each of the lens bases is respectively fixed to the multi-lens outer frame in order to form a whole body of the optical image capturing module, so that the structure of the optical image capturing module can be more stable, thereby protecting the optical image capturing module from external impact and dust.

Each auto-focus lens assemblies 240 may further satisfy the following conditions:

$1.0 \leq f/HEP \leq 10.0$;

$0 \deg < HAF \leq 150 \deg$;

$0 \text{ mm} < PhiD \leq 18 \text{ mm}$;

$0 < PhiA/PhiD \leq 0.99$; and $0 \leq 2(ARE/HEP) \leq 2.0$;

Specifically, f is the focal length of the auto-focus lens assembly 240. HEP is the entrance pupil diameter of the auto-focus lens assembly 240. HAF is the half maximum angle of view of the auto-focus lens assembly 240. PhiD is the maximum value of a minimum side length of an outer periphery of each of the lens base 210 perpendicular to the optical axis of the auto-focus lens assembly 240. PhiA is the maximum effective diameter of the auto-focus lens assembly 240 nearest to a lens surface of the image plane. ARE is the arc length along an outline of the lens surface, starting from an intersection point of any lens surface of any lens and the optical axis in the auto-focus lens assembly 240, and ending at a point with a vertical height which is the distance from the optical axis to half the entrance pupil diameter.

Moreover, in each of the embodiments and the manufacturing method, each of the lens assemblies included in the optical image capturing module provided by the present invention is individually packaged. For example, the auto-focus lens assembly 240 is individually packaged so as to realize their respective functions and equip themselves with a fine imaging quality.

The lens assembly of the optical image capturing module can be implemented with different number of lens, aperture, FOV and focal length, so as to form a plurality of lens assemblies.

The above description is merely illustrative rather than restrictive. Any equivalent modification or alteration without departing from the spirit and scope of the present invention should be included in the appended claims.

What is claimed is:

1. An optical image capturing module, comprising:
a circuit assembly, comprising:
at least one holding base;
at least two image sensor elements, accommodated in the holding base, and each of the at least two image sensor elements comprising a first surface and a second surface, and the second surface of each of the at least two image sensor elements having a sensing surface and a plurality of image contacts;
at least two circuit substrates, disposed on the holding base and surrounding the at least two image sensor elements, and comprising a plurality of circuit contacts disposed thereon;
a plurality of conductive lines, electrically connected between each of the plurality of circuit contacts and each of the plurality of image contacts; and
a multi-lens frame, manufactured integrally, and covered on the at least two circuit substrates, and positions corresponding to the sensing surface of each of the image sensor elements having a plurality of light channels; and
a lens assembly, comprising:
at least two lens bases, each of the lens bases made of an opaque material and having an accommodating hole passing through two ends of the lens base in such a way that the lens base becomes a hollow shape, and the lens base disposed on the multi-lens frame in such a way that the accommodating hole is connected to the light channels;
at least two auto-focus lens assemblies, and each of the at least two auto-focus lens assemblies having at least two lenses with refractive power, disposed on the lens base, and positioned in the accommodating hole, an image plane of each of the auto-focus lens assemblies disposed on the sensing surfaces of the image sensor elements, and an optical axis of each of the auto-focus lens assemblies overlapping the central normal line of the sensing surface of the image sensor elements in such a way that light is able to pass through the auto-focus lens assembly in each of the accommodating holes, pass through each of the light channels, and be emitted to the sensing surface of the image sensor elements; and
at least two driving assemblies, electrically connected to the circuit substrates and driving the at least two auto-focus lens assemblies to move in a direction of the central normal line of the sensing surface of each of the image sensor elements;

wherein, each of the at least two the auto-focus lens assemblies further satisfies the following conditions:

$1.0 \leq f/HEP \leq 10.0;$ $0 \deg < HAF \leq 150 \deg;$ $0 \text{ mm} < PhiD \leq 18 \text{ mm};$ $0 < PhiA/PhiD \leq 0.99;$ and $0.9 \leq 2(ARE/HEP) \leq 2.0;$ wherein, f is a focal length of each of the auto-focus lens assemblies, HEP is the entrance pupil diameter of each of the auto-focus lens assemblies, HAF is a half maximum angle of view of each of the auto-focus lens assemblies, PhiD is a maximum value of a minimum side length of an outer periphery of the lens base perpendicular to the optical axis of each of the auto-focus lens assemblies, PhiA is a maximum effective diameter of each of the auto-focus lens assemblies nearest to a lens surface of the image plane, ARE is the arc length along an outline of the lens surface, starting from an intersection point of any lens surface of any lens and the optical axis in the auto-focus lens assembly, and ending at a point with a vertical height which is a distance from the optical axis to half the entrance pupil diameter.

2. The optical image capturing module according to claim 1, wherein each of the lens bases comprises a lens barrel and a lens holder; the lens barrel has an upper hole which passes through two ends of the lens barrel, and the lens holder has a lower hole which passes through two ends of the lens holder, the lens barrel is disposed in the lens holder and positioned in the lower hole in such a way that the upper hole and the lower hole are connected to constitute the accommodating hole, the lens holder is fixed on the multi-lens frame in such a way that the transparent area is positioned in the lower hole, the upper hole of the lens barrel faces the sensing surface of each of the image sensor elements and the transparent area; each of the auto-focus lens assemblies is disposed in the lens barrel and positioned in the upper hole, the driving assembly drives the lens barrel opposite to the lens holder moving in a direction of the central normal line of the sensing surface of the image sensor elements connected to the circuit substrate, and PhiD is a maximum value of a minimum side length of an outer periphery of the lens holder perpendicular to the optical axis of the auto-focus lens assembly.

3. The optical image capturing module according to claim 1, wherein the surface of each of the circuit substrates close to the multi-lens frame and the second surface of each of the image sensor elements are at the same plane.

4. The optical image capturing module according to claim 1, wherein the horizontal level of the sensing surface of each of the image sensor elements is the same or differs from the horizontal level of the surface of each of the circuit substrates close to the multi-lens frame.

5. The optical image capturing module according to claim 1, further comprising at least one data transmission line electrically connected to the first circuit substrate and the second circuit substrate and transmitting a plurality of sensing signals generated from each of the image sensor elements.

6. The optical image capturing module according to claim 1, wherein the at least two image sensor elements sense a plurality of color images.

7. The optical image capturing module according to claim 1, wherein at least one of the at least two image sensor elements senses a plurality of black-and-white images and at least one of the image sensor elements senses a plurality of color images.

8. The optical image capturing module according to claim 1, further comprising at least two IR-cut filters, wherein each of the IR-cut filters is disposed in each of the lens bases, positioned in each of the accommodating holes, and located on each of the image sensor elements.

9. The optical image capturing module according to claim 2, further comprising at least two IR-cut filters, wherein each of the IR-cut filters is disposed in the lens barrel or the lens holder and positioned on each of the image sensor elements.

10. The optical image capturing module according to claim 1, further comprising at least two IR-cut filters, wherein each of the lens bases comprises a filter holder, the filter holder has a filter hole which passes through two ends of the filter holder, each of the IR-cut filters is disposed in the filter holder and positioned in the filter hole, and the filter holder corresponds to positions of the plurality of light channels and is disposed on the multi-lens frame in such a way that each of the IR-cut filters is positioned on the image sensor elements.

11. The optical image capturing module according to claim 10, wherein each of the lens bases comprises a lens barrel and a lens holder, the lens barrel has an upper hole which passes through two ends of the lens barrel, the lens holder has a lower hole which passes through two ends of the lens holder, and the lens barrel is disposed in the lens holder and positioned in the lower hole, the lens holder is fixed on the filter holder, and the lower hole, the upper hole, and the filter hole are connected to constitute the accommodating hole in such a way that each of the image sensor elements is positioned in the filter hole, and the upper hole of the lens barrel faces the sensing surface of the image sensor element; the at least two auto-focus lens assemblies are disposed in the lens barrel and positioned in the upper hole.

12. The optical image capturing module according to claim 1, wherein materials of the multi-lens frame comprise any one of thermoplastic resin, plastic used for industries, insulating material, metal, conducting material, and alloy, or any combination thereof.

13. The optical image capturing module according to claim 1, wherein the multi-lens frame comprises a plurality of camera lens holders, each of the camera lens holders has the light channel and a central axis, and a distance between the central axes of adjacent camera lens holders is a value between 2 mm and 200 mm.

14. The optical image capturing module according to claim 1, wherein each of the driving assemblies comprises a voice coil motor.

15. The optical image capturing module according to claim 1, wherein the optical image capturing module has at least two auto-focus lens assemblies, comprising a first lens assembly and a second lens assembly, and a field of view (FOV) of the second lens assembly is larger than that of the first lens assembly.

16. The optical image capturing module according to claim 1, wherein the optical image capturing module has at least two auto-focus lens assemblies, comprising a first lens assembly and a second lens assembly, and a focal length of the first lens assembly is larger than that of the second lens assembly.

17. The optical image capturing module according to claim 1, wherein the optical image capturing module has at least three auto-focus lens assemblies, comprising a first lens assembly, a second lens assembly, and a third lens assembly, a field of view (FOV) of the second lens assembly is larger than that of the first lens assembly, the field of view (FOV) of the second lens assembly is larger than 46°, and each of the image sensor elements correspondingly receiving lights from the first lens assembly and the second lens assembly senses a plurality of color images.

18. The optical image capturing module according to claim 1, wherein the optical image capturing module has at least three auto-focus lens assemblies, comprising a first lens assembly, a second lens assembly, and a third lens assembly, a focal length of the first lens assembly is larger than that of the second lens assembly, and each of the image sensor elements correspondingly receiving lights from the first lens assembly and the second lens assembly senses a plurality of color images.

19. The optical image capturing module according to claim 2, wherein the following condition is satisfied:

$0 < (TH1+TH2)/HOI \le 0.95$;

wherein, TH1 is a maximum thickness of the lens holder, TH2 is a minimum thickness of the lens barrel, and HOI is a maximum image height perpendicular to the optical axis on the image plane.

20. The optical image capturing module according to claim 2, wherein the following condition is satisfied:

$0mm < TH1+TH2 \le 1.5$ mm;

wherein TH1 is a maximum thickness of the lens holder, and TH2 is a minimum thickness of the lens barrel.

21. The optical image capturing module according to claim 1, wherein the following condition is satisfied:

wherein $0.9 \le ARS/EHD \le 2.0$;

wherein ARS is the arc length along an outline of the lens surface, starting from an intersection point of any lens surface of any lens and the optical axis in each of the auto-focus lens assemblies, and ending at a maximum effective half diameter point of the lens surface, and EHD is a maximum effective half diameter of any surface of any lens in each of the auto-focus lens assemblies.

22. The optical image capturing module according to claim 1, wherein the following conditions are satisfied:

PLTA≤100 μm; PSTA≤100 μm; NLTA≤100 μm; and

NSTA≤100 μm; SLTA≤100 μm; SSTA≤100 μm;

wherein HOI is first defined as a maximum image height perpendicular to the optical axis on the image plane, PLTa is a lateral aberration of the longest operation wavelength of visible light of a positive tangential ray fan aberration of the optical image capturing module passing through a margin of an entrance pupil and incident at the image plane by 0.7 HOI, PSTa is a lateral aberration of the shortest operation wavelength of visible light of a positive tangential ray fan aberration of the optical image capturing module passing through a margin of an entrance pupil and incident at the image plane by 0.7 HOI, NLTa is a lateral aberration of the longest operation wavelength of a negative tangential ray fan aberration of the optical image capturing module passing through a margin of an entrance pupil and incident at the image plane by 0.7 HOI, NSTa is a lateral aberration of the shortest operation wavelength of visible light of a negative tangential ray fan aberration of the optical image capturing module passing through a margin of an entrance pupil and incident at the image plane by 0.7 HOI, SLTa is a lateral aberration of the longest operation wavelength of visible light of a sagittal ray fan aberration of the optical image capturing module passing through the margin of the entrance pupil and incident at the image plane by 0.7 HOI, SSTa is a lateral aberration of the shortest operation wavelength of visible light of a sagittal ray fan aberration of the optical image capturing module passing through the margin of the entrance pupil and incident at the image plane by 0.7 HOI.

23. The optical image capturing module according to claim 1, wherein each of the auto-focus lens assembly comprises four lenses with refractive power, which are a first lens, a second lens, a third lens, and a fourth lens sequentially displayed from an object side surface to an image side surface, and each of the auto-focus lens assemblies satisfies the following condition:

$0.1 \le InTL/HOS \le 0.95$;

wherein HOS is a distance from an object side surface of the first lens to the imaging surface on an optical axis, and InTL is a distance from an object side surface of the first lens to an image side surface of the fourth lens on an optical axis.

24. The optical image capturing module according to claim 1, wherein each of the auto-focus lens assembly comprises five lenses with refractive power, which are a first lens, a second lens, a third lens, a four lens, and a fifth lens sequentially displayed from an object side surface to an image side surface, and each of the auto-focus lens assemblies satisfies the following condition:

$0.1 \le InTL/HOS \le 0.95$;

wherein HOS is a distance on the optical axis from an object side surface of the first lens to the image plane, and InTL is a distance on the optical axis from an object side surface of the first lens to an image side surface of the fifth lens.

25. The optical image capturing module according to claim 1, wherein each of the auto-focus lens assembly comprises six lenses with refractive power, which are a first lens, a second lens, a third lens, a four lens, a fifth lens, and a sixth lens sequentially displayed from an object side surface to an image side surface, and each of the auto-focus lens assemblies satisfies the following condition:

$0.1 \le InTL/HOS \le 0.95$;

wherein HOS is a distance on the optical axis from an object side surface of the first lens to the image plane, and InTL is a distance on the optical axis from an object side surface of the first lens to an image side surface of the sixth lens.

26. The optical image capturing module according to claim 1, wherein each of the auto-focus lens assembly comprises seven lenses with refractive power, which are a first lens, a second lens, a third lens, a four lens, a fifth lens, a sixth lens, and a seventh lens sequentially displayed from an object side surface to an image side surface, and each of the auto-focus lens assemblies satisfies the following condition:

$0.1 \le InTL/HOS \le 0.95$;

wherein HOS is a distance from an object side surface of the first lens to the imaging surface on an optical axis, and InTL is a distance from an object side surface of the first lens to an image side surface of the seventh lens on an optical axis.

27. The optical image capturing module according to claim 1, further comprising an aperture, and the aperture satisfies a following equation: $0.2 \leq InS/HOS \leq 1.1$; wherein InS is a distance from the aperture to the image plane on the optical axis, and HOS is a distance on the optical axis from a lens surface of the auto-focus lens assembly farthest from the image plane.

28. An image capturing system, comprising the optical image capturing module according to claim 1, and applied to one of an electronic portable device, an electronic wearable device, an electronic monitoring device, an electronic information device, an electronic communication device, a machine vision device, a vehicle electronic device, and combinations thereof.

29. A manufacturing method of an optical image capturing module, comprising:
- disposing a circuit assembly comprising at least one holding base, at least two circuit substrates, at least two image sensor elements, and a plurality of conductive lines, and disposing a plurality of circuit contacts on the at least two circuit substrates;
- disposing the at least two image sensor elements on the holding base, and disposing the at least two circuit substrates on the holding base and surrounding the at least two image sensor elements, wherein each of the at least two image sensor element comprises a first surface and a second surface, and the second surface has a sensing surface and a plurality of image contacts;
- disposing the plurality of conductive lines between the circuit contacts and the image contacts;
- integrally forming a multi-lens frame on the circuit assembly, covering the multi-lens frame on the circuit substrate and each of the image sensor elements, and forming a plurality of light channels on a sensing surface of the second surface corresponding to each of the image sensor elements;
- disposing a lens assembly, which comprises a plurality of lens bases, at least two auto-focus lens assemblies, and at least two driving assemblies;
- making the at least two lens bases with an opaque material and forming an accommodating hole on each of the lens bases which passes through two ends of the lens base in such a way that the lens base becomes a hollow shape;
- disposing each of the lens bases on the multi-lens frame to connect the accommodating hole with the light channels;
- disposing at least two lenses with refractive power in each of the auto-focus lens assemblies and making each of the auto-focus lens assemblies satisfy the following conditions:

$1.0 \leq f/HEP \leq 10.0$;

$0 \ deg < HAF \leq 150 \ deg$;

$0 \ mm < PhiD \leq 18 \ mm$;

$0 < PhiA/PhiD \leq 0.99$; and $0 \leq 2(ARE/HEP) \leq 2.0$;

in the conditions above, f is a focal length of each of the auto-focus lens assemblies, HEP is the entrance pupil diameter of each of the auto-focus lens assemblies, HAF is a half maximum angle of view of each of the auto-focus lens assemblies, PhiD is a maximum value of a minimum side length of an outer periphery of the lens base perpendicular to the optical axis of each of the auto-focus lens assemblies, PhiA is a maximum effective diameter of each of the auto-focus lens assemblies nearest to a lens surface of the image plane, and ARE is the arc length along an outline of the lens surface, starting from an intersection point of any lens surface of any lens and the optical axis in the auto-focus lens assembly, and ending at a point with a vertical height which is a distance from the optical axis to half the entrance pupil diameter;
- disposing each of the auto-focus lens assemblies on each of the lens bases and positioning the auto-focus lens assemblies in the accommodating hole;
- adjusting the image planes of each of the auto-focus lens assemblies of the lens assembly to make an optical axis of each of the auto-focus lens assemblies overlap with a central normal line of the sensing surfaces of the image sensor elements; and
- electrically connecting each of the driving assemblies to the circuit substrate and the auto-focus lens assemblies, so as to drive each of the auto-focus lens assemblies to move in a direction of the central normal line of the sensing surface of the image sensor elements.

30. An optical image capturing module, comprising:
a circuit assembly, comprising:
- at least one holding base;
- at least two image sensor elements, disposed on the holding base, and each of the image sensor elements comprising a first surface and a second surface, and the second surface of each of the image sensor elements having a sensing surface and a plurality of image contacts; and
- at least two circuit substrates, disposed on the holding base and surrounding the at least two image sensor elements, and each of at least two circuit substrates comprising a plurality of circuit contacts disposed thereon; and
- a plurality of conductive lines, electrically connected between each of the circuit contacts and the plurality of image contacts;

a lens assembly, comprising:
- at least two lens bases, each of the lens bases made of an opaque material and having an accommodating hole passing through two ends of the lens base in such a way that the lens base becomes a hollow shape, and each of the lens bases disposed on one of the circuit substrates; and
- at least two auto-focus lens assemblies, each of the at least two auto-focus lens assemblies having at least two lenses with refractive power, disposed on each of the lens bases, and positioned in each of the accommodating holes, an image plane of each of the auto-focus lens assemblies disposed on the sensing surface of the image sensor elements, and an optical axis of each of the auto-focus lens assemblies overlapping the central normal line of the sensing surface of the image sensor elements in such a way that light is able to pass through the auto-focus lens assembly in each of the accommodating holes, and be emitted to the sensing surface of the image sensor elements; and
- at least two driving assemblies, electrically connected to each of the circuit substrates and driving the auto-focus lens assemblies to move in a direction of the central normal line of the sensing surface of the image sensor elements; and a multi-lens outer frame, wherein each of the lens bases is respectively fixed to the multi-lens outer frame in order to form a whole body;

wherein, each of the auto-focus lens assemblies further satisfies the following conditions:

$1.0 \leq f/HEP \leq 10.0;$ $0 \deg < HAF \leq 150 \deg;$ $0 \text{ mm} < PhiD \leq 18 \text{ mm};$ $0 < PhiA/PhiD \leq 0.99;$ and $0.9 \leq 2(ARE/HEP) \leq 2.0;$ wherein, f is a focal length of each of the auto-focus lens assemblies, HEP is the entrance pupil diameter of each of the auto-focus lens assemblies, HAF is a half maximum angle of view of each of the auto-focus lens assemblies, PhiD is a maximum value of a minimum side length of an outer periphery of the lens base perpendicular to the optical axis of each of the auto-focus lens assemblies, PhiA is a maximum effective diameter of each of the auto-focus lens assemblies nearest to a lens surface of the image plane, and ARE is the arc length along an outline of the lens surface, starting from an intersection point of any lens surface of any lens and the optical axis in the auto-focus lens assembly, and ending at a point with a vertical height which is a distance from the optical axis to half the entrance pupil diameter.

* * * * *